"(12) United States Patent
Nishioka et al.

(10) Patent No.: US 11,462,253 B2
(45) Date of Patent: Oct. 4, 2022

(54) MAGNETORESISTANCE EFFECT ELEMENT AND MAGNETIC MEMORY

(71) Applicant: TOHOKU UNIVERSITY, Sendai (JP)

(72) Inventors: Koichi Nishioka, Sendai (JP); Tetsuo Endoh, Sendai (JP); Shoji Ikeda, Sendai (JP); Hiroaki Honjo, Sendai (JP); Hideo Sato, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 11 days.

(21) Appl. No.: 16/499,753

(22) PCT Filed: Dec. 28, 2017

(86) PCT No.: PCT/JP2017/047323
§ 371 (c)(1),
(2) Date: Dec. 3, 2019

(87) PCT Pub. No.: WO2018/179660
PCT Pub. Date: Oct. 4, 2018

(65) Prior Publication Data
US 2020/0090719 A1     Mar. 19, 2020

(51) Int. Cl.
*H01L 43/10* (2006.01)
*H01L 43/08* (2006.01)
(Continued)

(52) U.S. Cl.
CPC .......... *G11C 11/161* (2013.01); *H01L 27/222* (2013.01); *H01L 43/08* (2013.01); *H01L 43/10* (2013.01)

(58) Field of Classification Search
CPC ......... H01L 43/02; H01L 43/04; H01L 43/06; H01L 43/065; H01L 43/08; H01L 43/10;
(Continued)

(56) References Cited

U.S. PATENT DOCUMENTS

2012/0306034 A1* 12/2012 Meng ...................... H01L 43/08
257/421
2014/0151830 A1* 6/2014 Apalkov ............... H01L 27/222
257/427
(Continued)

FOREIGN PATENT DOCUMENTS

JP     2011258596 A     12/2011
JP     2012142578 A     7/2012
(Continued)

OTHER PUBLICATIONS

Ikeda, S, et al., A Perpendicular-Anisotropy CoFeB—MgO Magnetic Tunnel Junction, Nature Materials, 9, Sep. 2010, pp. 721-724.
(Continued)

*Primary Examiner* — Natalia A Gondarenko
(74) *Attorney, Agent, or Firm* — Procopio, Cory, Hargreaves & Savitch LLP

(57) ABSTRACT

Provided is a magnetoresistance effect element in which the magnetization direction of the recording layer is perpendicular to the film surface and which has a high thermal stability factor Δ, and a magnetic memory.
A recording layer having a configuration of first magnetic layer/first non-magnetic coupling layer/first magnetic insertion layer/second non-magnetic coupling layer/second magnetic layer is sandwiched between the first and second non-magnetic layers and stacked so that a magnetic coupling force is generated between the first magnetic layer and the second magnetic layer.

21 Claims, 37 Drawing Sheets

(51) Int. Cl.
*G11C 11/16* (2006.01)
*H01L 27/22* (2006.01)

(58) Field of Classification Search
CPC ....... H01L 43/12; H01L 43/14; H01L 27/105; H01L 27/22; H01L 27/222–228; H01L 27/11507; H01L 21/8239; H01L 21/76807; H01L 21/76877; H01L 21/76819; H01L 21/8229; H01L 2924/1434; H01L 2924/1441; H01L 2924/1435; H01L 29/685; G11C 11/161; G11C 11/1653; G11C 11/15; G11C 19/02; G11C 19/08; G11C 19/0825; G11C 19/14; G11C 19/28; G11C 19/34; G11C 19/282; G11C 14/0036; G11C 14/0045; G11C 14/0081; H01F 10/3263; H01F 10/3236; H01F 10/3286; H01F 10/3272
USPC ................ 257/421, 295, E21.001, E21, 665, 257/E43.001, E43.006; 438/3
See application file for complete search history.

(56) References Cited

U.S. PATENT DOCUMENTS

| | | | |
|---|---|---|---|
| 2015/0109853 A1* | 4/2015 | Sato .................... | G11C 11/161 365/158 |
| 2017/0200884 A1* | 7/2017 | Oguz .................... | G11C 11/161 |

FOREIGN PATENT DOCUMENTS

| | | |
|---|---|---|
| JP | 2014183319 A | 9/2014 |
| JP | 2015115610 A | 6/2015 |
| WO | 2017010549 A1 | 1/2017 |
| WO | 2018134929 A1 | 7/2018 |

OTHER PUBLICATIONS

Ikeda, S., et al., Boron Composition Dependence of Magnetic Anisotropy and Tunnel Magnetoresistance in MgO/CoFe(B) Based Stack Structures, IEEE Transactions on Magnetics, 48(11), Nov. 2012, pp. 3829-3832.
Kim, G., et al., Tunneling Magnetoresistance of Magnetic Tunnel Junctions Using Perpendicular Magnetization L10-CoPt Electrodes, Applied Physics Letters, 92, 2008, 4 pgs.
Mizunuma, K., et al., MgO Barrier-Perpendicular Magnetic Tunnel Junctions with CoFe/Pd Multilayers and Ferromagnetic Insertion Layers, Applied Physics Letters, 95, 2009, 4 pgs.
Nishimura, N., et al., Magnetic Tunnel Junction Device with Perpendicular Magnetization Films for High-Density Magnetic Random Access Memory, Journal of Applied Physics, 91(8), Apr. 15, 2002, pp. 5246-5249.
Sato, H., et al., Perpendicular-Anisotrophy CoFeB—Mgo Magnetic Tunnel Junctions with a MgO/CoFeB/Ta/CoFeB/MgO Recording Structure, Applied Physics Letters 101, 2012, 5 pgs.
Sato, H., et al., MgO/CoFeB/Ta/CoFeB/MgO Recording Structure in Magnetic Tunnel Junctions with Perpendicular Easy Axis, IEEE Transactions on Magnetics, 49(7), Jul. 2013, pp. 4437-4440.
Sato, H., et al., Comprehensive Study of CoFeB—MgO Magnetic Tunnel Junction Characteristics with Single- and Double-Interface Scaling Down to 1X nm, 2013 IEEE International Electron Devices Meeting, Dec. 9-11, 2013, Washington, D.C., 4 pgs.
International Search Report and Written Opinion for related PCT App No. PCT/JP2017/047323, dated Mar. 6, 2018, 13 pgs.
International Preliminary Report on Patentability for related PCT App No. PCT/JP2017/047323, dated Jul. 19, 2018, 24 pgs.
Japanese Patent Office, Notice of Reasons for Refusal, JP Application No. 2019-508589, dated Oct. 8, 2021, in 6 pages.

* cited by examiner

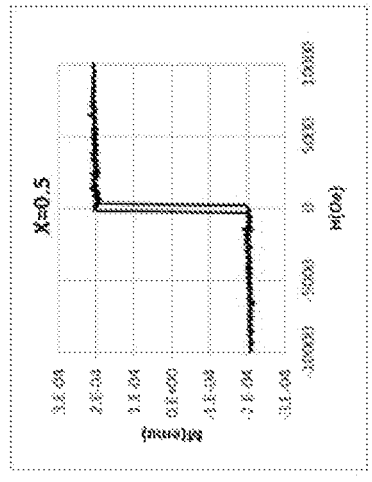
Fig. 21(c) PERPENDICULAR MAGNETIC ANISOTROPY
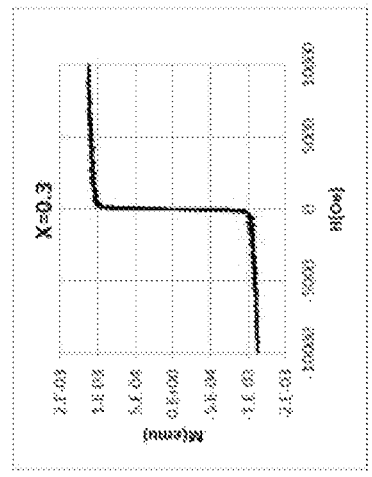
Fig. 21(b) PERPENDICULAR MAGNETIC ANISOTROPY
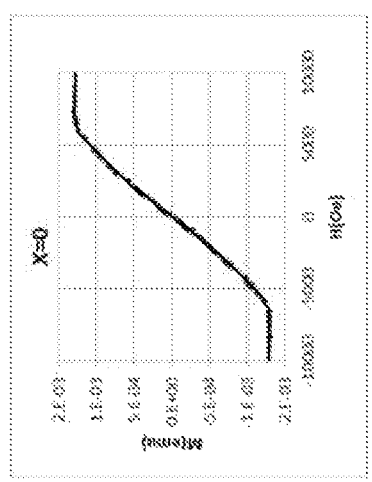
Fig. 21(a) IN-PLANE MAGNETIC ANISOTROPY

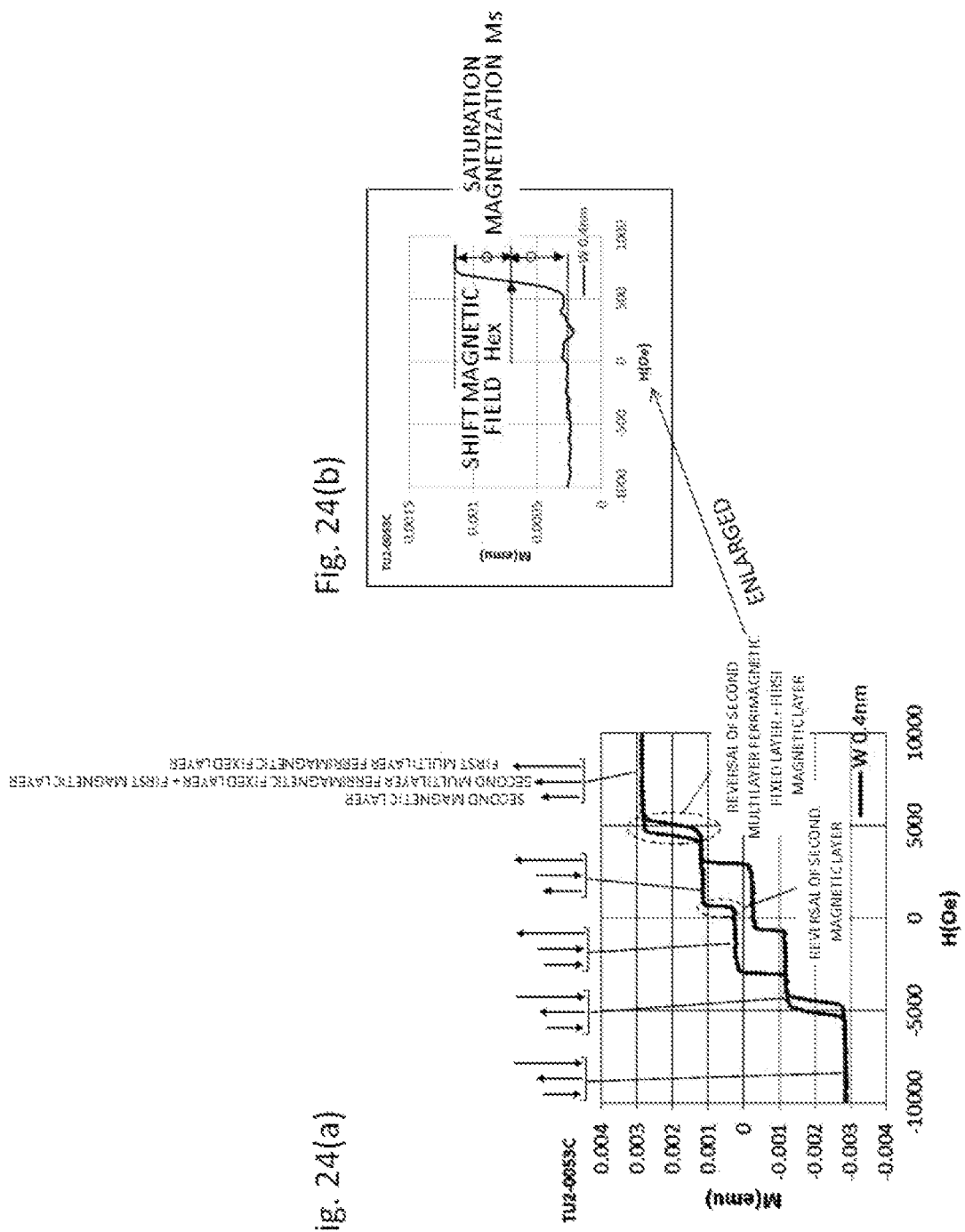

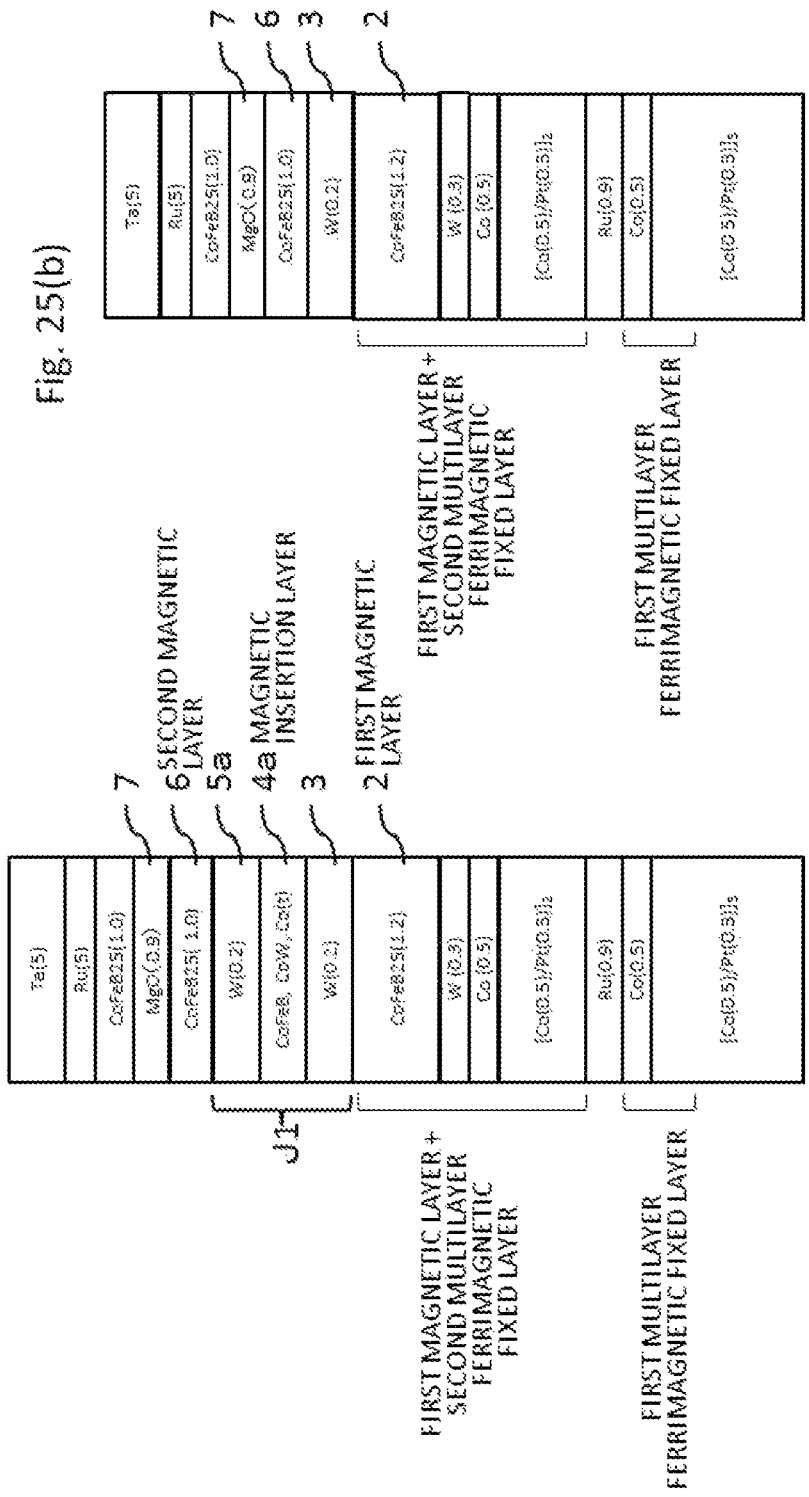

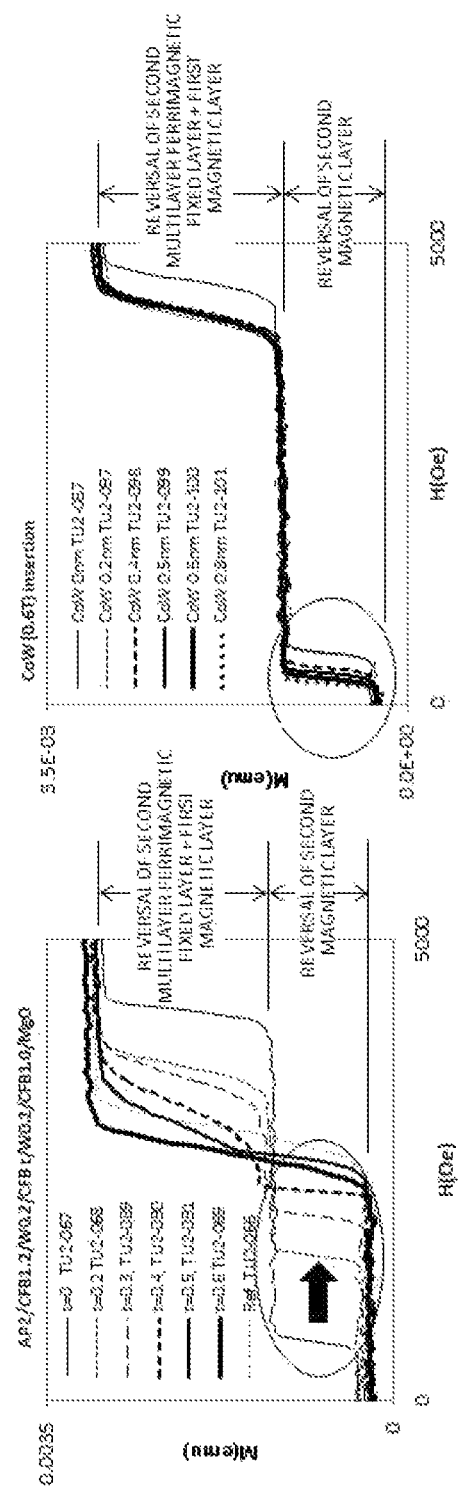
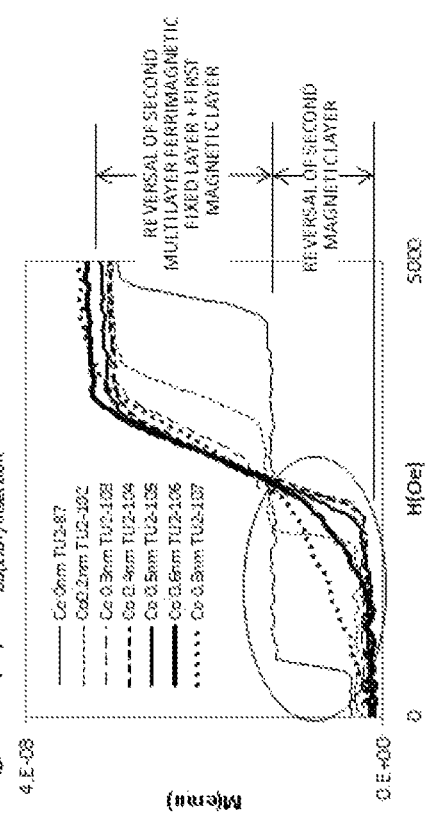
Fig. 26(a), Fig. 26(b), Fig. 26(c)

TS 230 mm

TS 280 mm y=0.4 y=1

MAGNETORESISTANCE EFFECT ELEMENT AND MAGNETIC MEMORY

CROSS-REFERENCE TO RELATED APPLICATIONS

This application is a U.S. National Stage entry of PCT Application No. PCT/JP2017/047323, filed on Dec. 28, 2017, which claims priority to PCT Application No. PCT/JP2017/013608, filed on Mar. 31, 2017. The contents of the foregoing are incorporated herein by reference.

TECHNICAL FIELD

The present invention relates to a magnetoresistance effect element, in particular, a magnetoresistance effect element in which a magnetization direction of a recording layer is perpendicular to a film surface, and a magnetic memory provided with the magnetoresistance effect element.

BACKGROUND ART

MRAM (Magnetic Random Access Memory), which is being developed as a next-generation high-performance non-volatile magnetic memory, includes a magnetic memory cell having a structure in which a selection transistor and a magnetoresistance effect element are electrically connected in series.

A source electrode of the selection transistor is electrically connected to a source line, a drain electrode is electrically connected to a bit line via the magnetoresistance effect element, and a gate electrode is electrically connected to a word line.

The magnetoresistance effect element is based on a structure in which a non-magnetic layer (barrier layer) is sandwiched between two magnetic layers (reference layer, recording layer), and is also referred to as a tunnel magnetoresistance (TMR) element having a magnetic tunnel junction (MTJ).

One of the magnetic layers is a reference layer in which the magnetization direction is fixed, and the other one of the magnetic layers is a recording layer in which the magnetization direction is variable.

The resistance value of the magnetoresistance effect element is small in the case of an easy direction of magnetization when the magnetization direction of the magnetic layer of the reference layer and the magnetization direction of the magnetic layer of the recording layer are arranged in parallel, and the resistance value is large in the case of a hard magnetization direction when the arrangement is antiparallel. The MRAM magnetic memory cell assigns these two resistance states to bit information "0" and "1".

The two resistance states of the magnetoresistance effect element are reversed by the magnetic moment of the magnetic layer.

The reversal of the magnetic moment is a change in orientation from a certain easy direction of magnetization over a hard direction of magnetization to another easy direction of magnetization which is caused with respect to a magnetic layer.

Where the magnetic energy in the easy direction of magnetization is $E_{easy}$ and the magnetic energy in the hard direction of magnetization is $E_{hard}$, then $E_{easy} < E_{hard}$.

The normalized magnetic energy $e(\theta 1, \theta 2)$ is obtained by normalizing the magnetic energy E by an effective magnetic anisotropy constant $K_{eff}t$ per unit area, and the incremental difference thereof is normalized magnetic barrier energy $\Delta e(\theta 1, \theta 2)$.

Details will be described hereinbelow.

The main characteristics required for a MRAM are (i) a large tunnel magnetoresistance ratio (TMR ratio) of the magnetoresistance effect element, (ii) a small write current $I_{CO}$, and (iii) a large thermal stability factor $\Delta$. Here, (i) is a characteristic required for high-speed reading, (ii) is a characteristic required for high-speed writing, and (iii) is a characteristic required for a non-volatile magnetic memory.

In recent years, a demand has been created to miniaturize the magnetoresistance effect element to enable high density MRAM, but where both the magnetic layer (reference layer) and the magnetic layer (recording layer) of the magnetoresistance effect element are miniaturized, there is a problem that magnetization is thermally disturbed and bit information is likely to be lost.

In other words, in order to realize a highly densed MRAM by miniaturizing the magnetoresistance effect element, the magnetic memory is required to be nonvolatile so as to retain recorded bit information for 10 years, and it is important (iii) to increase the thermal stability factor $\Delta$.

In NPLs 1 to 3, it is disclosed that in order to retain bit information even when the magnetoresistance effect element is miniaturized, the magnetic layer (reference layer) and the magnetic layer (recording layer) are required to have a high thermal stability factor $\Delta$ of 70 or more, and the magnetic layer serving as the reference layer is required to have a larger thermal stability factor $\Delta$ than the magnetic layer serving as the recording layer.

Further, in NPL 1, it is disclosed that since the thermal stability factor $\Delta$ of the magnetic layer of the magnetoresistance effect element has a correlation with an effective magnetic anisotropy energy density $K_{eff}$, and many substances having a large magnetic anisotropy (effective magnetic anisotropy energy density $K_{eff}$) exhibit perpendicular magnetic anisotropy, perpendicular magnetization TMR elements have come to be used as magnetoresistance effect elements of magnetic memory cells of MRAM.

In NPL 4, it is disclosed that by adopting a thinned CoFeB/MgO stack structure in a perpendicular magnetic anisotropy magnetoresistance effect element, a magnetoresistance effect element is obtained in which a junction size diameter is 40 nm and a thermal stability factor $\Delta$ is about 40 in the magnetic layer of the recording layer.

Further, in NPL 6, it is disclosed that a magnetoresistance effect element having a junction size diameter up to 40 nm and a thermal stability factor $\Delta$ of 80 or more is obtained by using a double CoFeB/MgO interface recording layer structure and increasing the thickness of the magnetic layer of the recording layer, but where the junction size diameter is 29 nm, the magnetoresistance effect element has a thermal stability factor $\Delta$ of about 59.

The junction size of the magnetic layer is the length of the longest straight line on the junction interface in contact with the adjacent non-magnetic layer or electrode. Where the magnetic layer is cylindrical and the junction interface is circular, the junction size is the diameter of the junction interface. Where the junction size is the diameter of the junction interface, the junction size is particularly referred to as the junction size diameter.

CITATION LIST

Non Patent Literature

[NPL 1] N. Nishimura, T. Hirai, A. Koganei, T. Ikeda, K. Okano, Y. Sekiguchi, and Y. Osada, "Magnetic tunnel junction device with perpendicular magnetization films for high-density magnetic random access memory", J. Appl. Phys. 2002, 91, 5246.

[NPL 2] G. Kim, Y. Sakuraba, M. Oogane, Y. Ando, and T. Miyazaki, "Tunneling magnetoresistance of magnetic tunnel junctions using perpendicular magnetization electrodes", Appl. Phys. Lett. 2008, 92, 172502.

[NPL 3] K. Mizunuma, S. Ikeda, J. H. Park, H. Yamamoto, H. D. Gan, K. Miura, H. Hasegawa, J. Hayakawa, F. Matsukura, and H. Ohno, "MgO barrier-perpendicular magnetic tunnel junctions with CoFe/Pd multilayers and ferromagnetic insertion layers", Appl. Phys. Lett. 2009, 95, 232516.

[NPL 4] S. Ikeda, K. Miura, H. Yamamoto, K. Mizunuma, H. D. Gan, M. Endo, S. Kanai, F. Matsukura, and H. Ohno, "A perpendicular-anisotropy CoFeB—MgO magnetic tunnel junction", Nature Mater., 2010, 9, 721.

[NPL 5] H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett. 2012, 101, 022414.

[NPL 6] H. Sato, M. Yamanouchi, S. Ikeda, S. Fukami, F. Matsukura, and H. Ohno, "MgO/CoFeB/Ta/CoFeB/MgO recording structure in magnetic tunnel junctions with perpendicular easy axis", IEEE Trans. Magn., 2013, 49, 4437.

[NPL 7] H. Sato, T. Yamamoto, M. Yamanouchi, S. Ikeda, S. Fukami, K. Kinoshita, F. Matsukura, N. Kasai, and H. Ohno, "Comprehensive study of CoFeB—MgO magnetic tunnel junction characteristics with single- and double-interface scaling down to 1× nm", Tech. Dig.-Int. Electron Devices Meet. 2013, 3.2.1.

[NPL 8] S. Ikeda, R. Koizumi, H. Sato, M. Yamanouchi, K. Miura, K. Mizunuma, H. D. Gan, F. Matsukura, and H. Ohno, "Boron Composition Dependence of Magnetic Anisotropy and Tunnel Magnetoresistance in MgO/CoFe (B) Based Stack Structures", IEEE Trans. Magn., 2012, 48, 3829.

PATENT LITERATURE

[PTL 1] Japanese Patent Application Laid-Open No. 2011-258596 A
[PTL 2] PCT/JP2016/070850
[PTL 3] PCT/JP2017/001617

SUMMARY OF INVENTION

Technical Problem

An object of the present invention is to provide a magnetoresistance effect element and a magnetic memory having a thermal stability factor $\Delta$ higher than that of the related art in order to realize non-volatility enabling recording and storage of bit information for 10 years in a high density MRAM by miniaturizing the magnetoresistance effect element.

More specifically, an object of the present invention is to provide a magnetoresistance effect element and a magnetic memory in which in the recording layer of a magnetoresistance effect element in which two magnetic layers are arranged at two respective interfaces, the thermal stability factors $\Delta$ of the two magnetic layers are effectively combined, and the thermal stability factor $\Delta$ of the entire recording layer is further increased.

The thermal stability factor $\Delta$ of the magnetoresistance effect element is expressed by the following equation.

$$\Delta = \frac{\Delta E}{k_B T} = \frac{K_{eff} t S}{k_B T}, \Delta E = E_{hard} - E_{easy} \quad \text{[Equation 1]}$$

In the Equation 1, $\Delta E$ is a magnetic barrier energy, $k_B$ is a Boltzmann constant, T is an absolute temperature, $K_{eff}$ is an effective magnetic anisotropy energy density, S is an area of the recording layer, and t is a film thickness.

As described above, the normalized magnetic energy ($\theta 1$, $\theta 2$) is obtained by normalizing the magnetic energy E by the effective magnetic anisotropy constant $K_{eff}t$ per unit area, and the incremental difference thereof is normalized magnetic barrier energy $\Delta e(\theta 1, \theta 2)$. The normalized magnetic barrier energy $\Delta e(\theta 1, \theta 2)$ is equal to the energy required in the reversal process of the magnetic moment.

The product $K_{eff}t$ of the effective magnetic anisotropy energy density $K_{eff}$ and the film thickness t of the recording layer (hereinafter, $K_{eff}t$ is referred to as an effective magnetic anisotropy constant per unit area) in the coordinates where the x axis and y axis are in the plane and the z axis is perpendicular to the xy plane is represented by the following equation.

$$K_{eff}t = K_i - \left[(N_z - N_x)\frac{M_s^2}{2\mu_0} - K_b\right]t \quad \text{[Equation 2]}$$

In the Equation 2, $K_i$ is an interfacial magnetic anisotropy energy density, $N_z$ is a z-axis antimagnetic field coefficient, $N_x$ is an x-axis antimagnetic field coefficient, $M_s$ is saturation magnetization, $\mu_0$ is permeability in vacuum, and Kb is a bulk (crystal) magnetic anisotropy energy density derived from magnetic anisotropy and magnetoelastic effect.

$N_x$ is equal to an y-axis antimagnetic field coefficient $N_y$. $N_z$ and $N_x$ are difficult to obtain exactly when the recording layer is cylindrical, and can be obtained by numerical calculation based on elliptic approximation.

When the effective magnetic anisotropy constant $K_{eff}t$ per unit area is positive, it indicates a perpendicular magnetic anisotropy, and when the effective magnetic anisotropy constant is negative, it indicates an in-plane magnetic anisotropy. That is, when the effective magnetic anisotropy constant is positive, the direction perpendicular to the plane becomes the easy axis of magnetization.

This point will be described in detail by using a specific example. For example, in a CoFe (B)/MgO junction, a perpendicular magnetic anisotropy ($K_{eff}>0$) can be obtained by inducing the interfacial magnetic anisotropy energy density $K_i$ at an interface between CoFeB and MgO. However, the interfacial magnetic anisotropy energy density $K_i$ when CoFeB is used as the magnetic layer, is lower than the interfacial magnetic anisotropy energy density $K_i$ when CoFe not containing B is used. Meanwhile, when using CoFe not containing B, a high interfacial magnetic anisotropy energy density $K_i$ is obtained, but because CoFe has a higher saturation magnetization $M_s$ than CoFeB, the antimagnetic field $(-(Nz-Nx)M_s/2\mu_0)$ is large, the in-plane magnetic anisotropy ($K_{eff}<0$) is realized, and the perpendicular magnetic anisotropy is not obtained.

From the Equation 1, it can be seen that to increase the thermal stability factor $\Delta$, the effective magnetic anisotropy constant $K_{eff}t$ per unit area may be increased.

Further, from the Equation 2, it can be seen that in order to obtain a high effective magnetic anisotropy constant $K_{eff}t$ per unit area, it is desirable to lower the saturation magnetization $M_s$ of the entire recording layer so as not to lower the interfacial magnetic anisotropy energy density $K_i$ at the magnetic tunnel junction (MTJ) interface of the non-magnetic layer and the magnetic layer.

When investigating the effective magnetic anisotropy constant $K_{eff}t$ per unit area in the Equation 2, it should be noted that the effective magnetic anisotropy is affected by the interfacial magnetic anisotropy and bulk (crystal) magnetic anisotropy.

The interfacial magnetic anisotropy is a property that the easy direction of magnetization appears due to the hybridization of electron orbitals at the interface. The unit of interfacial magnetic anisotropy energy density $K_i$ is $J/m^2$, and the effect of interfacial magnetic anisotropy becomes prominent as the film thickness of the magnetic layer of the recording layer is decreased. Meanwhile, the bulk (crystal) magnetic anisotropy is a property that the easy direction of magnetization appears due to the anisotropy of the crystal structure, and the unit of bulk (crystal) magnetic anisotropy energy density $K_b$ is $J/m^3$.

Based on the Equations 1 and 2, the inventors of the present invention have investigated various methods for lowering the saturation magnetization $M_s$ of the entire recording layer, so as not to lower the interfacial magnetic anisotropy energy density $K_i$ at the interface between the adjacent non-magnetic layer and magnetic layer, in order to increase the thermal stability factor Δ of the magnetoresistance effect element. For example, it has been found that where the magnetic layer of the magnetoresistance effect element is divided into at least two regions (a first magnetic layer adjacent to the non-magnetic layer sandwiching the recording layer, and a second magnetic layer not adjacent to the non-magnetic layer sandwiching the recording layer) and the composition of the magnetic element of the first magnetic layer is made larger than the composition of the magnetic element of the second magnetic layer, a magnetoresistance effect element having a high thermal stability factor Δ is obtained (see PTL 2 etc.).

It has also been found that where the Fe composition in the magnetic element of the first magnetic layer is 50 at % or more and the Fe composition in the magnetic element of the second magnetic layer is 50 at % or less, a magnetoresistance effect element having a high thermal stability factor Δ is obtained (see PTL 3 etc.).

With respect to the conventional recording layer which has two magnetic layers adjacent to a MgO interface and in which the non-magnetic coupling layer is sandwiched between the two magnetic layers, the inventors of the present invention have also investigated the range of the film thickness of the non-magnetic coupling layer, from the viewpoint of perpendicular magnetic anisotropy and magnetic coupling between the two magnetic layers.

The configuration of the conventional recording layer is shown in FIG. 19 and includes first non-magnetic layer (1)/first magnetic layer (2)/first non-magnetic coupling layer (3)/second magnetic layer (6)/second non-magnetic layer (7). It is desirable that the film thickness of the first non-magnetic layer (3) be adjusted so that the recording layer has a perpendicular magnetic anisotropy and so that the two magnetic layers are magnetically coupled. It is also desirable that the first non-magnetic coupling layer (3) include a non-magnetic element such as W, and that the first magnetic layer (2) and the second magnetic layer (6) include at least either Co or Fe and include B as CoB, FeB, CoFeB and the like.

As for the perpendicular magnetic anisotropy of the recording layer, it is known that the absorption of B or the like contained in the adjacent magnetic layer by the first non-magnetic coupling layer (3) sandwiched between the two magnetic layers is one of the reasons why the interfacial magnetic anisotropy energy density $K_i$ at the interface is increased. That is, it is desirable that the first non-magnetic coupling layer (3) has a thickness making it possible to absorb B or the like contained in the adjacent magnetic layer.

Whether the recording layer has a perpendicular magnetic anisotropy was confirmed using a magnetoresistance effect element for evaluation which had the configuration shown in FIG. 20, and applying a magnetic field H perpendicular to the film surface of the magnetoresistance effect element to obtain a magnetization curve.

The first non-magnetic layer (1) was MgO (constant film thickness 1 nm), the first magnetic layer (2) was $CoFeB_{25}$ (constant film thickness 1.4 nm), the second magnetic layer (6) was $CoFeB_{25}$ (constant film thickness 1 nm), and the second non-magnetic layer (7) was MgO (constant film thickness 1 nm). The first non-magnetic coupling layer (3) was W, and the film thickness was set to t=0 (none), 0.3 nm, and 0.5 nm.

The film thickness can be adjusted, for example, by preparing a thick film over a longer sputtering time, measuring the film thickness, and adjusting the sputtering time by using the fact that the sputtering time is proportional to the film thickness. In particular, when a layer having a film thickness of about the atomic size of the sputtered metal or smaller than that is produced, since the film thickness is calculated by the sputtering time, configurations with continuous layers and those with discontinuous layers are included.

FIG. 21(a) shows a magnetization curve when the film thickness of the non-magnetic coupling layer is 0 nm (=no non-magnetic coupling layer), FIG. 21(b) shows a magnetization curve when the film thickness of the non-magnetic coupling layer is 0.3 nm, and FIG. 21(c) shows a magnetization curve when the film thickness of the non-magnetic coupling layer is 0.5 nm.

In the magnetization curve, the magnetization M is plotted against the ordinate and the magnetic field H is plotted against the abscissa, and it is possible to evaluate the characteristics of the magnetic material.

From the magnetization curve shown in FIG. 21(a), it was found that the recording layer of the magnetoresistance effect element in which the non-magnetic coupling layer (3) is not inserted does not have a perpendicular magnetic anisotropy.

Further, from FIGS. 21(b) and 21(c), it was found that when the non-magnetic coupling layer (3) is 0.3 nm or more, the recording layer of the magnetoresistance effect element has a perpendicular magnetic anisotropy.

It was found that in the case of the W non-magnetic coupling layer of this configuration, a more sufficient perpendicular magnetic anisotropy can be obtained when the film thickness is 0.5 nm or more.

Next, the film thickness of the first non-magnetic coupling layer (3) in which the two magnetic layers are magnetically coupled was investigated. Here, "magnetic coupling between magnetic layers" means that, in the conventional example shown in FIG. 19, a magnetic coupling force $J_{ex}$ per unit area (hereinafter referred to as "magnetic coupling force") between the first magnetic layer (2) and the second magnetic layer (6) acts, that is, the magnetic coupling force $J_{ex}$ is greater than zero.

The evaluation of the magnetic coupling force $J_{ex}$ between the two magnetic layers was performed using a magnetoresistance effect element for evaluation having the configuration shown in FIG. 22 and obtaining a magnetization curve.

The first magnetic layer (2) was $CoFeB_{25}$ (constant film thickness 1.2 nm), the second magnetic layer (6) was $CoFeB_{25}$ (constant film thickness 1 nm), the second non-magnetic layer (7) was MgO (constant film thickness 0.9 nm), the first non-magnetic coupling layer (3) was W and the film thickness was set to t=0.3 nm, 0.4 nm, and 0.5 nm. In order to measure the magnetic reversal of the first magnetic layer (2) and the second magnetic layer (6), it is necessary to fix the first magnetic layer (2) to the second multilayer ferrimagnetic fixed layer. The first non-magnetic layer (1) shown in FIG. 19 is omitted.

FIG. 23(a) shows a magnetization curve when the film thickness of the non-magnetic coupling layer (3) is 0.3 nm, FIG. 23(b) shows a magnetization curve when the film thickness of the non-magnetic coupling layer (3) is 0.4 nm, and FIG. 23(c) shows a magnetization curve when the film thickness of the non-magnetic coupling layer (3) is 0.5 nm.

When the film thickness of the non-magnetic coupling layer is 0.4 nm, the magnetic coupling force $J_{ex}$ of the two magnetic layers is calculated in the following manner.

FIG. 24(a) shows details of the same magnetization curve as in FIG. 23 (b), and the magnetization reversal portion of the second magnetic layer (6) and the magnetization reversal portion of the first magnetic layer (2) and the second multilayer ferrimagnetic fixed layer are encircled. Further, FIG. 24(b) shows an enlarged view of the magnetization reversal portion of the second magnetic layer (6).

The magnetic coupling force $J_{ex}$ between the two magnetic layers can be calculated in the following manner by using the amount of shift of the magnetic field (hereinafter referred to as "shift magnetic field $H_{ex}$"), the saturation magnetization $M_s$ and the area S of the film.

$$J_{ex}=M_s \cdot H_{ex}/S \qquad [\text{Equation 3}]$$

Where calculation was performed for the example shown in FIG. 24(b), it was found that $M_s=4.5\times10^{-4}$ emu and $H_{ex}=+630$ Oe, and when $S=3.8$ cm$^2$ was substituted, $J_{ex}=+0.075$ mJ/m$^2$.

Even when the film thickness of the non-magnetic coupling layer is 0.5 nm, the magnetic coupling force $J_{ex}$ of the two magnetic layers can be calculated by finding, as described hereinabove, the shift magnetic field $H_{ex}$ and the saturation magnetization $M_s$ from the obtained magnetization curve and additionally using the area S of the film.

Meanwhile, when the film thickness of the non-magnetic coupling layer is 0.3 nm, as shown in the magnetization curve in FIG. 23(a), the first magnetic layer (2) and the second magnetic layer (6) are magnetic one body and undergo magnetization reversal, and the values of the shift magnetic field $H_{ex}$ and saturation magnetization $M_s$ cannot be obtained. For this reason, the calculation is performed by another method. As will be described hereinbelow, when the two magnetic layers are magnetic one body and undergo magnetization reversal together, the magnetic coupling force $J_{ex}$ is calculated using the fact that it is equal to the effective magnetic anisotropy energy density $K_{eff}$.

FIG. 23(d) shows the relationship between the W film thickness of the non-magnetic coupling layer (3) and the magnetic coupling force $J_{ex}$ between the first magnetic layer (2) and the second magnetic layer (6).

From FIG. 23(d), it was found that when the film thickness of the non-magnetic coupling layer (3) was 0.5 nm, the magnetic coupling force $J_{ex}$ between the first magnetic layer (2) and the second magnetic layer (6) was zero, and the magnetic coupling force did not act.

When the film thickness of the non-magnetic coupling layer (3) was 0.3 nm, the magnetic coupling force $J_{ex}$ between the first magnetic layer (2) and the second magnetic layer (6) was 0.5 mJ/m$^2$. In addition, from FIG. 45, etc. described hereinbelow, it follows that where the magnetic coupling force $J_{ex}$ is about 0.5 mJ/m$^2$ or more, two magnetic layers are magnetic one body and undergo magnetization reversal, and the thermal stability factor $\Delta$ of the entire recording layer can be increased to twice the thermal stability factor $\Delta_0$ of each of the two magnetic layers.

It follows from the above that in the recording layer having two magnetic layers adjacent to the MgO interface, the film thickness of the non-magnetic coupling layer inserted between the two magnetic layers which is preferable for obtaining a perpendicular magnetic anisotropy is 0.3 nm, more preferably 0.5 nm or more. Meanwhile, the film thickness preferable for obtaining a magnetic coupling force $J_{ex}$ between the two magnetic layers of 0.5 mJ/m$^2$ or more is 0.3 nm or less. That is, obtaining a sufficient magnetic coupling force $J_{ex}$ between two magnetic layers while maintaining a sufficient perpendicular magnetic anisotropy of the recording layer with only a single non-magnetic coupling layer is close to a trade-off, and there is a problem that the effect of increasing the thermal stability factor $\Delta$ by arranging the two magnetic layers at the recording layer interface is difficult to achieve.

In the examination of the above problem, it was found that sandwiching a non-magnetic coupling layer, into which a magnetic insertion layer has been inserted, between two magnetic layers in order to add an effect of thermal stability factor $\Delta_0$ of each of two or more magnetic layers adjacent at the interface to the non-magnetic layer and increase the thermal stability factor $\Delta$ of the entire recording layer, and also paying attention to the element and film thickness of the magnetic insertion layer and the non-magnetic coupling layer enable us to obtain a magnetoresistance effect element having even higher thermal stability factor $\Delta$. The present invention has been accomplished based on this finding.

Solution to Problem

In order to solve the above problems, the magnetoresistance effect element of the present invention comprises: a first non-magnetic layer (1); a first magnetic layer (2) provided adjacent to the first non-magnetic layer (1) and having a magnetization direction which is perpendicular to a film surface; a first non-magnetic coupling layer (3) provided adjacent to the first magnetic layer (2) on the side opposite to the first non-magnetic layer (1); a first magnetic insertion layer (4a) provided adjacent to the first non-magnetic coupling layer (3) on the side opposite to the first magnetic layer (2); a second non-magnetic coupling layer (5a) provided adjacent to the first magnetic insertion layer (4a) on the side opposite to the first non-magnetic coupling layer (3); a second magnetic layer (6) provided adjacent to the second non-magnetic coupling layer (5a) on the side opposite to the first magnetic insertion layer (4a) and having a magnetization direction which is perpendicular to the film surface; and a second non-magnetic layer (7) provided adjacent to the second magnetic layer (6) on the side opposite to the second non-magnetic coupling layer (5a), wherein the first non-magnetic layer (1) and the second non-magnetic layer (7) are constituted of a layer including O (oxygen); the first magnetic layer (2) and the second magnetic layer (6) include at least either Co or Fe; the first non-magnetic coupling layer (3) and the second non-magnetic coupling layer (5a) include a non-magnetic element such as W, Ta, Hf, Zr, Nb, Mo, Ti, V, Cr, Si, Al, B, Pd, Pt, and the like; the first magnetic insertion layer (4a) includes at least any one of Co, Fe, and Ni; the first magnetic layer (2) and the second magnetic layer (6) are magnetically coupled by a first coupling layer (J1) constituted of the first non-magnetic coupling layer (3), the first magnetic insertion layer (4a) and the second non-magnetic coupling layer (5a); and the first magnetic layer (2), the first coupling layer (J1), and the second magnetic layer (6) constitute a first recording layer (A1).

More preferably, the first magnetic insertion layer (4a) includes at least Fe and B.

Another magnetoresistance effect element of the present invention comprises: a first non-magnetic layer (1); a first magnetic layer (2) provided adjacent to the first non-magnetic layer (1) and having a magnetization direction which is perpendicular to a film surface; a first non-magnetic coupling layer (3) provided adjacent to the first magnetic layer (2) on the side opposite to the first non-magnetic layer (1); a first magnetic insertion layer (4a) provided adjacent to the first non-magnetic coupling layer (3) on the side opposite to the first magnetic layer (2); a second non-magnetic coupling layer (5a) provided adjacent to the first magnetic insertion layer (4a) on the side opposite to the first non-magnetic coupling layer (3); a second magnetic layer (6) provided adjacent to the second non-magnetic coupling layer (5a) on the side opposite to the first magnetic insertion layer (4a) and having a magnetization direction which is perpendicular to a film surface; a third non-magnetic layer (8) provided adjacent to the second magnetic layer (6) on the side opposite to the second non-magnetic coupling layer (5a); a third magnetic layer (9) provided adjacent to the third non-magnetic layer (8) on the side opposite to the second magnetic layer (6) and having a magnetization direction which is perpendicular to a film surface; a fifth non-magnetic coupling layer (10) provided adjacent to the third magnetic layer (9) on the side opposite to the third non-magnetic layer (8); a fourth magnetic insertion layer (11a) provided adjacent to the fifth non-magnetic coupling layer (10) on the side opposite to the third magnetic layer (9); a sixth non-magnetic coupling layer (12a) provided adjacent to the fourth magnetic insertion layer (11a) on the side opposite to the fifth non-magnetic coupling layer (10); a fourth magnetic layer (13) provided adjacent to the sixth non-magnetic coupling layer (12a) on the side opposite to the fourth magnetic insertion layer (11a) and having a magnetization direction which is perpendicular to a film surface; and a second non-magnetic layer (7) provided adjacent to the fourth magnetic layer (13) on the side opposite to the sixth non-magnetic coupling layer (12a), wherein the first non-magnetic layer (1) and the second non-magnetic layer (7) are constituted of a layer including O (oxygen); the first magnetic layer (2), the second magnetic layer (6), the third magnetic layer (9), and the fourth magnetic layer (13) include at least either Co or Fe; the first non-magnetic coupling layer (3), the second non-magnetic coupling layer (5a), the fifth non-magnetic coupling layer (10), and the sixth non-magnetic coupling layer (12a) include a non-magnetic element such as W, Ta, Hf, Zr, Nb, Mo, Ti, V, Cr, Si, Al, B, Pd, Pt, and the like; the first magnetic insertion layer (4a) and the fourth magnetic insertion layer (11a) include at least any one of Co, Fe, and Ni; the third non-magnetic layer (8) includes an oxide of a non-magnetic element; the first magnetic layer (2) and the second magnetic layer (6) are magnetically coupled by a first coupling layer (J1) constituted of the first non-magnetic coupling layer (3), the first magnetic insertion layer (4a) and the second non-magnetic coupling layer (5a); the second magnetic layer (6) and the third magnetic layer (9) are magnetically coupled by a second coupling layer (J2) constituted of the third non-magnetic layer (8); the third magnetic layer (9) and the fourth magnetic layer (13) are magnetically coupled by a third coupling layer (J3) constituted of the fifth non-magnetic coupling layer (10), the fourth magnetic insertion layer (11a) and the sixth non-magnetic coupling layer (12a); the first magnetic layer (2) and the fourth magnetic layer (13) are magnetically coupled by the first coupling layer (J1), the second coupling agent (J2), and the third coupling layer (J3); the first magnetic layer (2), the first coupling layer (J1), the second magnetic layer (6), the second coupling agent (J2), the third magnetic layer (9), the third coupling layer (J3), and the fourth magnetic layer (13) constitute a first recording layer (A1).

More preferably, the first magnetic insertion layer (4a) and the fourth magnetic insertion layer (11a) include at least Fe and B.

Advantageous Effects of Invention

According to the present invention in which the first coupling layer (J1) constituted of the first non-magnetic coupling layer (3), the first magnetic insertion layer (4a), and the second non-magnetic coupling layer (5a) is sandwiched between the first magnetic layer (2) and the second magnetic layer (6), and the first magnetic layer (2) and the second magnetic layer (6) are magnetically coupled, it is possible to provide a magnetoresistance effect element with high thermal stability.

Also, according to the present invention in which the first coupling layer (J1) constituted of the first non-magnetic coupling layer (3), the first magnetic insertion layer (4a), and the second non-magnetic coupling layer (5a) is sandwiched between the first magnetic layer (2) and the second magnetic layer (6), the second coupling layer (J2) constituted of the third non-magnetic layer (8) is sandwiched between the second magnetic layer (6) and the third magnetic layer (9), the third coupling layer (J3) constituted of the fifth non-magnetic coupling layer (10), the fourth magnetic insertion layer (11a), and the sixth non-magnetic coupling layer (12a) is sandwiched between the third magnetic layer (9) and the fourth magnetic layer (13), and the first magnetic layer (2) and the second magnetic layer (6), the second magnetic layer (6) and the third magnetic layer (9), and the third magnetic layer (9) and the fourth magnetic layer (13) are magnetically coupled, it is possible to provide a magnetoresistance effect element with even higher thermal stability.

BRIEF DESCRIPTION OF THE DRAWINGS

FIG. 21(a) shows a magnetization curve in a recording layer of a magnetoresistance effect element having two magnetic layers adjacent to an MgO interface when the film thickness of a non-magnetic coupling layer is 0 nm (=no non-magnetic coupling layer).

FIG. 21(b) shows a magnetization curve in a recording layer of a magnetoresistance effect element having two magnetic layers adjacent to an MgO interface when the film thickness of a non-magnetic coupling layer is 0.3 nm.

FIG. 21(c) shows a magnetization curve in a recording layer of a magnetoresistance effect element having two magnetic layers adjacent to an MgO interface when the film thickness of a non-magnetic coupling layer is 0.5 nm.

FIG. 24(a) shows a magnetization curve when the film thickness of a non-magnetic coupling layer W is 0.4 nm.

FIG. 24(b) shows the enlarged view of a second magnetic layer reversal portion in a recording layer of a magnetoresistance effect element having two magnetic layers adjacent to an MgO interface.

FIG. 25(a) shows a configuration diagram of a magnetoresistance effect element for evaluation of the magnetic coupling force $J_{ex}$ depending on the element type and film thickness of the magnetic insertion layer in the coupling layer. FIG. 25(b) shows a configuration diagram of a reference magnetoresistance effect element for evaluation of the magnetic coupling force $J_{ex}$ depending only on the first non-magnetic coupling layer from which the magnetic insertion layer has been removed.

FIG. 26(a) shows a magnetization curve when a magnetic field is swept from positive to negative in the case where the element type and film thickness of the magnetic insertion layer in the coupling layer are CoFeB, t=0 nm to 0.6 nm. In FIG. 26(a), the magnetization curve of the reference magnetoresistance effect element for evaluation is also shown.

FIG. 26(b) shows a magnetization curve when a magnetic field is swept from positive to negative in the case where the element type and film thickness of the magnetic insertion layer in the coupling layer are CoW, t=0 nm to 0.8 nm.

FIG. 26(c) shows a magnetization curve when a magnetic field is swept from positive to negative in the case where the element type and film thickness of the magnetic insertion layer in the coupling layer are Co, t=0 nm to 0.8 nm.

DESCRIPTION OF EMBODIMENTS

Figure 1:
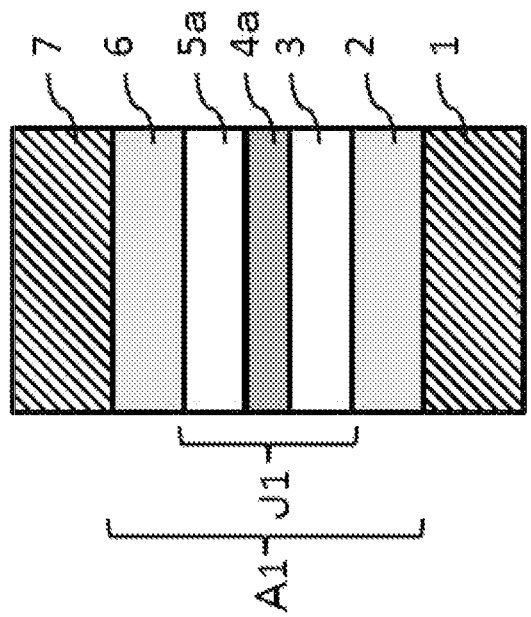
FIG. 1 is a longitudinal sectional view showing an example of the configuration of the magnetoresistance effect element of the present invention.

Embodiments of the magnetoresistance effect element and magnetic memory of the present invention will be described in detail with reference to the drawings. The drawings are only exemplary and although are described with reference numerals, the present invention is not limited thereto in any way.

Embodiment 1

FIG. 1 shows an example of a magnetoresistance effect element of the present invention in which a recording layer has two magnetic layers adjacent to the interfaces of non-magnetic layers, and a magnetic coupling layer constituted of non-magnetic coupling layer/magnetic insertion layer/non-magnetic coupling layer is provided between the two magnetic layers.

In Embodiment 1, a first non-magnetic layer (1)/a first magnetic layer (2)/a first non-magnetic coupling layer (3)/a first magnetic insertion layer (4a)/a second non-magnetic coupling layer (5a)/a second magnetic layer (6)/a second non-magnetic layer (7) are stacked adjacently in this order.

By inserting the first magnetic insertion layer (4a), the first magnetic layer (2) and the second magnetic layer (6) are magnetically coupled while a perpendicular magnetic anisotropy is provided on the interface of the first non-magnetic layer (1)/first magnetic layer (2) and the interface of the second magnetic layer (6)/second non-magnetic layer (7). That is, the magnetic coupling force $J_{ex}$ acts between the two magnetic layers.

A layer including O (oxygen) is used for the first non-magnetic layer (1) and the second non-magnetic layer (7). Where the first non-magnetic layer (1) or the second non-magnetic layer (7) becomes a barrier layer (tunnel junction layer constituted of an insulating layer) of the magnetoresistance effect element, an insulator including oxygen such as MgO, $Al_2O_3$, $SiO_2$, TiO, $Hf_2O$, or the like is used, and MgO is preferably used, so that a large rate of change in magnetoresistance is exhibited by a combination of materials of two end surfaces to be joined.

The film thickness of the first non-magnetic layer (1) and the second non-magnetic layer (7) is preferably in the range of 0.2 nm to 2.0 nm, and is more preferably adjusted to the range of 0.7 nm to 1.0 nm.

The first magnetic layer (2) and the second magnetic layer (6) include at least either Co or Fe. Examples include Co, CoFe, CoB, Fe, FeB, CoFeB, and the like, and FeB and CoFeB including B are more preferable. The composition can be exemplified by $(Co_{25}Fe_{75})_{75}B_{25}$, but is not limited thereto as long as the first magnetic layer (2) and the second magnetic layer (6) are magnetically coupled by the magnetic coupling force $J_{ex}$.

The first magnetic layer (2) and the second magnetic layer (6) may further include a 3d ferromagnetic transition metal such as Ni in addition to Co and Fe as magnetic elements.

The first magnetic layer (2) and the second magnetic layer (6) may further include a non-magnetic element such as W, Ta, Hf, Zr, Nb, Mo, Ti, V, Cr, Si, Al, B, Pd, Pt, and the like. Among these, B and V are preferable from the viewpoint of ease of handling. These non-magnetic elements can lower the saturation magnetization ($M_s$) of the magnetic layer.

The film thickness of each of the first magnetic layer (2) and the second magnetic layer (6) is preferably in the range of 0.7 nm to 2.0 nm. This is so because where the thickness is less than 0.7 nm, the magnetization is greatly reduced, and the effective magnetic anisotropy constant $K_{eff}t$ is also reduced, whereas when the thickness is more than 2.0 nm, an in-plane magnetic anisotropy occurs, as follows from Equation 2, when MgO or the like is used for the first non-magnetic layer (1) and the second non-magnetic layer (7). The film thickness of the first magnetic layer (2) is more preferably 1.2 nm to 1.6 nm, and even more preferably 1.4 nm to 1.6 nm. The film thickness of the second magnetic layer (6) is more preferably in the range of 0.8 nm to 1.4 nm.

The first non-magnetic coupling layer (3) and the second non-magnetic coupling layer (5a) include a non-magnetic element such as W, Ta, Hf, Zr, Nb, Mo, Ti, V, Cr, Si, Al, B, Pd, Pt, and the like. The non-magnetic coupling layer also has a role of providing perpendicular magnetic anisotropy by absorbing B and the like in the magnetic layer adjacent to the interface, so an element having a bcc (body-centered cubic lattice), a large atomic radius and a relatively large lattice spacing is preferable. Of these, W, Ta, Hf, Zr, Nb, Mo, Ti, V, and the like of bcc are preferable, and W and Ta are more preferable.

The sum of the film thicknesses of the first non-magnetic coupling layer (3) and the second non-magnetic coupling layer (5a) is adjusted so that B and the like in the magnetic layer adjacent to the interface are absorbed to generate a perpendicular magnetic anisotropy and to a thickness range in which the magnetic coupling force $J_{ex}$ acts between the two magnetic layers (2, 6). For example, the sum is preferably adjusted in the range of 0.2 nm or more and 1.3 nm or less, and more preferably 0.4 nm or more and 1.0 nm or less, or 0.4 nm or more and 0.8 nm or less.

Where the film thickness of either the first non-magnetic coupling layer (3) or the second non-magnetic coupling layer (5a) is less than 0.2 nm, the sputtering time is adjusted to produce the layer with a film thickness of about the atomic size or smaller, so configurations with continuous layers and those with discontinuous layers are included. Even when the layers are discontinuous, it is possible to have a perpendicular magnetic anisotropy, provided that the lattice has a gap for absorbing B or the like of the magnetic layer.

From the viewpoint of further increasing the magnetic coupling force $J_{ex}$ between the two magnetic layers (2, 6) and further increasing the thermal stability factor Δ of the recording layer of the magnetoresistance effect element, it is preferable that the film thickness of each of the first non-magnetic coupling layer (3) and the second non-magnetic coupling layer (5a) does not exceed 0.3 nm.

The first magnetic insertion layer (4a) includes at least any one of Co, Fe, and Ni. For example, Co, CoB, CoFeB, CoW, Ni, NiFe, NiFeB, Fe, CoFe, FeB and the like can be mentioned. From the viewpoint of further increasing the magnetic coupling force $J_{ex}$ between the two magnetic layers (2, 6), it is preferable to include at least Fe and B, and more preferably CoFeB, FeB and the like.

The first magnetic insertion layer (4a) may further include a non-magnetic element such as W, Ta, Hf, Zr, Nb, Mo, Ti, V, Cr, Si, Al, B, Pd, Pt, and the like.

The film thickness of the first magnetic insertion layer (4a) is preferably more than 0 nm and 1.6 nm or less, more preferably 0.1 nm or more and 1.2 nm or less, and further preferably 0.2 nm or more and 1.0 nm or less. From FIG. 30 described later, it follows that when the first magnetic insertion layer (4a) is Co or Fe, the thickness of less than 0.6 nm at which the two magnetic layers have a perpendicular magnetic anisotropy is more preferable. When the first magnetic insertion layer (4a) is FeB or CoFeB, the thickness is more preferably 1.0 nm or less, and further preferably 0.9 nm or less. When the first magnetic insertion layer (4a) is CoB, the thickness is more preferably 1.0 nm or less, and further preferably 0.8 nm or less. Further, from FIG. 27 described later, it follows that since the magnetic coupling force $J_{ex}$ between the two magnetic layers only needs to be larger than zero, the lower limit value of the film thickness only needs to be larger than zero, but it is more preferable that the film thickness be adjusted to obtain the magnetic coupling force $J_{ex}=0.5$ mJ/m$^2$ at which the two magnetic layers are magnetic one body and undergo magnetization reversal and the thermal stability factor Δ is saturated. From this viewpoint, when the first magnetic insertion layer (4a) is Co, the thickness of 0.4 nm or more is more preferable, and when the first magnetic insertion layer is CoFeB, the thickness of 0.6 nm or more is more preferable. From FIGS. 30 and 27, it follows that when the first magnetic insertion layer (4a) is CoW, a perpendicular magnetic anisotropy is obtained, the magnetic coupling force $J_{ex}$ is greater than zero, and the suitable range of the present invention is satisfied in the range of film thickness (0 nm to 2 nm) of the evaluation range of perpendicular magnetic anisotropy and in the range of film thickness (0 nm to 0.8 nm) of the evaluation range of magnetic coupling force $J_{ex}$. However, as shown in the magnetization curve of FIG. 26(b) described later, in the case of CoW, the two magnetic layers are not magnetic one body to be reversed, and as follows from FIG. 27, the magnetic coupling force $J_{ex}$ is small and the effect of increasing the thermal stability factor Δ is smaller than that in the case of Co or CoFeB.

The saturation magnetization $M_s$ at the time of stacking the first magnetic insertion layer (4a) is preferably 0.4 T or more, and more preferably 1.0 T or more. The bulk saturation magnetization $M_s$ of a material which has not been stacked is preferably 0.7 T or more, and more preferably 0.9 T or more. The decrease in the value of saturation magnetization $M_s$ at the time of stacking with respect to that in the bulk state is due to the influence of adjacent layers. From FIG. 34 and Table 3 described later, it follows that the saturation magnetization $M_s$ of the first magnetic insertion layer (4a) is one of the factors that increase the magnetic coupling force $J_{ex}$.

The magnetization direction of the first magnetic layer (2) is oriented perpendicular to the film surface by the interfacial perpendicular magnetic anisotropy at the interface with the first non-magnetic layer (1). Further, the magnetization direction of the second magnetic layer (6) is oriented perpendicular to the film surface by the interfacial perpendicular magnetic anisotropy at the interface with the second non-magnetic layer (7).

The magnetoresistance effect element of Embodiment 1 is of a so-called double interface (W-interface) type having two interfaces, and as represented by the Equation 2, the interfacial magnetic anisotropy energy density $K_i$ from two magnetic layers contributes to the effective magnetic anisotropy constant $K_{eff}t$ per unit area.

In the recording layer (A1) of the magnetoresistance effect element of Embodiment 1, first magnetic layer (2) and the second magnetic layer (6) are magnetically coupled by the first coupling layer (J1) constituted of the first non-magnetic coupling layer (3), the first magnetic insertion layer (4a), and the second non-magnetic coupling layer (5a).

The magnetic coupling force is expressed by the magnetic coupling force $J_{ex}$ (mJ/m²) per unit area, which will be described hereinbelow, and where the magnetic coupling force $J_{ex}$ between the first magnetic layer (2) and the second magnetic layer (6) exceeds 0 and is, for example, 0.1 mJ/m² or more, magnetic coupling is enabled and the thermal stability factor Δ can be increased. The magnetic coupling force is preferably 0.3 mJ/m² or more, and more preferably 0.5 mJ/m² or more because the thermal stability factor Δ of the entire recording layer can be maximized. As follows from FIGS. 45 and 46 described later, $J_{ex} \approx K_{eff}t \approx 0.5$ mJ/m² are set in order to maximize the thermal stability factor Δ (in the case of two magnetic layers, two-fold thermal stability factor $Δ_0$).

In order to increase the magnetic coupling force $J_{ex}$ so as to increase the thermal stability factor Δ of the entire recording layer, an even higher magnetic coupling force $J_{ex}$ can be obtained by using a configuration with increased saturation magnetization $M_s$ of the first magnetic insertion layer (4a), performing annealing treatment, or the like, in addition to adjusting, as described above, the element type (material) and film thickness of each layer.

In Embodiment 1 shown in FIG. 1, where a reference layer is adjacent to the first non-magnetic layer (1) on the side opposite to the first magnetic layer (2), the first non-magnetic layer (1) becomes the barrier layer of the basic structure of the magnetoresistance effect element, and where another reference layer is adjacent to the second non-magnetic layer (7) on the side opposite to the second magnetic layer (6), the second non-magnetic layer (7) becomes the barrier layer. The first magnetic layer (2)/first non-magnetic coupling layer (3)/first magnetic insertion layer (4a)/second non-magnetic coupling layer (5a)/second magnetic layer (6) constitute the recording layer.

An evaluation investigation that supports the configuration of Embodiment 1 will be described herein below.

<Evaluation of Magnetic Coupling Force $J_{ex}$ as Function of Element Type and Film Thickness of Magnetic Insertion Layer>

The elements constituting the magnetic insertion layer (4a) which is inserted into the two non-magnetic coupling layers (3, 5a) include at least any one of Co, Fe, and Ni, and among them CoFeB, CoW, and Co were selected, and the magnetic coupling force was evaluated when the film thickness was in the range of 0 nm to 0.6 nm or 0.8 nm.

FIG. 25(a) shows a configuration diagram of a magnetoresistance effect element for evaluation, and FIG. 25(b) shows a configuration diagram of a magnetoresistance effect element for evaluation of the magnetic coupling force $J_{ex}$ when the coupling layer is only the first non-magnetic coupling layer (3). In order to evaluate the magnetic reversal of the first magnetic layer (2) and the second magnetic layer (6), the first magnetic layer (2) is in contact with the first non-magnetic coupling layer (3) and the W layer.

Specifically, the magnetoresistance effect element for evaluation had the following configuration: [Co (0.5 nm)/Pt (0.3 nm)]$_5$/Co (0.5 nm)/Ru (0.9 nm)/[Co (0.5 nm)/Pt (0.3 nm)]$_2$/Co (0.5 nm)/W (0.3 nm)/CoFeB$_{25}$ (1.2 nm)/W (0.2 nm)/magnetic insertion layer (0 nm to 0.8 nm)/W (0.2 nm)/CoFeB$_{25}$ (1.0 nm)/MgO (0.9 nm)/CoFeB$_{25}$ (1.0 nm)/Ru (5 nm)/Ta (5 nm), and was subjected to annealing treatment at 400° C. for 1 h.

FIG. 26(a) shows a magnetization curve in the case where the magnetic insertion layer (4a) is CoFeB, FIG. 26(b) shows a magnetization curve in the case where the magnetic insertion layer (4a) is CoW, and FIG. 26(c) shows a magnetization curve in the case where the magnetic (4a) is Co. The magnetization reversal part of the second magnetic layer (6) is circled.

It was found from FIG. 26(a) that where CoFeB was inserted as the magnetic insertion layer (4a), the magnetic field H shifted, and where the film thickness t was 0.6 nm or more, the first magnetic layer (2) and the second magnetic layer (6) were magnetic one body and reversed.

From FIG. 26(b), where CoW was inserted as the magnetic insertion layer (4a), the magnetic field H did not shift that much, and with the film thickness within the range of 0 nm to 0.8 nm, the mode in which the first magnetic layer (2) and the second magnetic layer (6) were magnetic one body and reversed was not observed.

It was found from FIG. 26(c) that where Co was inserted as the magnetic insertion layer (4a), the magnetic field H shifted, and when the film thickness t was 0.4 nm or more, the first magnetic layer and the second magnetic layer were magnetic one body and reversed. That is, the magnetic coupling force $J_{ex}$ reaches 0.5 mJ/m² with a film thickness smaller than in the case where CoFeB is inserted as the magnetic insertion layer (4a).

Figure 27:
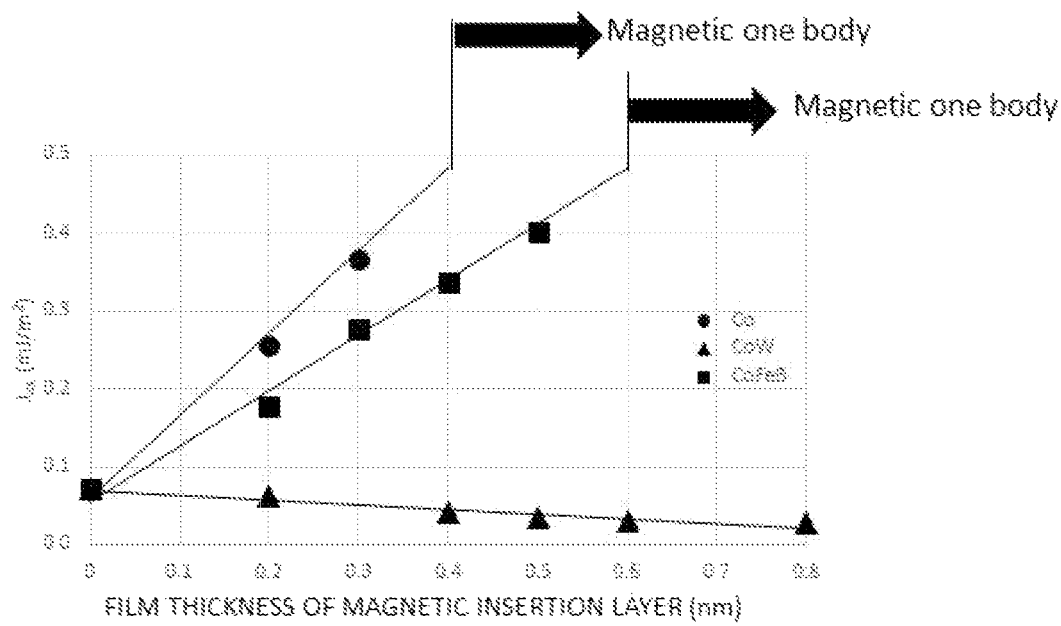
FIG. 27 shows the relationship between the film thickness t and the magnetic coupling force $J_{ex}$ for each element type of the magnetic insertion layer in the coupling layer.

The magnetic coupling force $J_{ex}$ can be calculated from the respective magnetization curves of FIGS. 26(a), 26(b), and 26(c) by the shift magnetic field $H_{ex}$, the saturation magnetization $M_s$, and the film area S. The relationship between each film thickness and magnetic coupling force $J_{ex}$ is shown in FIG. 27.

It was found that since the first magnetic layer and the second magnetic layer were magnetically coupled within a range where the magnetic coupling force $J_{ex}$ was greater than zero, where the film thickness of the magnetic insertion layer (4a) was greater than zero in all evaluation materials, the two magnetic layers were magnetically coupled. It was also found that the two magnetic layers were magnetic one body and reversed and the magnetic coupling force $J_{ex}$ reached 0.5 mJ/m$^2$ at 0.6 nm when CoFeB was inserted as the magnetic insertion layer (4a) and at 0.4 nm when Co was inserted as the magnetic insertion layer. Meanwhile, it was found that when CoW was inserted, the effect that the magnetic coupling force $J_{ex}$ increases with increasing film thickness was not observed, and the magnetic coupling force did not reach 0.5 mJ/m$^2$ in the evaluation range.

As described above, one of the reasons why the magnetic coupling force $J_{ex}$ differs depending on the element type is considered to be due to the difference in saturation magnetization $M_s$ of each material.

The saturation magnetization $M_s$ at the time of stacking each material (element type) can be obtained from the slope of the magnetization M with respect to the film thickness of the magnetic insertion layer.

Figure 28:
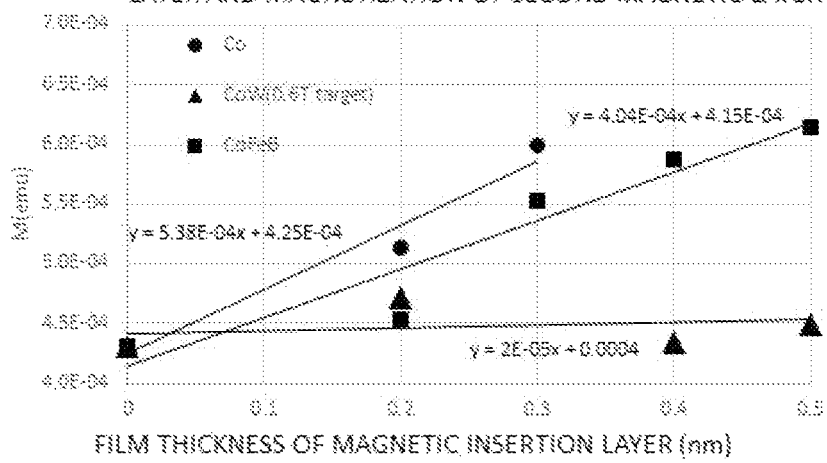
FIG. 28 shows the relationship between the film thickness t and the magnetization M for each element type of the magnetic insertion layer in the coupling layer.

FIG. 28 shows the relationship between the film thickness t of the magnetic insertion layer of each material (element type) and the magnetization M, and this relationship was interpolated with a linear approximation curve (regression line) to calculate the slope of the line.

Table 1 shows the slope of the straight line and the saturation magnetization $M_s$.

TABLE 1

| material | Slope (emu/nm) | Ms (emu/cm3) | Ms (T) |
| --- | --- | --- | --- |
| CoW(0.6T) | 2.00E−05 | 50 | 0.06 |
| Co(1.8T) | 5.38E−04 | 1345 | 1.69 |
| CoFeB(1.5T) | 4.04E−04 | 1010 | 1.27 |

From Table 1, it can be seen that the saturation magnetization $M_s$ at the time of stacking of Co used in the present evaluation test is 1.69 T, the saturation magnetization $M_s$ at the time of stacking of CoFeB is 1.27 T, and the saturation magnetization $M_s$ at the time of stacking of CoW is 0.06 T.

<Investigation of Saturation Magnetization $M_s$ and Film Thickness at which Perpendicular Magnetic Anisotropy is Obtained for Magnetic Insertion Layer>

The saturation magnetization $M_s$ and the optimum range of the film thickness at which a perpendicular magnetic anisotropy is obtained were investigated for the magnetic insertion layer within the framework of evaluating the dependency on film thickness of layers constituting the magnetoresistance effect element of the present invention.

Figure 29:
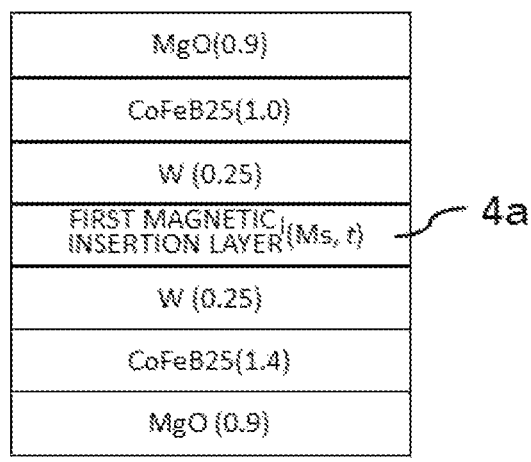
FIG. 29 shows a configuration diagram of magnetoresistance effect element for evaluation of the relationship between the effective magnetic anisotropy energy density $K_{eff}$ and the film thickness of the first magnetic insertion layer (4a).

FIG. 29 shows a configuration diagram of the magnetoresistance effect element for evaluation of the dependency on film thickness of the magnetic insertion layer.

Specifically, the magnetoresistance effect element for evaluation has the following configuration: MgO (0.9 nm)/CoFeB$_{25}$ (1.4 nm)/W (0.25 nm)/magnetic insertion layer (saturation magnetization $M_s$, film thickness t)/W (0.25 nm)/CoFeB$_{25}$ (1.0 nm)/MgO (0.9 nm).

Figure 30:
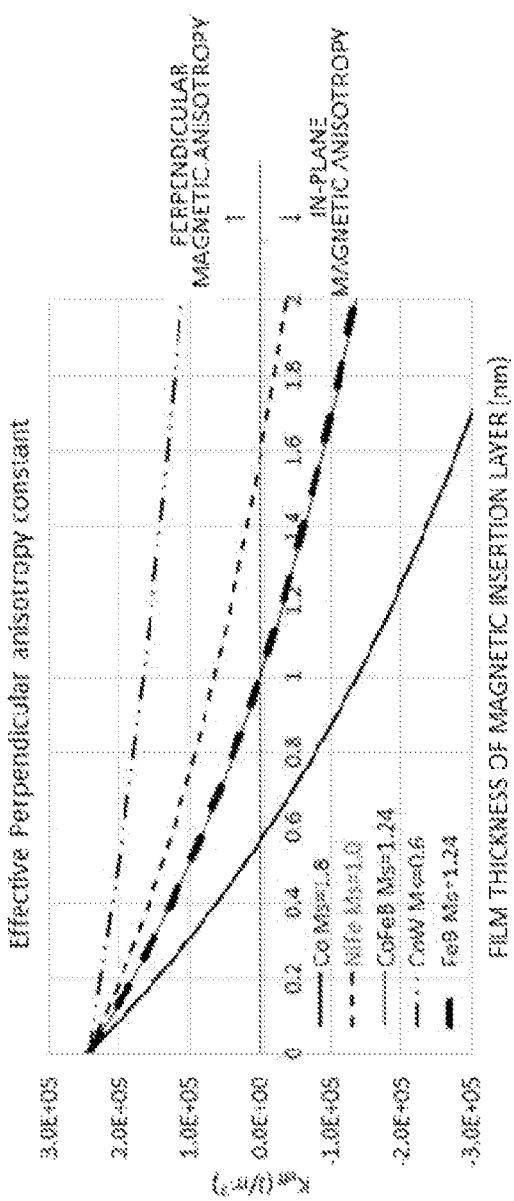
FIG. 30 shows the relationship between the effective magnetic anisotropy energy density $K_{eff}$ and the film thickness of the first magnetic insertion layer (4a).

FIG. 30 and Table 2 show the relationship between the film thickness of the magnetic insertion layer and the effective magnetic anisotropy energy density $K_{eff}$ for each element type and bulk saturation magnetization $M_s$ of the magnetic insertion layer.

It was found from FIG. 30 that when the film thickness of the magnetic insertion layer increased, the first magnetic layer and the second magnetic layer changed from perpendicular magnetic anisotropy to in-plane magnetic anisotropy.

Since the film thickness at which the effective magnetic anisotropy energy density $K_{eff}$ has a positive value is necessary for using the magnetoresistance effect element of the present invention as a perpendicular magnetic anisotropy magnetoresistance effect element, it follows from FIG. 30 that when Co (bulk saturation magnetization $M_s$=1.8 T) is used for the magnetic insertion layer in the magnetoresistance effect element for evaluation, the film thickness of the magnetic insertion layer is preferably less than 0.6 nm. When NiFe (bulk saturation magnetization $M_s$=1.0 T) is used for the magnetic insertion layer, the film thickness of the magnetic insertion layer is preferably less than 1.6 nm. When CoFeB (bulk saturation magnetization $M_s$=1.24 T) or FeB (bulk saturation magnetization $M_s$=1.235 T) is used for the magnetic insertion layer, the film thickness of the magnetic insertion layer is preferably 1.0 nm or less, and more preferably 0.9 nm or less. It was found that when CoW (bulk saturation magnetization $M_s$=0.6 T) was used for the magnetic insertion layer, the effective magnetic anisotropy energy density $K_{eff}$ was positive even when the film thickness of the magnetic insertion layer exceeded the evaluation range.

TABLE 2

| Film thickness (nm) | FeB | Co | NiFe | CoFeB | CoW |
| --- | --- | --- | --- | --- | --- |
|  |  | Keff (×10$^3$ J/m$^3$) |  |  |  |
| 0.0 | 244 | 244 | 244 | 244 | 244 |
| 0.1 | 211 | 193 | 220 | 211 | 235 |
| 0.2 | 181 | 146 | 198 | 180 | 226 |
| 0.3 | 153 | 103 | 177 | 152 | 218 |
| 0.4 | 127 | 62 | 158 | 126 | 210 |
| 0.5 | 102 | 23 | 140 | 101 | 202 |
| 0.6 | 79 | −13 | 123 | 78 | 194 |
| 0.7 | 58 | −47 | 107 | 57 | 187 |
| 0.8 | 38 | −79 | 92 | 36 | 180 |
| 0.9 | 19 | −109 | 78 | 17 | 173 |
| 1.0 | 1 | −137 | 65 | −1 | 167 |
| 1.1 | −16 | −164 | 53 | −18 | 160 |
| 1.2 | −32 | −190 | 41 | −34 | 154 |
| 1.6 | −88 | −280 | −1 | −90 | 132 |
| 2.0 | −134 | −355 | −36 | −137 | 112 |

<Investigation of Saturation Magnetization $M_s$ and Magnetic Coupling Force $J_{ex}$ of Magnetic Insertion Layer>

When CoW was used for the non-magnetic insertion layer, as shown in FIGS. 26(b) and 27, the magnetic field H did not shift so much, and no magnetic reversal as one body of the first magnetic layer and the second magnetic layer was observed in the film thickness range of 0 nm to 0.8 nm. This was thought to be due to a low saturation magnetization $M_s$, as shown in FIG. 28 and Table 1.

Accordingly, optimization of the saturation magnetization of the magnetic insertion layer was investigated using a magnetoresistance effect element for evaluation, in which CoW films with different saturation magnetization $M_s$ were inserted as the magnetic insertion layer.

In order to produce CoW films with different saturation magnetization $M_s$, the sputtering conditions were investigated with a thick CoW film (about 30 nm).

Sputtering of CoW was performed by fixing the sputtering power for W at 30 W, and setting the sputtering power for Co in the range of 100 W to 600 W, and after annealing treatment at 400° C. for 1 h, saturation magnetization $M_s$ was evaluated.

Figure 31A:
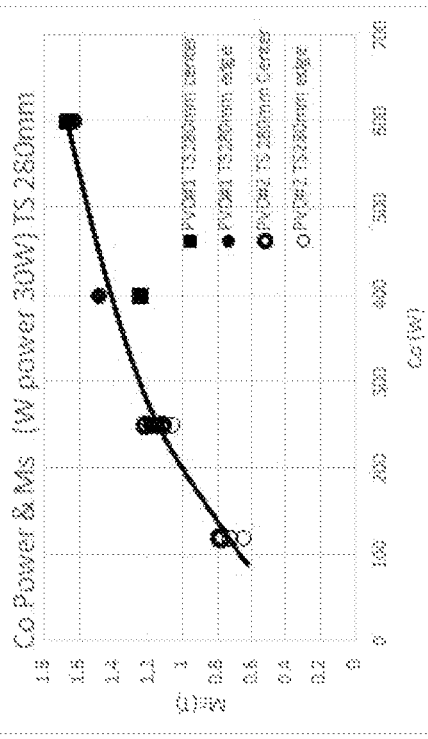
FIG. 31(a) shows the relationship between the Co sputtering power at the time of CoW film fabrication and the saturation magnetization $M_s$ when the T-S distance is 230 mm.
Figure 31B:
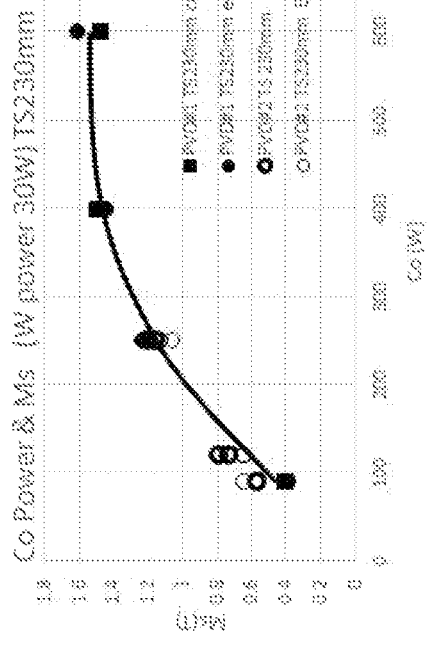
FIG. 31(b) shows the relationship between the Co sputtering power at the time of CoW film fabrication and the saturation magnetization $M_s$ when the T-S distance is 280 mm.

FIG. 31(a) shows the relationship between the sputtering power for Co and the saturation magnetization $M_s$ when the T-S distance is 230 mm. FIG. 31(b) shows the relationship between the sputtering power for Co and the saturation magnetization $M_s$ when the T-S distance is 280 mm.

It was found that the saturation magnetization $M_s$ decreased as the sputtering power for Co was reduced. This is due to the fact that when the sputtering power for Co is reduced, the amount of sputtered Co decreases compared to W, and the composition of Co in CoW decreases.

CoW with different saturation magnetization $M_s$ was inserted as a magnetic insertion layer in the magnetoresistance effect element for evaluation, and the effect of magnetic coupling force $J_{ex}$ was evaluated.

Figure 32:
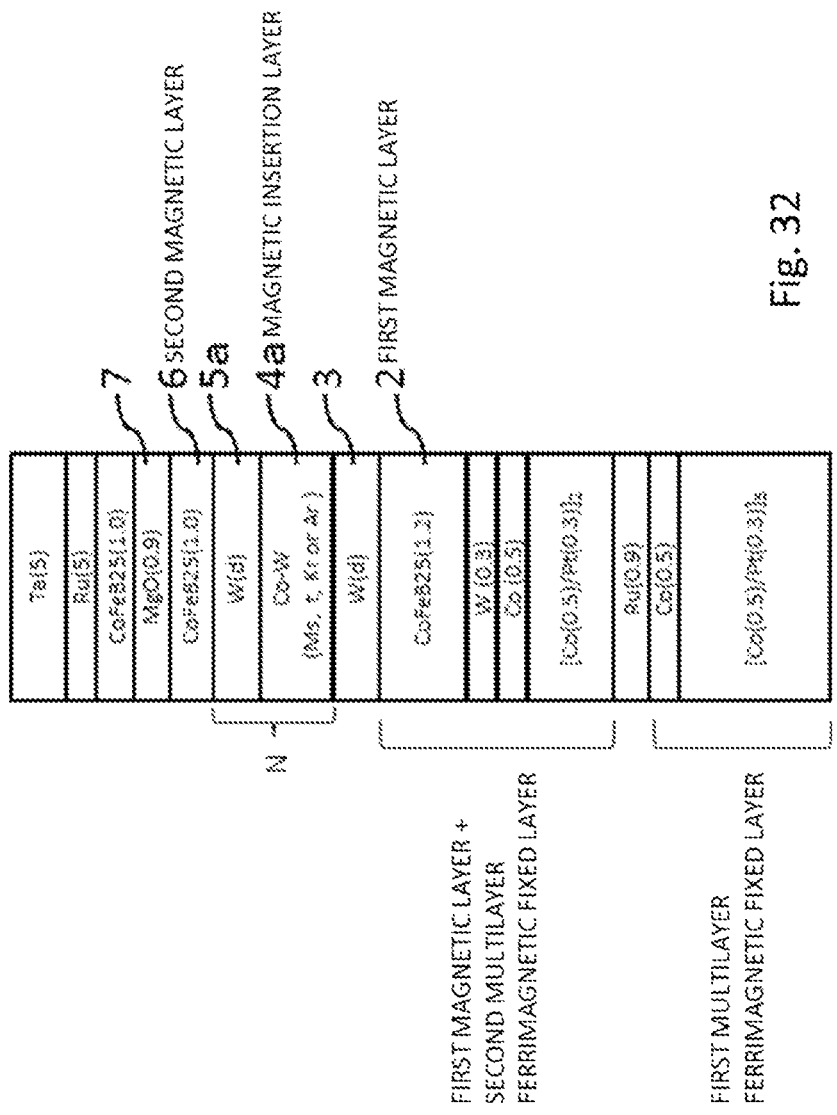
FIG. 32 shows a configuration diagram of a magnetoresistance effect element for evaluation by bulk saturation magnetization $M_s$ when CoW is used as a magnetic insertion layer.

FIG. 32 shows a configuration diagram of the magnetoresistance effect element for evaluation of dependency on saturation magnetization $M_s$ of the magnetic insertion layer.

Specifically, the magnetoresistance effect element for evaluation had the following configuration: [Co (0.5 nm)/Pt (0.3 nm)]$_5$/Co (0.5 nm)/Ru (0.9 nm)/[Co (0.5 nm)/Pt (0.3 nm)]$_2$/Co (0.5 nm)/W (0.3 nm)/CoFeB$_{25}$ (1.2 nm)/W ($t_w$ nm)/CoW (saturation magnetization $M_s$, film thickness $t_{CoW}$ nm, Kr gas or Ar gas)/W ($t_w$ nm)/CoFeB$_{25}$ (1.0 nm)/MgO (0.9 nm)/CoFeB$_{25}$ (1.0 nm)/Ru (5 nm)/Ta (5 nm), and was subjected to annealing treatment at 400° C. for 1 h.

Figure 33:
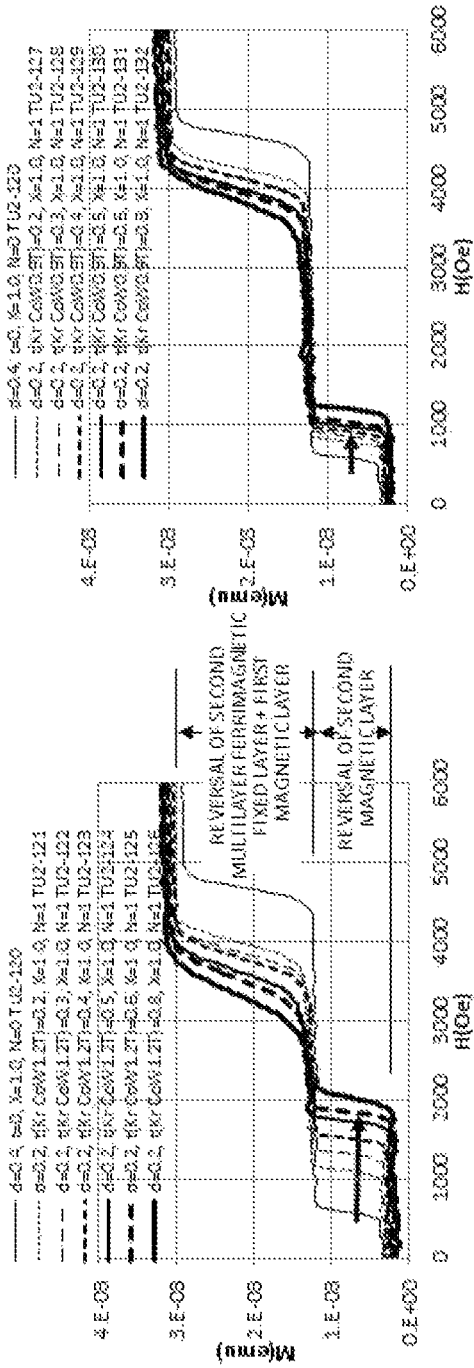
FIG. 33(a) shows magnetization curve at the time of sweeping from positive to negative for CoW as a magnetic insertion layer when bulk saturation magnetization $M_s$=1.2 T, and the sputtering gas is Kr.
FIG. 33(b) shows magnetization curve at the time of sweeping from positive to negative for CoW as a magnetic insertion layer when bulk saturation magnetization $M_s$=0.9 T, and the sputtering gas is Kr.

FIG. 33(a) shows the magnetization curve in the case where bulk saturation magnetization $M_s$=1.2 T, Kr gas sputtering is performed, $t_w$=0.2 nm, $t_{CoW}$=0.2 to 0.8 nm, and $t_w$=0.4 nm, $t_{CoW}$=0 nm.

FIG. 33(b) shows the magnetization curve in the case where bulk saturation magnetization $M_s$=0.9 T, Kr gas sputtering is performed, $t_w$=0.2 nm, $t_{CoW}$=0.2 to 0.8 nm, and $t_w$=0.4 nm, $t_{CoW}$=0 nm.

It was found that where the saturation magnetization $M_s$ was large, the shift of the magnetic field H was large and the magnetic coupling force $J_{ex}$ was large.

Figure 34:
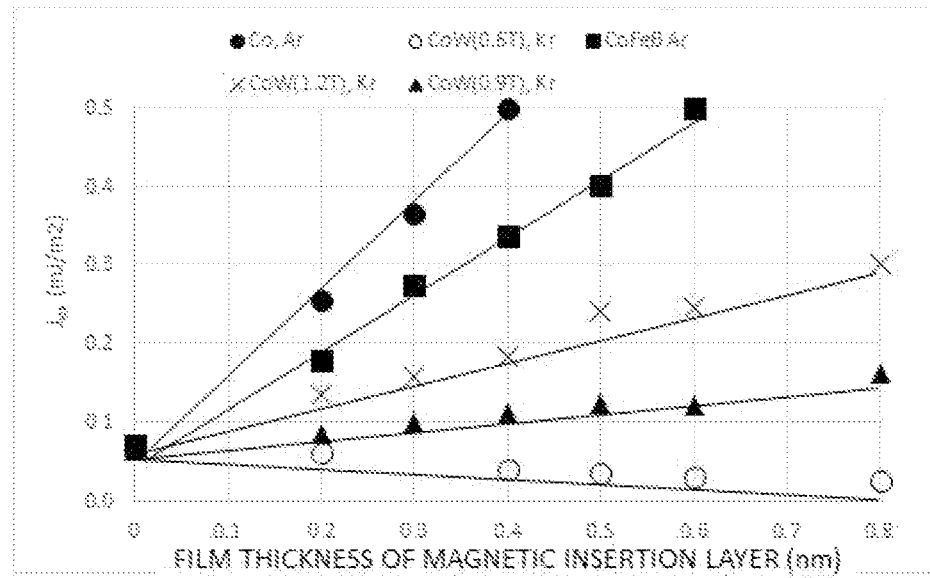
FIG. 34 shows the relationship between the film thickness of the magnetic insertion layer and the magnetic coupling force $J_{ex}$ for each element type of the magnetic insertion layer and bulk saturation magnetization $M_s$.

FIG. 34 shows the relationship between the film thickness of the magnetic insertion layer and the magnetic coupling force $J_{ex}$ obtained in evaluation using the magnetoresistance effect element for evaluation shown in FIG. 32 in which CoFeB, Co, and CoW having different saturation magnetization $M_s$ were used as the magnetic insertion layer.

Table 3 shows the type of magnetic insertion layer, the sputtering gas, the saturation magnetization $M_s$, and the presence/absence of effect on magnetic coupling force $J_{ex}$.

TABLE 3

| material | Sputter gas | Ms* (T) | Increase in Jex as film thickness increases |
|---|---|---|---|
| Co(1.8T) | Ar | 1.69 | Yes |
| CoFeB(1.5T) | Ar | 1.27 | Yes |
| CoW(0.6T, Kr | Kr | 0.06 | No |
| CoW(1.2T), Kr | Kr | 0.63 | Yes |
| CoW(0.9T), Kr | Kr | 0.42 | Yes |

The saturation magnetization $M_s$* at the time of stacking shown in Table 3 is a value calculated from the dependency of the magnetic moment on the film thickness of the magnetic insertion layer. The value of bulk saturation magnetization $M_s$ is added to the material column in the table.

From FIG. 34 and Table 3, it was found that the effect of magnetic coupling force $J_{ex}$ increased as the saturation magnetization $M_s$ increased. It was also found that even in CoW, the effect of magnetic coupling force $J_{ex}$ appeared as the saturation magnetization $M_s$ increased. Although depending on the sputtering conditions, the effect of increasing the magnetic coupling force $J_{ex}$ as the film thickness increases was observed when the saturation magnetization $M_s$ at the time of stacking of the magnetic insertion layer was 0.4 T or more and the bulk saturation magnetization $M_s$ of the non-stacked material exceeded 0.6 T.

$M_s$* in the case where CoFeB, Co, and CoW in Table 3 were used as the magnetic insertion layer was obtained from the slope of the magnetization M with respect to the film thickness of the magnetic insertion layer.

Figure 35:
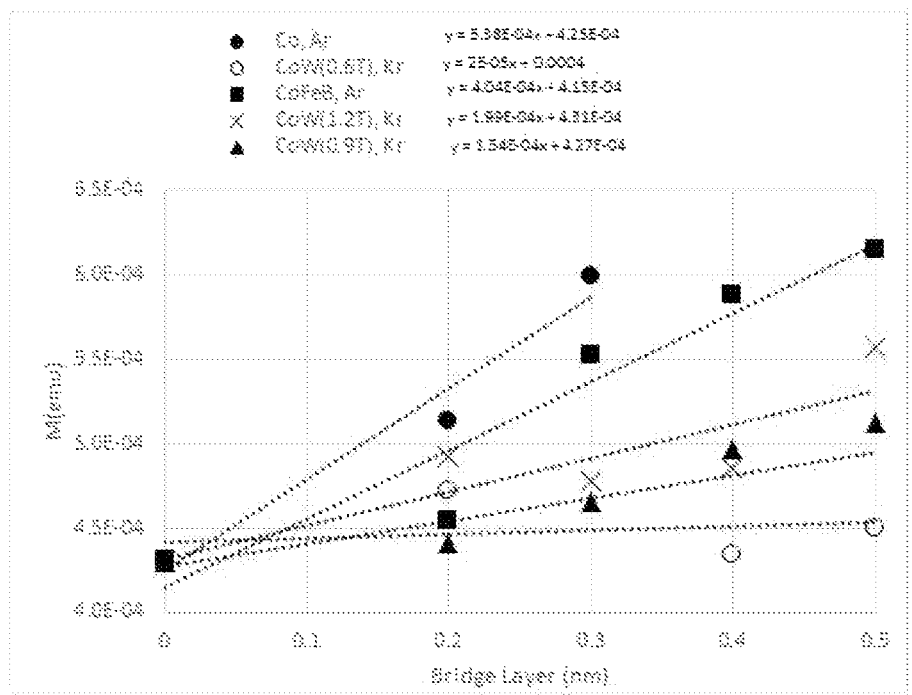
FIG. 35 shows the relationship between the film thickness of the magnetic insertion layer and the magnetization M for each element type of the magnetic insertion layer and bulk saturation magnetization $M_s$.

FIG. 35 shows the relationship between the film thickness t of the magnetic insertion layer of CoFeB, Co, and CoW and the magnetization M, and this relationship was interpolated with a linear approximation curve (regression line) to calculate the slope of the line.

Table 4 shows the slope of the straight line and the saturation magnetization $M_s$ at the time of stacking.

TABLE 4

| material | Slope emu/nm | Ms emu/cm3 | Ms T | Increase in Jex as film thickness increases |
|---|---|---|---|---|
| Co(1.8T) | 5.38E−04 | 1345 | 1.69 | Yes |
| CoFeB(1.5T) | 4.04E−04 | 1010 | 1.27 | Yes |
| CoW(0.6T), Kr | 2.00E−05 | 50 | 0.06 | No |
| CoW(1.2T), Kr | 1.99E−04 | 498 | 0.63 | Yes |
| CoW(0.9T), Kr | 1.34E−04 | 335 | 0.42 | Yes |

<Investigation of Relationship Between Magnetic Coupling Force $J_{ex}$ and Thermal Stability Factor Δ>

The evaluation model made it clear that the magnetic coupling force $J_{ex}$ for making the thermal stability factor Δ of the entire recording layer twice (maximum) the thermal stability factor $Δ_0$ of one magnetic layer in the recording layer of the magnetoresistance effect element having two magnetic layers adjacent to the non-magnetic layer at the interfaces is about 0.5 mJ/m² or more.

This will be described in detail below.

Figures 36, 37:
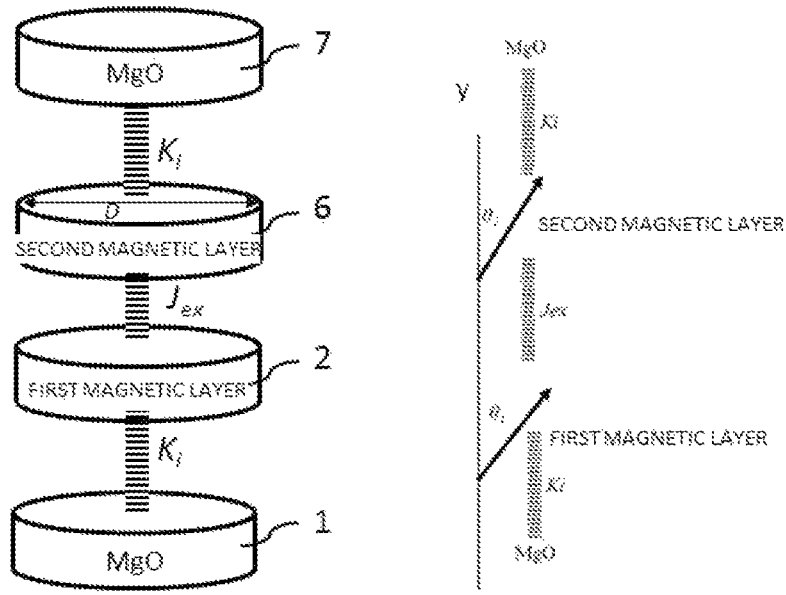
FIG. 36 is a schematic diagram of an evaluation model for obtaining a thermal stability factor Δ in a recording layer of a magnetoresistance effect element having two magnetic layers.
FIG. 37 directly represents the calculation results of the normalized magnetic barrier energy Δe(θ1, θ2) when γ=0 ($J_{ex}$=0).

As shown in FIG. 36, the calculation was performed with an evaluation model constituted of the first non-magnetic layer (1), the first magnetic layer (2), the second magnetic layer (6), and the second non-magnetic layer (7), and the optimum conditions for the thermal stability factor Δ of the entire recording layer were found. The purpose of this evaluation model was investigating what magnetic coupling force $J_{ex}$ between the two magnetic layers is to be created by the configuration of the recording layer and increasing the thermal stability factor Δ.

In FIG. 36, $J_{ex}$ is a magnetic coupling force between the first magnetic layer (2) and the second magnetic layer (6), D is a diameter of the magnetoresistance effect element, $θ_1$ is an angle formed with the y-axis by the magnetic moment of the first magnetic layer (2), $θ_2$ is an angle formed with the y-axis by the magnetic moment of second magnetic layer (3), and $K_i$ is an interfacial magnetic anisotropy energy density.

In the evaluation model shown in FIG. 36, the magnetic energy E (J/m²) per unit area is represented by the following equation.

$$E(θ_1,θ_2)=K_{eff}(\sin^2 θ_1+\sin^2 θ_2)-J_{ex}\cos(θ_1-θ_2) \quad \text{[Equation 4]}$$

Here, it is considered that when the materials of the first non-magnetic layer (1) and the second non-magnetic layer (7) are the same, such as MgO, the effective magnetic anisotropy constant received from the first non-magnetic layer (1) such as MgO to which the first magnetic layer (2) is adjacent and the effective magnetic anisotropy constant received from the second non-magnetic layer (7) such as MgO to which the second magnetic layer (6) is adjacent are equal to each other.

In addition, in the present evaluation mode, since the bulk magnetic anisotropy energy density can be considered as $K_b \approx 0$, the Equation 2 can be modified to be represented by the following equation.

$$K_{eff}t = K_i - N_z(D) \cdot M_s^2 \cdot t/(2\mu_0) \quad \text{[Equation 5]}$$

Here, $N_z(D)$ is an antimagnetic field coefficient and is calculated by spheroid approximation.

The magnetic energy E per unit area in the Equation 4 which is normalized by the effective magnetic anisotropy constant Kent per unit area is the normalized magnetic energy e per unit area and is expressed by an Equation 6. Further, the normalized magnetic barrier energy Δe obtained by taking the incremental difference thereof is expressed by an Equation 7.

Furthermore, the thermal stability factor Δ of the entire recording layer is the product of the normalized magnetic barrier energy Δe and the thermal stability factor $\Delta_0$ of one magnetic layer, and is expressed by an Equation 8.

$$e(\theta_1, \theta_2) = E/K_{eff}t = \sin^2\theta_1 + \sin^2\theta_2 - \gamma \cos(\theta_1 - \theta_2) \quad \text{[Equation 6]}$$

$$\Delta e(\theta_1, \theta_2) = e(\theta_1, \theta_2) - e(0,0) \quad \text{[Equation 7]}$$

$$\Delta = \Delta e \cdot \Delta_0 \quad \text{[Equation 8]}$$

The parameter γ in the Equation 6 is obtained by normalizing the magnetic coupling force $J_{ex}$ with an effective magnetic anisotropy constant Kent per unit area, and is expressed by an Equation 9.

$$\gamma = J_{ex}/K_{eff}t \quad \text{[Equation 9]}$$

FIGS. 37 to 44 show the results obtained by swinging θ1 and θ2 by 10 degrees and calculating the normalized magnetic barrier energy Δe by using the Equations 6 and 7 when the parameter γ is set to 0 to 1.5 in the Equation 9.

In each figure, the numeric character of the saddle point is bolded and underlined.

Figure 38:
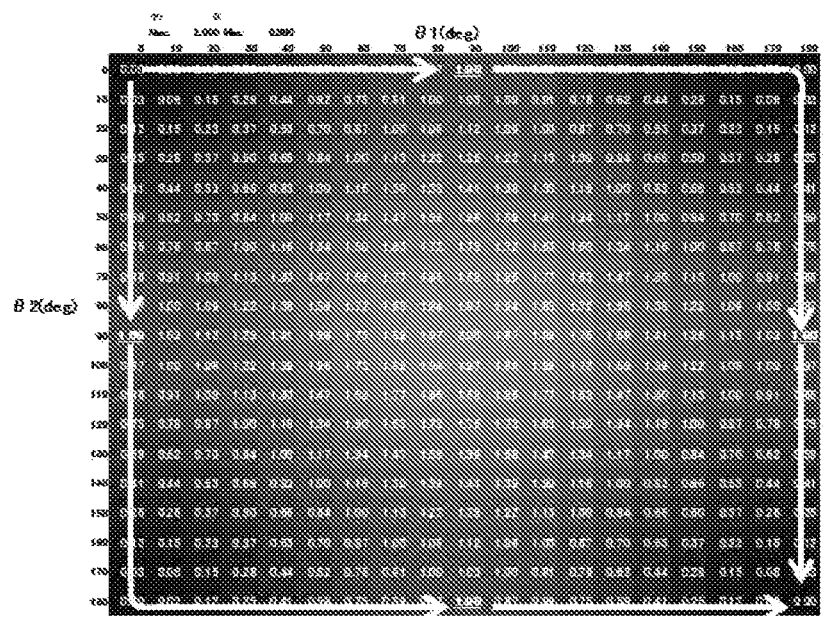
FIG. 38 represents, by coloring and shading, the calculation results of the normalized magnetic barrier energy Δe(θ1, θ2) when γ=0 ($J_{ex}$=0), and also shows the magnetization reversal path.

With respect to the case in which the parameter γ=0, that is, the magnetic coupling force $J_{ex}$=0, in FIG. 37, the numerical values of the calculation results of the normalized magnetic barrier energy Δe(θ1, θ2) are shown as they are, and in FIG. 38, the numerical values of the calculation results of the normalized magnetic barrier energy Δe(θ1, θ2) are represented by coloration with gray shades, and the magnetization reversal path is indicated by an arrow.

The normalized magnetic barrier energy Δe is the energy required for magnetization reversal, and the smaller the numerical value, the smaller the required energy. Further, the path where the angle between the magnetic moments of the two magnetic layers and the y-axis is reversed from 0 degrees to 180 degrees passes through the saddle point of the normalized magnetic barrier energy Δe.

The saddle point, as referred to herein, is a point in the domain of a multivariable real function that has a maximum value when viewed in one direction but has a minimum value when viewed in another direction.

As the saddle point and the reversal path are shown in FIG. 38, the saddle point of the magnetization reversal from $\theta_1=\theta_2=0$ to $\theta_1=\theta_2=180$ is on $\theta_1=0$ or $\theta_2=0$. It can be seen that either the first magnetic layer (2) or the second magnetic layer (6) first undergoes magnetization reversal, and after the reversal is finished, the other magnetic layer undergoes magnetization reversal.

Further, the normalized magnetic barrier energy Δe, which is the numerical character at the saddle points, is 1, and according to the Equation 8, the thermal stability factor Δ of the entire recording layer is the same as the thermal stability factor $\Delta_0$ of one magnetic layer, and the effect of increasing the thermal stability factor Δ by configuring two magnetic layers cannot be obtained.

Figure 39:
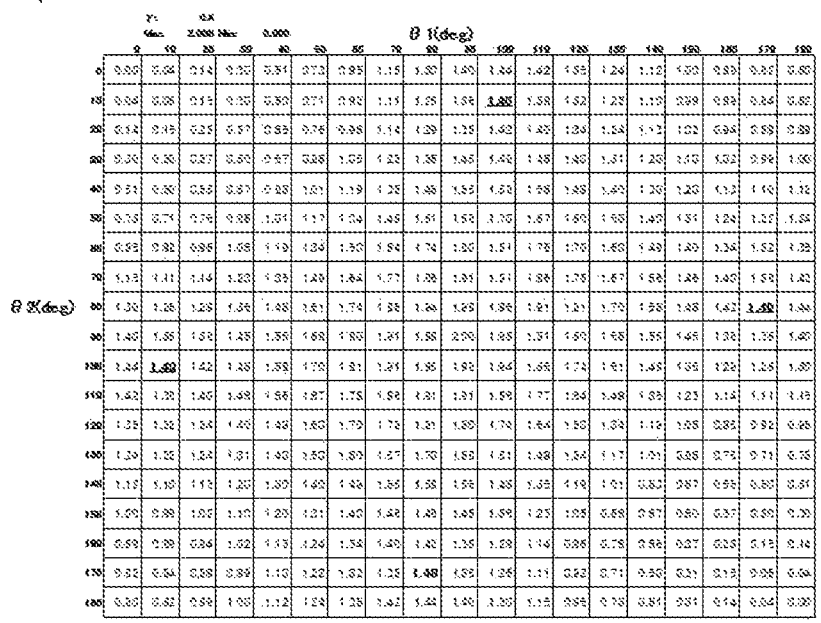
FIG. 39 directly represents the calculation results of the normalized magnetic barrier energy Δe(θ1, θ2) when γ=0.4.
Figure 40:
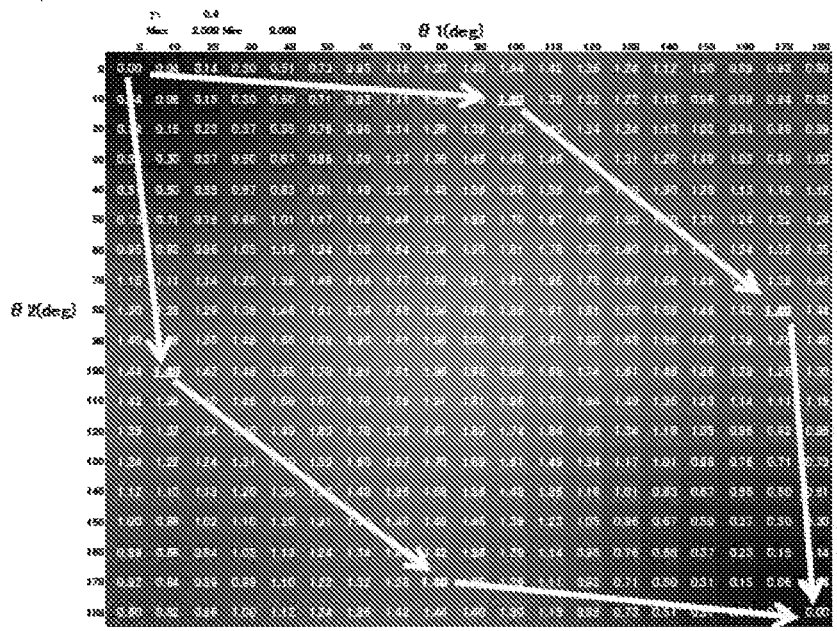
FIG. 40 represents, by coloring and shading, the calculation results of the normalized magnetic barrier energy Δe(θ1, θ2) when γ=0.4, and also shows the magnetization reversal path.

With respect to the case in which the parameter γ=0.4, in FIG. 39, the numerical values of the calculation results of the normalized magnetic barrier energy Δe(θ1, θ2) are shown as they are, and in FIG. 40, the numerical values of the calculation results of the normalized magnetic barrier energy Δe(θ1, θ2) are represented by coloration with gray shades, and the magnetization reversal path is indicated by an arrow.

As the saddle point and the reversal path are shown in FIG. 40, it can be seen that the magnetic layer undergoes magnetization reversal from $\theta_1$=100, $\theta_2$=10 through the saddle point of $\theta_1$=170, $\theta_2$=80, or from $\theta_1$=10, $\theta_2$=100 through the saddle point of $\theta_1$=80, $\theta_2$=170. That is, it can be seen that the magnetization reversal of the two magnetic layers occurs partially in parallel.

Further, the normalized magnetic barrier energy Δe, which is the numerical character at the saddle points, is 1.4, and according to the Equation 8, the thermal stability factor Δ of the entire recording layer is 1.4 times the thermal stability factor $\Delta_0$ of one magnetic layer, and the effect of increasing the thermal stability factor Δ by configuring two magnetic layers is observed.

Figure 41:
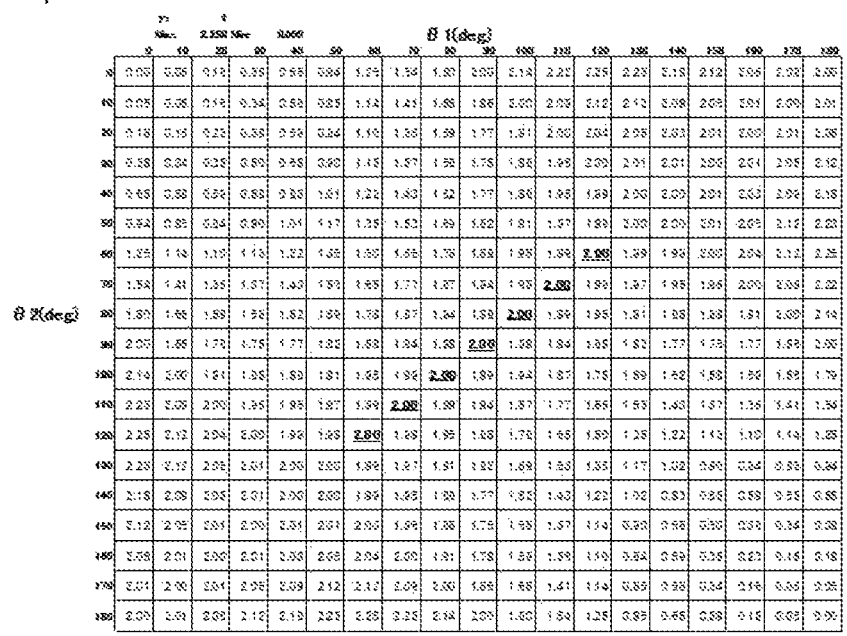
FIG. 41 directly represents the calculation results of the normalized magnetic barrier energy Δe(θ1, θ2) when γ=1 ($J_{ex}$=$K_{eff}$t).

With respect to the case in which the parameter γ=1, that is, the magnetic coupling force $J_{ex}$=Kent, in FIG. 41, the numerical values of the calculation results of the normalized magnetic barrier energy Δe(θ1, θ2) are shown as they are, and in FIGS. 31(a) and 31(b), the numerical values of the calculation results of the normalized magnetic barrier energy Δe(θ1, θ2) are represented by coloration with gray shades, and the magnetization reversal path is indicated by an arrow.

Figure 42:
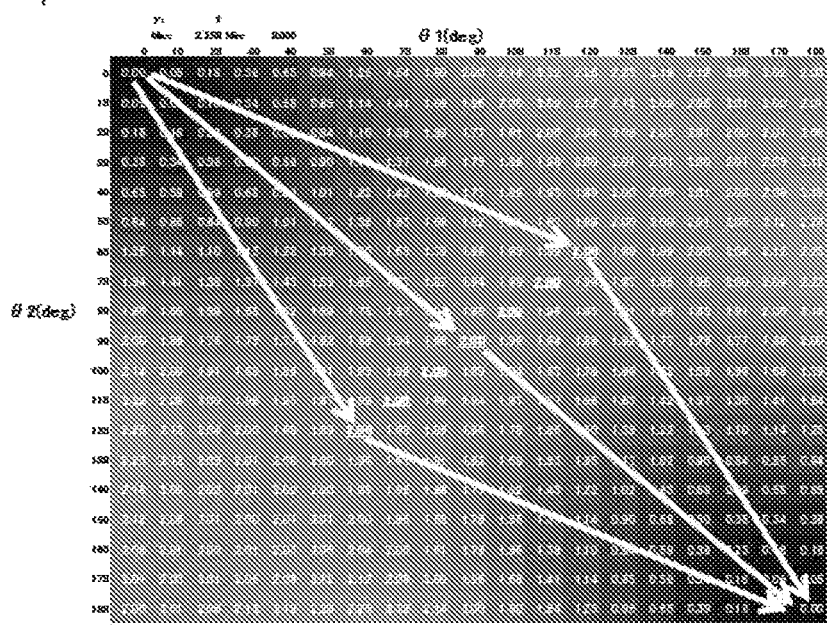
FIG. 42 represents, by coloring and shading, the calculation results of the normalized magnetic barrier energy Δe(θ1, θ2) when γ=1 ($J_{ex}$=$K_{eff}$t), and also shows the magnetization reversal path.

As the saddle point and the reversal path are shown in FIG. 42, it can be seen that the magnetic layer undergoes magnetization reversal through the saddle point within $O_1$=60 to 120 and $\theta_2$=60 to 120. That is, it can be seen that the magnetization reversal of the two magnetic layers occurs mostly in parallel.

Further, the normalized magnetic barrier energy Δe, which is the numerical character at the saddle points, is 2, and according to the Equation 8, the thermal stability factor Δ of the entire recording layer is twice the thermal stability factor $\Delta_0$ of one magnetic layer, and the effect of increasing the thermal stability factor Δ by configuring two magnetic layers is observed.

Figure 43:
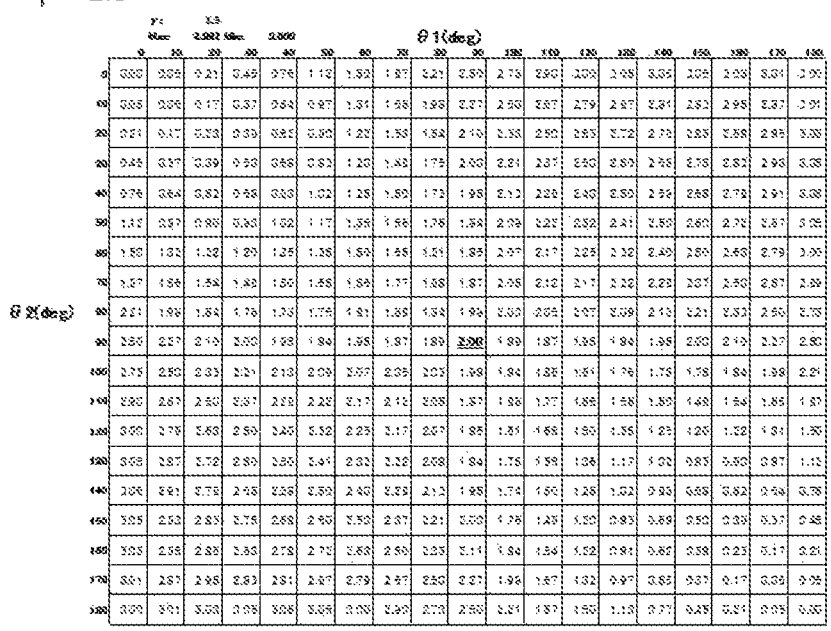
FIG. 43 directly represents the calculation results of the normalized magnetic barrier energy Δe(θ1, θ2) when γ=1.5.
Figure 44:
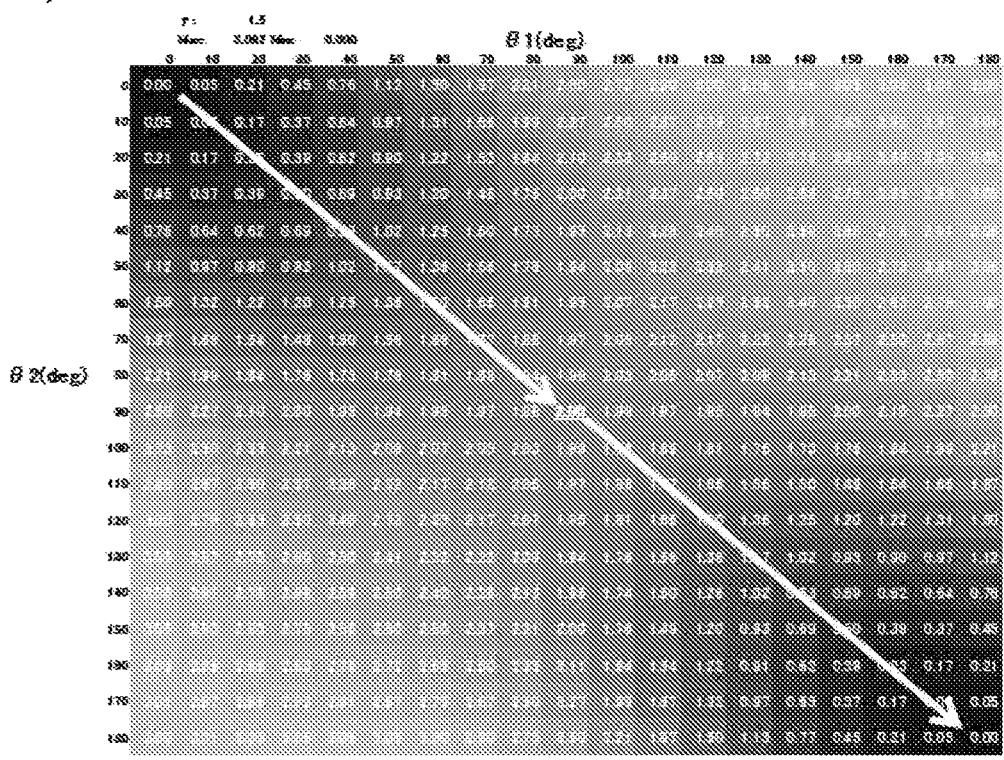
FIG. 44 represents, by coloring and shading, the calculation results of the normalized magnetic barrier energy Δe(θ1, θ2) when γ=1.5, and also shows the magnetization reversal path.

With respect to the case in which the parameter γ=1.5, in FIG. 43, the numerical values of the calculation results of the normalized magnetic barrier energy Δe(θ1, θ2) are shown as they are, and in FIG. 44, the numerical values of the calculation results of the normalized magnetic barrier energy Δe(θ1, θ2) are represented by coloration with gray shades, and the magnetization reversal path is indicated by an arrow.

As the saddle point and the reversal path are shown in FIG. 44, it can be seen that the magnetic layer undergoes magnetization reversal through the saddle point on $\theta_1$=90, $\theta_2$=90. That is, it can be seen that the magnetization reversal of the two magnetic layers occurs almost in parallel.

Further, the normalized magnetic barrier energy Δe, which is the numerical character at the saddle points, is 2, and according to the Equation 8, the thermal stability factor Δ of the entire recording layer is twice the thermal stability factor $\Delta_0$ of one magnetic layer, and the effect of increasing the thermal stability factor Δ by configuring two magnetic layers is observed. However, it can be seen that although the parameter is greater than the magnetic coupling force $J_{ex}=K_{eff}t$, the value of thermal stability factor $\Delta$ is saturated.

Figure 45:
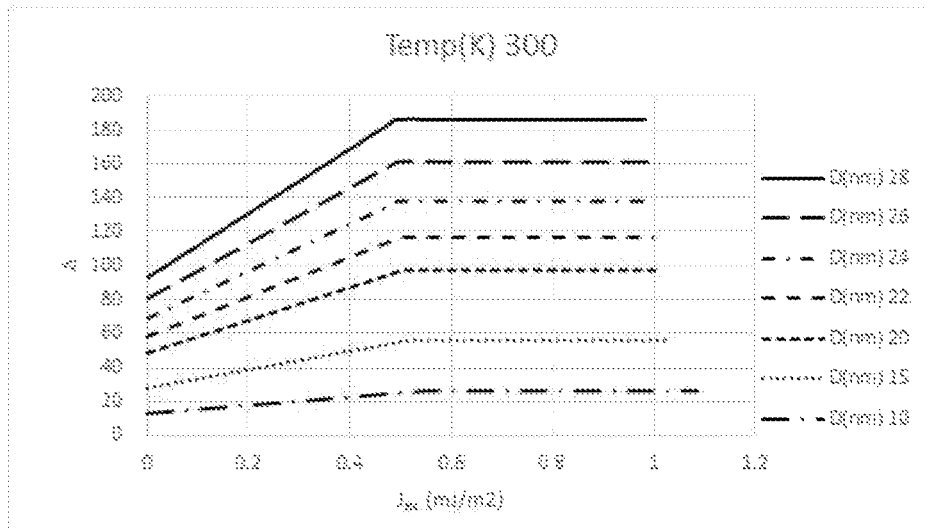
FIG. 45 shows the relationship between the magnetic coupling force $J_{ex}$ and the thermal stability factor Δ at 300 K for magnetoresistance effect elements with different diameters.
Figure 46:
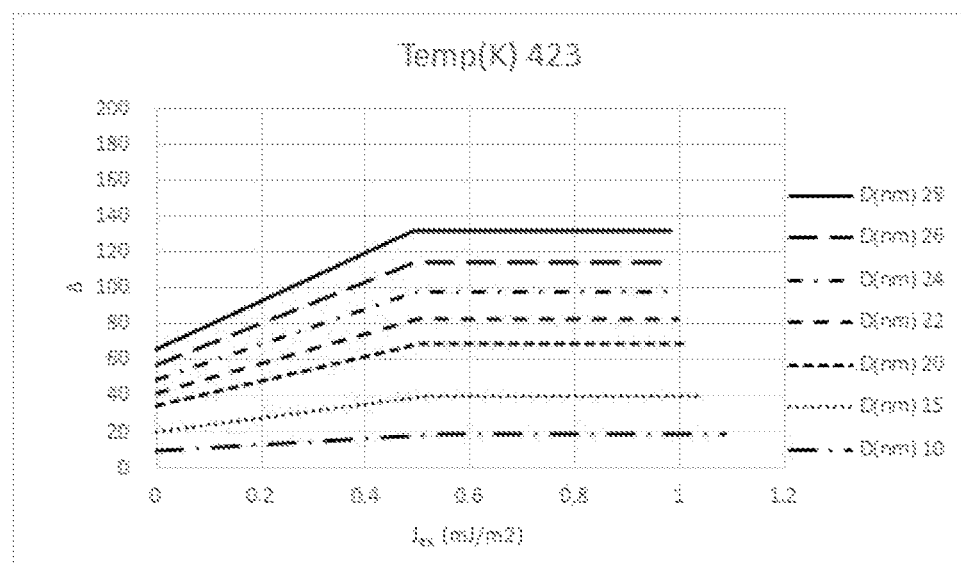
FIG. 46 shows the relationship between the magnetic coupling force $J_{ex}$ and the thermal stability factor Δ at 423 K of magnetoresistance effect elements having different diameters.

Next, FIG. 45 (in the case of 300 K) and FIG. 46 (in the case of 423 K) show the relationship between the magnetic coupling force $J_{ex}$ and the thermal stability factor $\Delta$ when the diameter of the magnetoresistance effect element is set to 10 nm to 28 nm.

It can be seen that the thermal stability factor $\Delta$ increases with the magnetic coupling force $J_{ex}$, regardless of the diameter of the magnetoresistance effect element, and around $J_{ex}=0.5$ mJ/m², where $\gamma=1$, reaches saturation at a value twice the thermal stability factor $\Delta_0$ achieved when $J_{ex}=0$. It can be seen that when the magnetic coupling force $J_{ex}$ is greater than 0 mJ/m² and less than around 0.5 mJ/m², the thermal stability factor $\Delta$ of the magnetoresistance effect element having two magnetic layers at the interface of the recording layer increases in the range of 1 to less than 2 times $\Delta_0$.

Embodiment 2

Figure 2:
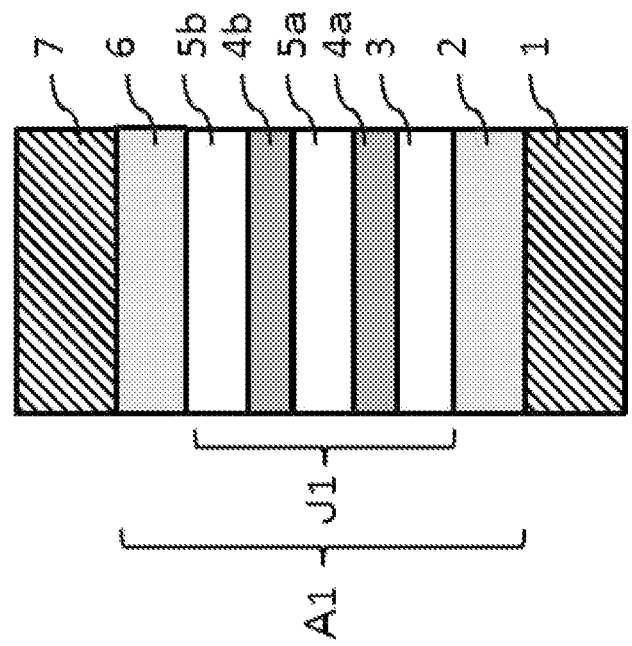
FIG. 2 is a longitudinal sectional view showing another example of the configuration of the magnetoresistance effect element of the present invention.

FIG. 2 shows an example of a magnetoresistance effect element of the present invention in which the recording layer has two magnetic layers adjacent to the interface of the non-magnetic layer, and a coupling layer constituted of a non-magnetic coupling layer/magnetic insertion layer/non-magnetic coupling layer/magnetic insertion layer/non-magnetic coupling layer is provided between the two magnetic layers.

In Embodiment 2, the first non-magnetic layer (1)/first magnetic layer (2)/first non-magnetic coupling layer (3)/first magnetic insertion layer (4a)/second non-magnetic coupling layer (5a)/second magnetic insertion layer (4b)/third non-magnetic coupling layer (5b)/second magnetic layer (6)/second non-magnetic layer (7) are stacked adjacent to each other in this order. By inserting the first magnetic insertion layer (4a) and the second magnetic insertion layer (4b), the first magnetic layer (2) and the second magnetic layer (6) are magnetically coupled. That is, the magnetic coupling force $J_{ex}$ acts between the two magnetic layers.

Details of Embodiment 2 are the same as those of Embodiment 1 except for the following description.

The first non-magnetic coupling layer (3), the second non-magnetic coupling layer (5a), and the third non-magnetic coupling layer (5b) include a non-magnetic element such as W, Ta, Hf, Zr, Nb, Mo, Ti, V, Cr, Si, Al, B, Pd, Pt, and the like. Since the non-magnetic coupling layer also has a role of absorbing B or the like in the magnetic layer adjacent to the interface, an element having a bcc (body-centered cubic lattice), a large atomic radius and a relatively large lattice spacing is preferable. Of these, bcc W, Ta, Hf, Zr, Nb, Mo, Ti, V, and the like are preferable, and W and Ta are more preferable.

The sum of the film thicknesses of the first non-magnetic coupling layer (3), the second non-magnetic coupling layer (5a), and the third non-magnetic coupling layer (5b) is such that B or the like in the magnetic layer adjacent to the interface is absorbed and a perpendicular magnetic anisotropy is generated, and is also adjusted to a range of small thickness such that the magnetic coupling force $J_{ex}$ acts between the two magnetic layers (2, 6). For example, the sum of the film thicknesses is preferably 0.2 nm or more and 1.3 nm or less, and is more preferably adjusted to the range of 0.4 nm or more and 1.3 nm or less.

Where the film thickness of any of the first non-magnetic coupling layer (3), the second non-magnetic coupling layer (5a), and the third non-magnetic coupling layer (5b) is less than 0.2 nm, since a layer with a film thickness of about the atomic size or smaller is produced, configurations with continuous layers and those with discontinuous layers are included. Even when the layers are discontinuous, it is possible to have a perpendicular magnetic anisotropy, provided that the lattice has a gap for absorbing B or the like of the magnetic layer.

From the viewpoint of further increasing the magnetic coupling force $J_{ex}$ between the two magnetic layers (2, 6) and increasing the thermal stability factor $\Delta$ of the recording layer of the magnetoresistance effect element, it is preferable that the film thickness of each of the first non-magnetic coupling layer (3), the second non-magnetic coupling layer (5a) and the third non-magnetic coupling layer (5b) does not exceed 0.3 nm.

The first magnetic insertion layer (4a) and the second magnetic insertion layer (4b) include at least any one of Co, Fe, and Ni. For example, Co, CoB, CoFeB, CoW, Ni, NiFe, NiFeB, Fe, CoFe, FeB and the like can be mentioned. From the viewpoint of further increasing the magnetic coupling force $J_{ex}$ between the two magnetic layers (2, 6), it is preferable to include at least Fe and B, and more preferably CoFeB, FeB and the like.

Further, the first magnetic insertion layer (4a) and the second magnetic insertion layer (4b) may further include a non-magnetic element such as W, Ta, Hf, Zr, Nb, Mo, Ti, V, Cr, Si, Al, B, Pd, Pt and the like.

The sum of the film thicknesses of the first magnetic insertion layer (4a) and the second magnetic insertion layer (4b) is preferably greater than 0 nm and equal to or less than 1.6 nm, more preferably 0.1 nm or more and 1.2 nm or less, and even more preferably 0.2 nm or more and 1.0 nm or less. It follows from FIG. 30 that when the first magnetic insertion layer (4a) and the second magnetic insertion layer (4b) are Co or Fe, less than 0.6 nm, at which the two magnetic layers have a perpendicular magnetic anisotropy, is more preferable. When the first magnetic insertion layer (4a) and the second magnetic insertion layer (4b) are FeB or CoFeB, 1.0 nm or less is more preferable, and 0.9 nm or less is even more preferable. When the first magnetic insertion layer (4a) and the second magnetic insertion layer (4b) are CoB, 1.0 nm or less is more preferable, and 0.8 nm or less is even more preferable. Further, it follows from FIG. 27 that since the magnetic coupling force $J_{ex}$ between the two magnetic layers only needs to be larger than zero, the lower limit value of the film thickness only needs to be larger than zero, but it is more preferable that the film thickness be adjusted to obtain the magnetic coupling force $J_{ex}=0.5$ mJ/m² at which the two magnetic layers are magnetic one body and undergo magnetization reversal and the thermal stability factor $\Delta$ is saturated.

From this viewpoint, when the first magnetic insertion layer (4a) and the second magnetic insertion layer (4b) are Co, 0.4 nm or more is more preferable, and when the two layers are CoFeB, 0.6 nm or more is more preferable. Further, it follows from FIGS. 30 and 27 that when the first magnetic insertion layer (4a) and the second magnetic insertion layer (4b) are CoW, a perpendicular magnetic anisotropy is obtained, the magnetic coupling force $J_{ex}$ is greater than zero, and the suitable range of the present invention is satisfied in the range of film thickness (0 nm to 2 nm) of the evaluation range of perpendicular magnetic anisotropy and in the range of film thickness (0 nm to 0.8 nm) of the evaluation range of magnetic coupling force $J_{ex}$. However, as shown in the magnetization curve of FIG. 26(b), in the case of CoW, the two magnetic layers are not magnetic one body to be reversed, and as follows from FIG.

27, the magnetic coupling force $J_{ex}$ is small and the effect of increasing the thermal stability factor Δ is smaller than that in the case of Co or CoFeB.

The saturation magnetization $M_s$ at the time of stacking the first magnetic insertion layer (4a) and the second magnetic insertion layer (4b) is preferably 0.4 T or more, and more preferably 1.0 T or more. The bulk saturation magnetization $M_s$ of a material which has not been stacked is preferably 0.7 T or more, and more preferably 0.9 T or more. The decrease in the value of saturation magnetization $M_s$ at the time of stacking with respect to that in the bulk state is due to the influence of adjacent layers. It follows from FIG. 34 and Table 3 that the saturation magnetization $M_s$ of the first magnetic insertion layer (4a) and the second magnetic insertion layer (4b) is one of the factors that increase the magnetic coupling force $J_{ex}$.

In the recording layer (A1) of the magnetoresistance effect element of Embodiment 2, the first magnetic layer (2) and the second magnetic layer (6) are magnetically coupled by the first coupling layer (J1) constituted of the first non-magnetic coupling layer (3), the first magnetic insertion layer (4a), the second non-magnetic coupling layer (5a), the second magnetic insertion layer (4b), and the third non-magnetic coupling layer (5b).

The magnetic coupling force is expressed by the magnetic coupling force $J_{ex}$ (mJ/m²) per unit area, and where the magnetic coupling force $J_{ex}$ between the first magnetic layer (2) and the second magnetic layer (6) exceeds 0 and is, for example, 0.1 mJ/m² or more, magnetic coupling is enabled and the thermal stability factor Δ can be increased. The magnetic coupling force is preferably 0.3 mJ/m² or more, and more preferably 0.5 mJ/m² or more because the thermal stability factor Δ of the entire recording layer can be maximized. As follows from FIGS. 45 and 46, $J_{ex} \approx K_{eff} t \approx 0.5$ mJ/m² are set in order to maximize the thermal stability factor Δ (in the case of two magnetic layers, two-fold thermal stability factor $\Delta_0$).

In order to increase the magnetic coupling force $J_{ex}$ so as to increase the thermal stability factor Δ of the entire recording layer, an even higher magnetic coupling force $J_{ex}$ can be obtained by using a configuration with increased saturation magnetization $M_s$ of the first magnetic insertion layer (4a) and the second magnetic insertion layer (4b), performing annealing treatment, or the like, in addition to adjusting, as described above, the element type (material) and film thickness of each layer.

In Embodiment 2 shown in FIG. 2, where a reference layer is adjacent to the first non-magnetic layer (1) on the side opposite to the first magnetic layer (2), the first non-magnetic layer (1) becomes the barrier layer of the basic structure of the magnetoresistance effect element, and where another reference layer is adjacent to the second non-magnetic layer (7) on the side opposite to the second magnetic layer (6), the second non-magnetic layer (7) becomes the barrier layer. The first magnetic layer (2)/first non-magnetic coupling layer (3)/first magnetic insertion layer (4a)/second non-magnetic coupling layer (5a)/second magnetic insertion layer (4b)/third non-magnetic coupling layer (5b)/second magnetic layer (6) constitute the recording layer.

Embodiment 3

Figure 3:
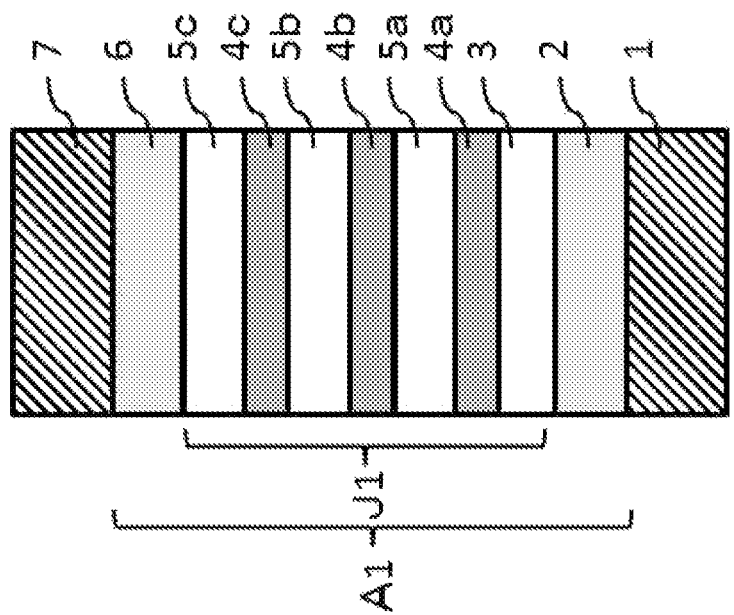
FIG. 3 is a longitudinal sectional view showing another example of the configuration of the magnetoresistance effect element of the present invention.

FIG. 3 shows an example of a magnetoresistance effect element of the present invention in which the recording layer has two magnetic layers adjacent to the interface of the non-magnetic layer, and a coupling layer constituted of non-magnetic coupling layer/magnetic insertion layer/non-magnetic coupling layer/magnetic insertion layer/non-magnetic coupling layer/magnetic insertion layer/non-magnetic coupling layer is provided between the two magnetic layers.

In Embodiment 3, the first non-magnetic layer (1)/first magnetic layer (2)/first non-magnetic coupling layer (3)/first magnetic insertion layer (4a)/second non-magnetic coupling layer (5a)/second magnetic insertion layer (4b)/third non-magnetic coupling layer (5b)/third magnetic insertion layer (4c)/fourth non-magnetic coupling layer (5c)/second magnetic layer (6)/second non-magnetic layer (7) are stacked adjacent to each other in this order. By inserting the first magnetic insertion layer (4a), the second magnetic insertion layer (4b), and the third magnetic insertion layer (4c), the first magnetic layer (2) and the second magnetic layer (6) are magnetically coupled. That is, the magnetic coupling force $J_{ex}$ acts between the two magnetic layers.

Details of Embodiment 3 are the same as those of Embodiment 1 except for the following description.

The first non-magnetic coupling layer (3), the second non-magnetic coupling layer (5a), the third non-magnetic coupling layer (5b), and the fourth non-magnetic coupling layer (5c) include a non-magnetic element such as W, Ta, Hf, Zr, Nb, Mo, Ti, V, Cr, Si, Al, B, Pd, Pt, and the like. Since the non-magnetic coupling layer also has a role of absorbing B or the like in the magnetic layer adjacent to the interface, an element having a bcc (body-centered cubic lattice), a large atomic radius and a relatively large lattice spacing is preferable. Of these, bcc W, Ta, Hf, Zr, Nb, Mo, Ti, V, and the like are preferable, and W and Ta are more preferable.

The sum of the film thicknesses of the first non-magnetic coupling layer (3), the second non-magnetic coupling layer (5a), the third non-magnetic coupling layer (5b), and the fourth non-magnetic coupling layer (5c) is such that B or the like in the magnetic layer adjacent to the interface is absorbed and a perpendicular magnetic anisotropy is generated, and is also adjusted to a range of small thickness such that the magnetic coupling force $J_{ex}$ acts between the two magnetic layers (2, 6). For example, the sum of the film thicknesses is preferably 0.2 nm or more and 1.3 nm or less, and is more preferably adjusted to the range of 0.4 nm or more and 1.2 nm or less.

Where the film thickness of any of the first non-magnetic coupling layer (3), the second non-magnetic coupling layer (5a), the third non-magnetic coupling layer (5b), and the fourth non-magnetic coupling layer (5c) is less than 0.2 nm, since a layer with a film thickness of about the atomic size or smaller is produced, configurations with continuous layers and those with discontinuous layers are included. Even when the layers are discontinuous, it is possible to have a perpendicular magnetic anisotropy, provided that the lattice has a gap for absorbing B or the like of the magnetic layer.

From the viewpoint of increasing the magnetic coupling force $J_{ex}$ between the two magnetic layers (2, 6) and increasing the thermal stability factor Δ of the recording layer of the magnetoresistance effect element, it is preferable that the film thickness of each of the first non-magnetic coupling layer (3), the second non-magnetic coupling layer (5a), the third non-magnetic coupling layer (5b), and the fourth non-magnetic coupling layer (5c) does not exceed 0.3 nm.

The first magnetic insertion layer (4a), the second magnetic insertion layer (4b), and the third magnetic insertion layer (4c) include at least any one of Co, Fe, and Ni. For example, Co, CoB, CoFeB, CoW, Ni, NiFe, NiFeB, Fe, CoFe, FeB and the like can be mentioned. From the viewpoint of further increasing the magnetic coupling force $J_{ex}$ between the two magnetic layers (2, 6), it is preferable to include at least Fe and B, and more preferably CoFeB, FeB and the like.

Further, the first magnetic insertion layer (4a), the second magnetic insertion layer (4b), and the third magnetic insertion layer (4c) may further include a non-magnetic element such as W, Ta, Hf, Zr, Nb, Mo, Ti, V, Cr, Si, Al, B, Pd, Pt and the like.

The sum of the film thicknesses of the first magnetic insertion layer (4a), the second magnetic insertion layer (4b), and the third magnetic insertion layer (4c) is preferably greater than 0 nm and equal to or less than 1.6 nm, more preferably 0.1 nm or more and 1.2 nm or less, and even more preferably 0.2 nm or more and 1.0 nm or less. It follows from FIG. 30 that when the first magnetic insertion layer (4a), the second magnetic insertion layer (4b), and the third magnetic insertion layer (4c) are Co or Fe, less than 0.6 nm, at which the two magnetic layers have a perpendicular magnetic anisotropy, is more preferable. When the first magnetic insertion layer (4a), the second magnetic insertion layer (4b), and the third magnetic insertion layer (4c) are FeB or CoFeB, 1.0 nm or less is more preferable, and 0.9 nm or less is even more preferable. When the first magnetic insertion layer (4a), the second magnetic insertion layer (4b), and the third magnetic insertion layer (4c) are CoB, 1.0 nm or less is more preferable, and 0.8 nm or less is even more preferable. Further, it follows from FIG. 27 that since the magnetic coupling force $J_{ex}$ between the two magnetic layers only needs to be larger than zero, the lower limit value of the film thickness only needs to be larger than zero, but it is more preferable that the film thickness be adjusted to obtain the magnetic coupling force $J_{ex}=0.5$ mJ/m$^2$ at which the two magnetic layers are magnetic one body and undergo magnetization reversal and the thermal stability factor $\Delta$ is saturated. From this viewpoint, when the first magnetic insertion layer (4a), the second magnetic insertion layer (4b), and the third magnetic insertion layer (4c) are Co, 0.4 nm or more is more preferable, and when the two layers are CoFeB, 0.6 nm or more is more preferable. Further, it follows from FIGS. 30 and 27 that when the first magnetic insertion layer (4a), the second magnetic insertion layer (4b), and the third magnetic insertion layer (4c) are CoW, a perpendicular magnetic anisotropy is obtained, the magnetic coupling force $J_{ex}$ is greater than zero and the suitable range of the present invention is satisfied in the range of film thickness (0 nm to 2 nm) of the evaluation range of perpendicular magnetic anisotropy and in the range of film thickness (0 nm to 0.8 nm) of the evaluation range of magnetic coupling force $J_{ex}$. However, as shown in the magnetization curve of FIG. 26(b), in the case of CoW, the two magnetic layers are not magnetic one body to be reversed, and as follows from FIG. 27, the magnetic coupling force $J_{ex}$ is small and the effect of increasing the thermal stability factor $\Delta$ is smaller than that in the case of Co or CoFeB.

The saturation magnetization $M_s$ at the time of stacking the first magnetic insertion layer (4a), the second magnetic insertion layer (4b), and the third magnetic insertion layer (4c) is preferably 0.4 T or more, and more preferably 1.0 T or more. The bulk saturation magnetization $M_s$ of a material which has not been stacked is preferably 0.7 T or more, and more preferably 0.9 T or more. The decrease in the value of saturation magnetization $M_s$ at the time of stacking with respect to that in the bulk state is due to the influence of adjacent layers. It follows from FIG. 34 and Table 3 that the saturation magnetization $M_s$ of the first magnetic insertion layer (4a), the second magnetic insertion layer (4b), and the third magnetic insertion layer (4c) is one of the factors that increase the magnetic coupling force $J_{ex}$.

In the recording layer (A1) of the magnetoresistance effect element of Embodiment 3, the first magnetic layer (2) and the second magnetic layer (6) are magnetically coupled by the first coupling layer (J1) constituted of the first non-magnetic coupling layer (3), the first magnetic insertion layer (4a), the second non-magnetic coupling layer (5a), the second magnetic insertion layer (4b), the third non-magnetic coupling layer (5b), the third magnetic insertion layer (4c), and the fourth non-magnetic coupling layer (5c).

The magnetic coupling force is expressed by the magnetic coupling force $J_{ex}$ (mJ/m$^2$) per unit area, and where the magnetic coupling force $J_{ex}$ between the first magnetic layer (2) and the second magnetic layer (6) exceeds 0 and is, for example, 0.1 mJ/m$^2$ or more, magnetic coupling is enabled and the thermal stability factor $\Delta$ can be increased. The magnetic coupling force is preferably 0.3 mJ/m$^2$ or more, and more preferably 0.5 mJ/m$^2$ or more because the thermal stability factor $\Delta$ of the entire recording layer can be maximized. As follows from FIGS. 45 and 46, $J_{ex} \approx K_{eff} t \approx 0.5$ mJ/m$^2$ are set in order to maximize the thermal stability factor $\Delta$ (in the case of two magnetic layers, two-fold thermal stability factor $\Delta_0$).

In order to increase the magnetic coupling force $J_{ex}$ so as to increase the thermal stability factor $\Delta$ of the entire recording layer, an even higher magnetic coupling force $J_{ex}$ can be obtained by using a configuration with increased saturation magnetization $M_s$ of the first magnetic insertion layer (4a), the second magnetic insertion layer (4b), or the third magnetic insertion layer (4c), performing annealing treatment, or the like, in addition to adjusting, as described above, the element type (material) and film thickness of each layer.

In Embodiment 3 shown in FIG. 3, where a reference layer is adjacent to the first non-magnetic layer (1) on the side opposite to the first magnetic layer (2), the first non-magnetic layer (1) becomes the barrier layer of the basic structure of the magnetoresistance effect element, and where another reference layer is adjacent to the second non-magnetic layer (7) on the side opposite to the second magnetic layer (6), the second non-magnetic layer (7) becomes the barrier layer. The first magnetic layer (2)/first non-magnetic coupling layer (3)/first magnetic insertion layer (4a)/second non-magnetic coupling layer (5a)/second magnetic insertion layer (4b)/third non-magnetic coupling layer (5b)/third magnetic insertion layer (4c)/fourth non-magnetic coupling layer (5c)/second magnetic layer (6) constitute the recording layer.

Embodiment 4

Figure 4:
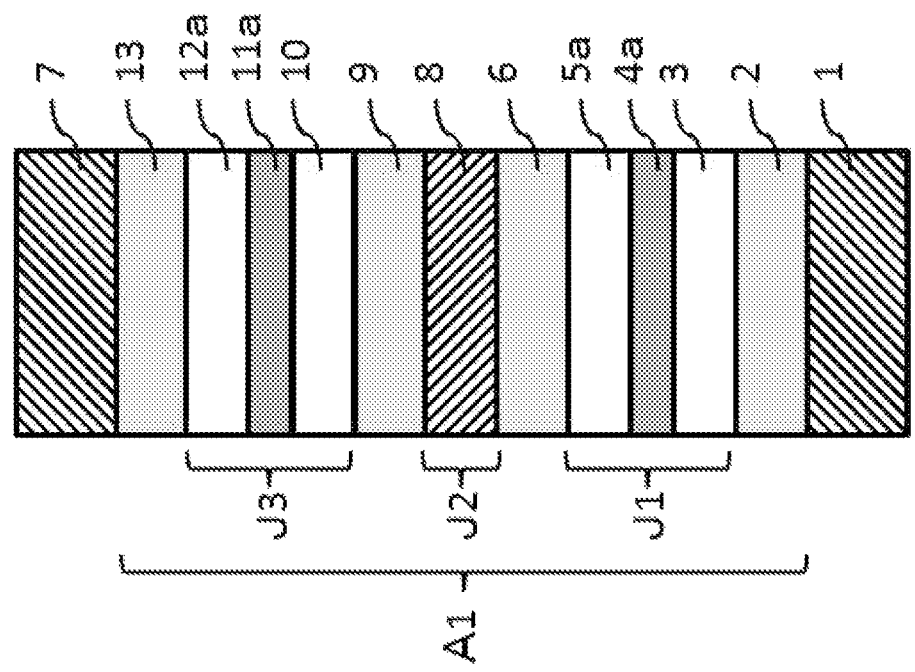
FIG. 4 is a longitudinal sectional view showing another example of the configuration of the magnetoresistance effect element of the present invention.

FIG. 4 shows an example of a magnetoresistance effect element of the present invention in which the recording layer has four magnetic layers, and a total of three coupling layers are provided between the four magnetic layers.

In Embodiment 4, the first non-magnetic layer (1)/first magnetic layer (2)/first coupling layer (J1)/second magnetic layer (6)/second coupling layer (J2)/third magnetic layer (9)/third coupling layer (J3)/fourth magnetic layer (13)/second non-magnetic layer (7) are stacked adjacent to each other in this order.

The first coupling layer (J1) is configured by stacking the first non-magnetic coupling layer (3)/first magnetic insertion layer (4a)/second non-magnetic coupling layer (5a) adjacent to each other in this order, the second coupling layer (J2) is constituted of the third non-magnetic layer (8), and the third coupling layer (J3) is configured by stacking the fifth non-magnetic coupling layer (10)/fourth magnetic insertion layer (11a)/sixth non-magnetic coupling layer (12a) adjacent to each other in this order. By inserting the first magnetic insertion layer (4a), the fourth magnetic insertion layer (11a), and the third non-magnetic layer (8), the four magnetic layers are magnetically coupled.

Details of Embodiment 4 are the same as those of Embodiment 1 except for the following description.

A layer including O (oxygen) is used as the first non-magnetic layer (1) and the second non-magnetic layer (7). Where the first non-magnetic layer (1) or the second non-magnetic layer (7) becomes a barrier layer (tunnel junction layer constituted of an insulating layer) of the magnetoresistance effect element, an insulator including oxygen such as MgO, $Al_2O_3$, $SiO_2$, TiO, $Hf_2O$, or the like is used, and MgO is preferably used, so that a large rate of change in magnetoresistance is exhibited by a combination of materials of two end surfaces to be joined.

The film thickness of the first non-magnetic layer (1) and the second non-magnetic layer (7) is preferably in the range of 0.2 nm to 2.0 nm, and is more preferably adjusted to the range of 0.7 nm to 1.0 nm.

The first magnetic layer (2), the second magnetic layer (6), the third magnetic layer (9), and the fourth magnetic layer (13) include at least either Co or Fe. For example, Co, CoFe, CoB, Fe, FeB, CoFeB, and the like, and FeB and CoFeB including B are more preferable. The composition can be exemplified by $(Co_{25}Fe_{75})_{75}B_{25}$, but is not limited thereto as long as the first magnetic layer (2) and the second magnetic layer (6), the second magnetic layer (6) and the third magnetic layer (9), and the third magnetic layer (9) and the fourth magnetic layer (13) are magnetically coupled by the magnetic coupling force $J_{ex}$.

The first magnetic layer (2), the second magnetic layer (6), the third magnetic layer (9), and the fourth magnetic layer (13) may further include a 3d ferromagnetic transition metal such as Ni in addition to Co and Fe as magnetic elements.

The first magnetic layer (2), the second magnetic layer (6), the third magnetic layer (9), and the fourth magnetic layer (13) may further include a non-magnetic element such as W, Ta, Hf, Zr, Nb, Mo, Ti, V, Cr, Si, Al, B, Pd, Pt, and the like. Among these, B and V are preferable from the viewpoint of ease of handling. These non-magnetic elements can lower the saturation magnetization ($M_s$) of the magnetic layer.

The film thickness of each of the first magnetic layer (2), the second magnetic layer (6), the third magnetic layer (9), and the fourth magnetic layer (13) is preferably in the range of 0.7 nm to 2.0 nm. This is so because where the thickness is less than 0.7 nm, the magnetization is greatly reduced, and the effective magnetic anisotropy constant $K_{eff}t$ is also reduced, whereas when the thickness is more than 2.0 nm, an in-plane magnetic anisotropy occurs, as follows from Equation 2, when MgO or the like is used for the first non-magnetic layer (1) and the second non-magnetic layer (7).

The first non-magnetic coupling layer (3), the second non-magnetic coupling layer (5a), the fifth non-magnetic coupling layer (10), and the sixth non-magnetic coupling layer (12a) include a non-magnetic element such as W, Ta, Hf, Zr, Nb, Mo, Ti, V, Cr, Si, Al, B, Pd, Pt, and the like. Since the non-magnetic coupling layer also has a role of absorbing B or the like in the magnetic layer adjacent to the interface, an element having a bcc (body-centered cubic lattice), a large atomic radius and a relatively large lattice spacing is preferable. Of these, bcc W, Ta, Hf, Zr, Nb, Mo, Ti, V, and the like are preferable, and W and Ta are more preferable.

The sum of the film thicknesses of the first non-magnetic coupling layer (3) and the second non-magnetic coupling layer (5a) is such that B or the like in the magnetic layer adjacent to the interface is absorbed and a perpendicular magnetic anisotropy is generated, and is also adjusted to a range of small thickness such that the magnetic coupling force $J_{ex}$ acts between the two magnetic layers (2, 6). For example, the sum of the film thicknesses is 0.2 nm or more and 1.3 nm or less, and is more preferably adjusted to the range of 0.4 nm or more and 1.0 nm or less, or 0.4 nm or more and 0.8 nm or less. The sum of the film thicknesses of the fifth non-magnetic coupling layer (10) and the sixth non-magnetic coupling layer (12a) is likewise 0.2 nm or more and 1.3 nm or less, and is more preferably adjusted to the range of 0.4 nm or more and 1.0 nm or less, or 0.4 nm or more and 0.8 nm or less.

Where the film thickness of any of the first non-magnetic coupling layer (3), the second non-magnetic coupling layer (5a), the fifth non-magnetic coupling layer (10), and the sixth non-magnetic coupling layer (12a) is less than 0.2 nm, since a layer with a film thickness of about the atomic size or smaller is produced, configurations with continuous layers and those with discontinuous layers are included. Even when the layers are discontinuous, it is possible to have a perpendicular magnetic anisotropy, provided that the lattice has a gap for absorbing B or the like of the magnetic layer.

From the viewpoint of increasing the magnetic coupling force $J_{ex}$ between the two magnetic layers (between 2 and 6, between 9 and 13) and increasing the thermal stability factor Δ of the recording layer of the magnetoresistance effect element, it is preferable that the film thickness of each of the first non-magnetic coupling layer (3), the second non-magnetic coupling layer (5a), the fifth non-magnetic coupling layer (10), and the sixth non-magnetic coupling layer (12a) does not exceed 0.3 nm.

The first magnetic insertion layer (4a) and the fourth magnetic insertion layer (11a) include at least any one of Co, Fe, and Ni. For example, Co, CoB, CoFeB, CoW, Ni, NiFe, NiFeB, Fe, CoFe, FeB and the like can be mentioned.

From the viewpoint of further increasing the magnetic coupling force $J_{ex}$ between the two magnetic layers (2, 6), it is preferable to include at least Fe and B, and more preferably CoFeB, FeB and the like.

Further, the first magnetic insertion layer (4a) and the fourth magnetic insertion layer (11a) may further include a non-magnetic element such as W, Ta, Hf, Zr, Nb, Mo, Ti, V, Cr, Si, Al, B, Pd, Pt and the like.

The sum of the film thicknesses of the first magnetic insertion layer (4a) and the fourth magnetic insertion layer (11a) is preferably greater than 0 nm and equal to or less than 1.6 nm, more preferably 0.1 nm or more and 1.2 nm or less, and even more preferably 0.2 nm or more and 1.0 nm or less. It follows from FIG. 30 that when the first magnetic insertion layer (4a) and the fourth magnetic insertion layer (11a) are Co or Fe, less than 0.6 nm, at which the two magnetic layers have a perpendicular magnetic anisotropy, is more preferable. When the first magnetic insertion layer (4a) and the fourth magnetic insertion layer (11a) are FeB or CoFeB, 1.0 nm or less is more preferable, and 0.9 nm or less is even more preferable. When the first magnetic insertion layer (4a) and the fourth magnetic insertion layer (11a) are CoB, 1.0 nm or less is more preferable, and 0.8 nm or less is even more preferable. Further, it follows from FIG. 27 that since the magnetic coupling force $J_{ex}$ between the two magnetic layers only needs to be larger than zero, the lower limit value of the film thickness only needs to be larger than zero, but it is more preferable that the film thickness be adjusted to obtain the magnetic coupling force $J_{ex}=0.5$ mJ/m² at which the two magnetic layers are magnetic one body and undergo magnetization reversal and the thermal stability factor Δ is saturated. From this viewpoint, when the first magnetic insertion layer (4a) and the fourth magnetic insertion layer (11a) are Co, 0.4 nm or more is more preferable, and when the two layers are CoFeB, 0.6 nm or more is more preferable. Further, it follows from FIGS. 30 and 27 that when the first magnetic insertion layer (4a) and the fourth magnetic insertion layer (11a) are CoW, a perpendicular magnetic anisotropy is obtained, the magnetic coupling force $J_{ex}$ is greater than zero and the suitable range of the present invention is satisfied in the range of film thickness (0 nm to 2 nm) of the evaluation range of perpendicular magnetic anisotropy and in the range of film thickness (0 nm to 0.8 nm) of the evaluation range of magnetic coupling force $J_{ex}$. However, as shown in the magnetization curve of FIG. 26(b), in the case of CoW, the two magnetic layers are not magnetic one body to be reversed, and as follows from FIG. 27, the magnetic coupling force $J_{ex}$ is small and the effect of increasing the thermal stability factor Δ is smaller than that in the case of Co or CoFeB.

The saturation magnetization $M_s$ at the time of stacking the first magnetic insertion layer (4a) and the fourth magnetic insertion layer (11a) is preferably 0.4 T or more, and more preferably 1.0 T or more. The bulk saturation magnetization $M_s$ of a material which has not been stacked is preferably 0.7 T or more, and more preferably 0.9 T or more. It follows from FIG. 34 and Table 2 that the saturation magnetization $M_s$ of the first magnetic insertion layer (4a) and the fourth magnetic insertion layer (11a) is one of the factors that increase the magnetic coupling force $J_{ex}$.

The third non-magnetic layer (8) constituting the second coupling layer (J2) includes an oxide of a non-magnetic element. For example, a compound including oxygen, such as MgO, $Al_2O_3$, $SiO_2$, TiO, $Hf_2O$, is used, and MgO is preferably used.

The film thickness of the third non-magnetic layer (8) is desirably 0.75 nm or more and 0.9 nm or less, and more preferably 0.75 nm or more and 0.85 nm or less. This is because the evaluation test described hereinbelow and Table 4 indicate that where the film thickness is less than 0.75 nm, the third magnetic layer (9) and the fourth magnetic layer (13) exhibit in-plane magnetic anisotropy, and FIG. 49 described hereinbelow indicates that where the film thickness is greater than 0.9 nm, the magnetic coupling force $J_{ex}$ decreases and becomes negative.

The third non-magnetic layer (8) constituting the second coupling layer (J2) may include any material and have any thickness provided that the four magnetic layers are magnetically coupled and the magnetic coupling force $J_{ex}$ is greater than zero, and the preferable film thickness in the evaluation system is only an example.

The magnetization direction of the first magnetic layer (2) is oriented in a direction perpendicular to the film surface by interfacial perpendicular magnetic anisotropy at the interface with the first non-magnetic layer (1). Further, the magnetization direction of the fourth magnetic layer (13) is oriented in a direction perpendicular to the film surface by interfacial perpendicular magnetic anisotropy at the interface with the second non-magnetic layer (7).

Furthermore, the second magnetic layer (6) and the third magnetic layer (9) are each oriented in a direction perpendicular to the film surface by perpendicular magnetic anisotropy at the interface with the third non-magnetic layer (8).

In the magnetoresistance effect element of Embodiment 4, portions having interfacial perpendicular magnetic anisotropy are four surfaces, and as represented by the Equation 2, the interfacial magnetic anisotropy energy density $K_i$ can be expected to contribute to the effective magnetic anisotropy constant $K_{eff}t$ per unit area at four magnetic layers at maximum.

In the recording layer (A1) of the magnetoresistance effect element of Embodiment 4, the four magnetic layers are magnetically coupled to each other.

The magnetic coupling force is expressed by the magnetic coupling force $J_{ex}$ (mJ/m²) per unit area, and where the magnetic coupling force $J_{ex}$ between the magnetic layers exceeds 0 and is, for example, 0.1 mJ/m² or more, magnetic coupling is enabled and the thermal stability factor Δ can be increased. The magnetic coupling force is preferably 0.3 mJ/m² or more, and more preferably 0.5 mJ/m² or more because the thermal stability factor Δ of the entire recording layer can be maximized. As follows from FIGS. 45 and 46, $J_{ex} \approx K_{eff}t \approx 0.5$ mJ/m² are set in order to maximize the thermal stability factor Δ (in the case of two magnetic layers, two-fold thermal stability factor $Δ_0$).

In order to increase the magnetic coupling force $J_{ex}$ so as to increase the thermal stability factor Δ of the entire recording layer, an even higher magnetic coupling force $J_{ex}$ can be obtained by using a configuration with increased saturation magnetization $M_s$ of the first magnetic insertion layer (4a) or the fourth magnetic insertion layer (11a), performing annealing treatment, or the like, in addition to adjusting, as described above, the element type (material) and film thickness of each layer.

In Embodiment 4 shown in FIG. 4, where a reference layer is adjacent to the first non-magnetic layer (1) on the side opposite to the first magnetic layer (2), the first non-magnetic layer (1) becomes the barrier layer of the basic structure of the magnetoresistance effect element, and where another reference layer is adjacent to the second non-magnetic layer (7) on the side opposite to the fourth magnetic layer (13), the second non-magnetic layer (7) becomes the barrier layer.

The first magnetic layer (2)/first coupling layer (J1)/second magnetic layer (6)/second coupling layer (J2)/third magnetic layer (9)/third coupling layer (J3)/fourth magnetic layer (13) constitute the recording layer.

<Investigation of Film Thickness of Second Coupling Layer, Perpendicular Magnetic Anisotropy and Magnetic Coupling Force $J_{ex}$>

The film thickness of the third non-magnetic layer (8) serving as the second coupling layer (J2) and the magnetization characteristics were evaluated in the recording layer of a magnetoresistance effect element, such as shown in FIG. 4, in which the four magnetic layers (2, 6, 9, 13) were coupled by the first coupling layer (J1), the second coupling layer (J2), and the third coupling layer (J3).

Figure 47:
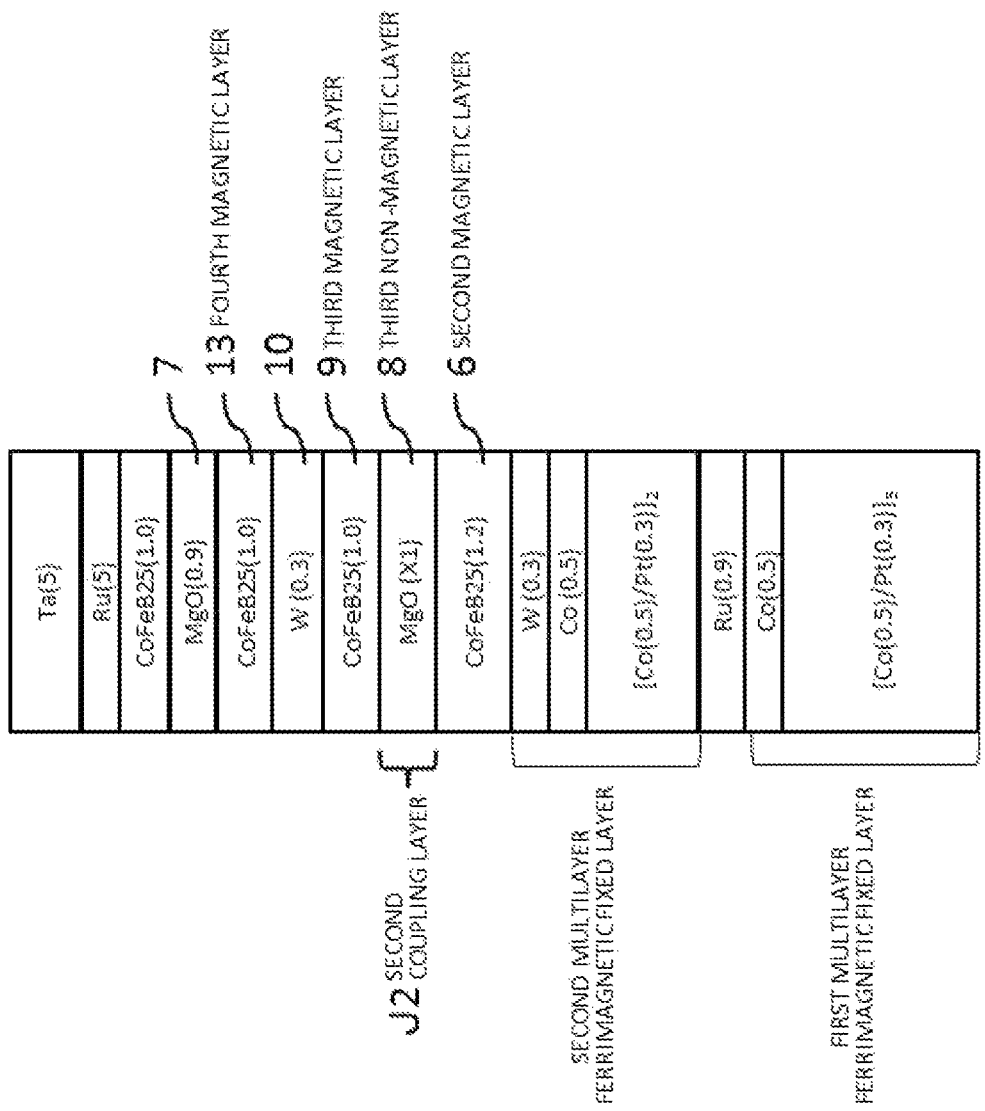
FIG. 47 shows a configuration diagram of a magnetoresistance effect element for evaluation of a magnetization curve as a function of the film thickness t of the third non-magnetic layer (8) constituting the second coupling layer (J2) and the relationship between the film thickness t of the third non-magnetic layer (8) and the magnetic coupling force $J_{ex}$.

FIG. 47 shows a configuration diagram of a magnetoresistance effect element for evaluation of dependency on the film thickness of the second coupling layer.

Specifically, the magnetoresistance effect element for evaluation has the following configuration: [Co (0.5 nm)/Pt (0.3 nm)]$_5$/Co (0.5 nm)/Ru (0.9 nm)/[Co (0.5 nm)/Pt (0.3 nm)]$_2$/Co (0.5 nm)/W (0.3 nm)/CoFeB$_{25}$ (second magnetic layer, 1.2 nm)/MgO (third non-magnetic layer, 0.7 nm to 1.0 nm)/CoFeB$_{25}$ (third magnetic layer, 1.0 nm)/W (0.3 nm)/CoFeB$_{25}$ (fourth magnetic layer, 1.0 nm)/MgO (0.9 nm)/CoFeB$_{25}$ (1.0 nm)/Ru (5 nm)/Ta (5 nm), and was subjected to annealing treatment at 400° C. for 1 h. In order to evaluate the magnetic reversal of the third magnetic layer (9) and the fourth magnetic layer (13), the second magnetic layer (6) is formed on the fixed layer.

Figure 48:
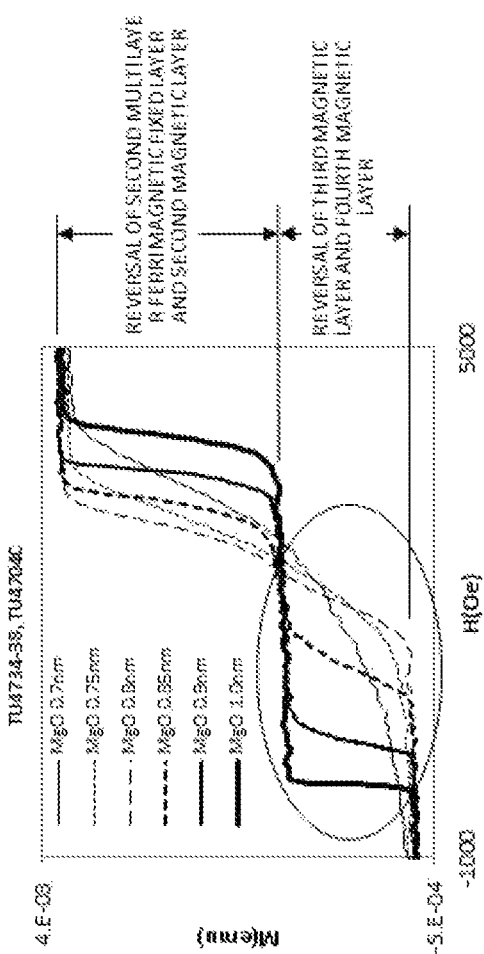
FIG. 48 shows the magnetization curve at the time of sweeping from positive to negative when the film thickness t of the third non-magnetic layer (8) constituting the second coupling layer (J2) is 0.7 nm to 1.0 nm.

FIG. 48 shows a magnetization curve for each film thickness of the third non-magnetic layer (8) MgO. The magnetization reversal portion of the third magnetic layer (9) and the fourth magnetic layer (13) is circled.

It was found from FIG. 48 that the third magnetic layer (9) and the fourth magnetic layer (13) in the present evaluation system were magnetically coupled, and were also magnetic one body and underwent magnetization reversal.

Figure 49:
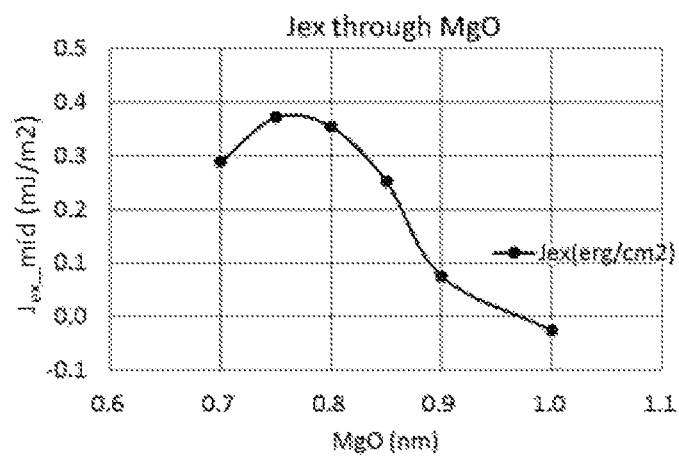
FIG. 49 shows the relationship between the film thickness t of the third non-magnetic layer (8) constituting the second coupling layer (J2) and the magnetic coupling force $J_{ex}$.

The magnetic coupling force $J_{ex}$ was obtained from the magnetization reversal magnetic field and the magnetic moment and is shown in FIG. 49.

It was found from FIG. 49 that the magnetic coupling force $J_{ex}$ becomes a maximum in the vicinity of 0.70 nm to 0.85 nm.

From FIG. 48, the magnetic anisotropy corresponding to the film thickness of the third non-magnetic layer (8) MgO is shown in Table 5. Here, I represents in-plane magnetic anisotropy, and P represents perpendicular magnetic anisotropy.

TABLE 5

|  | MgO (nm) | | | | | |
|---|---|---|---|---|---|---|
|  | 0.7 | 0.75 | 0.8 | 0.85 | 0.9 | 1 |
| Third magnetic layer + fourth magnetic layer | I | P | P | P | P | P |
| Second magnetic layer | I | P | P | P | P | P |

It follows from Table 5 that in order for the third magnetic layer (9) and the fourth magnetic layer (13) to have a perpendicular magnetic anisotropy, the film thickness of the third non-magnetic layer (8) MgO is desirably 0.75 nm or more.

From the above results on the magnetic anisotropy and the maximum value of the magnetic coupling force $J_{ex}$, it was found that in the present evaluation system, where the film thickness of the third non-magnetic layer (8) MgO is preferably in the range of 0.75 nm to 0.85 nm, the magnetic coupling force $J_{ex}$ can be maximized, and a recording layer of a perpendicular magnetic anisotropy magnetoresistance effect element having a higher thermal stability factor Δ can be obtained.

Embodiment 5

Figure 5:
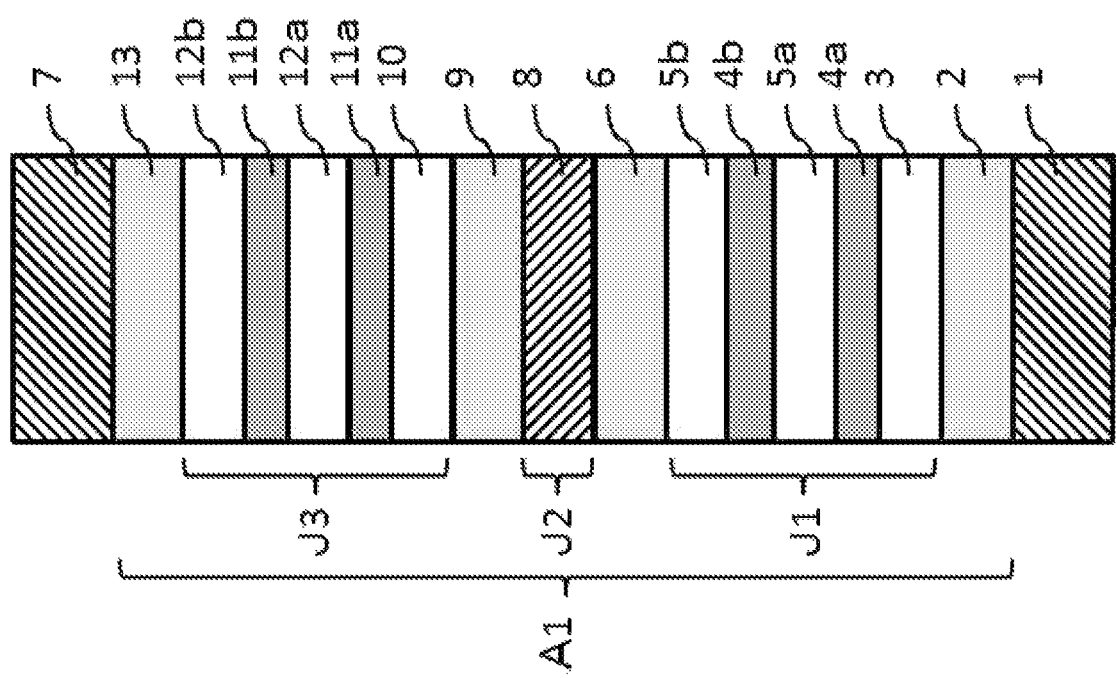
FIG. 5 is a longitudinal sectional view showing another example of the configuration of the magnetoresistance effect element of the present invention.

FIG. 5 shows an example of a magnetoresistance effect element of the present invention in which the recording layer has four magnetic layers, a total of three coupling layers are provided between the four magnetic layers, and a coupling layer constituted of non-magnetic coupling layer/magnetic insertion layer/non-magnetic coupling layer/magnetic insertion layer/non-magnetic coupling layer is provided.

In Embodiment 5, the first non-magnetic layer (1)/first magnetic layer (2)/first coupling layer (J1)/second magnetic layer (6)/second coupling layer (J2)/third magnetic layer (9)/third coupling layer (J3)/fourth magnetic layer (13)/second non-magnetic layer (7) are stacked adjacent to each other in this order.

The first coupling layer (J1) is configured by stacking the first non-magnetic coupling layer (3)/first magnetic insertion layer (4a)/second non-magnetic coupling layer (5a)/second magnetic insertion layer (4b)/third non-magnetic coupling layer (5b) adjacent to each other in this order, the second coupling layer (J2) is constituted of the third non-magnetic layer (8), and the third coupling layer (J3) is configured by stacking the fifth non-magnetic coupling layer (10)/fourth magnetic insertion layer (11a)/sixth non-magnetic coupling layer (12a)/fifth magnetic insertion layer (11b)/seventh non-magnetic coupling layer (12b) adjacent to each other in this order. By inserting the four magnetic insertion layers (4a) and the third non-magnetic layer (8), the four magnetic layers are magnetically coupled.

Details of Embodiment 5 are the same as those of Embodiment 4 except for the following description.

The first non-magnetic coupling layer (3), the second non-magnetic coupling layer (5a), the third non-magnetic coupling layer (5b), the fifth non-magnetic coupling layer (10), the sixth non-magnetic coupling layer (12a), and the seventh non-magnetic coupling layer (12b) include a non-magnetic element such as W, Ta, Hf, Zr, Nb, Mo, Ti, V, Cr, Si, Al, B, Pd, Pt, and the like. Since the non-magnetic coupling layer also has a role of absorbing B or the like in the magnetic layer adjacent to the interface, an element having a bcc (body-centered cubic lattice), a large atomic radius and a relatively large lattice spacing is preferable. Of these, bcc W, Ta, Hf, Zr, Nb, Mo, Ti, V, and the like are preferable, and W and Ta are more preferable.

The sum of the film thicknesses of the first non-magnetic coupling layer (3), the second non-magnetic coupling layer (5a), and the third non-magnetic coupling layer (5b) is such that B or the like in the magnetic layer adjacent to the interface is absorbed and a perpendicular magnetic anisotropy is generated, and is also adjusted to a range of small thickness such that the magnetic coupling force $J_{ex}$ acts between the two magnetic layers (2, 6). For example, the sum of the film thicknesses is 0.2 nm or more and 1.3 nm or less, and is more preferably adjusted to the range of 0.4 nm or more and 1.0 nm or less, or 0.4 nm or more and 0.8 nm or less. The sum of the film thicknesses of the fifth non-magnetic coupling layer (10), the sixth non-magnetic coupling layer (12a), and the seventh non-magnetic coupling layer (12b) is likewise 0.2 nm or more and 1.3 nm or less, and is more preferably adjusted to the range of 0.4 nm or more and 1.0 nm or less, or 0.4 nm or more and 0.8 nm or less.

Where the film thickness of any of the first non-magnetic coupling layer (3), the second non-magnetic coupling layer (5a), the third non-magnetic coupling layer (5b), the fifth non-magnetic coupling layer (10), the sixth non-magnetic coupling layer (12a), and the seventh non-magnetic coupling layer (12b) is less than 0.2 nm, since a layer with a film thickness of about the atomic size or smaller is produced, configurations with continuous layers and those with discontinuous layers are included. Even when the layers are discontinuous, it is possible to have a perpendicular magnetic anisotropy, provided that the lattice has a gap for absorbing B or the like of the magnetic layer.

From the viewpoint of increasing the magnetic coupling force $J_{ex}$ between the two magnetic layers (between 2 and 6, between 9 and 13) and increasing the thermal stability factor Δ of the recording layer of the magnetoresistance effect element, it is preferable that the film thickness of each of the first non-magnetic coupling layer (3), the second non-magnetic coupling layer (5a), the third non-magnetic coupling layer (5b), the fifth non-magnetic coupling layer (10), and the sixth non-magnetic coupling layer (12a) does not exceed 0.3 nm.

The first magnetic insertion layer (4a), the second magnetic insertion layer (4b), the fourth magnetic insertion layer (11a), and the fifth magnetic insertion layer (11b) include at least any one of Co, Fe, and Ni.

For example, Co, CoB, CoFeB, CoW, Ni, NiFe, NiFeB, Fe, CoFe, FeB and the like can be mentioned. From the viewpoint of further increasing the magnetic coupling force $J_{ex}$ between the two magnetic layers (between 2 and 6, between 9 and 13), it is preferable to include at least Fe and B, and more preferably CoFeB, FeB and the like.

Further, the first magnetic insertion layer (4a), the second magnetic insertion layer (4b), the fourth magnetic insertion layer (11a), and the fifth magnetic insertion layer (11b) may further include a non-magnetic element such as W, Ta, Hf, Zr, Nb, Mo, Ti, V, Cr, Si, Al, B, Pd, Pt and the like.

The sum of the film thicknesses of the first magnetic insertion layer (4a), the second magnetic insertion layer (4b), the fourth magnetic insertion layer (11a), and the fifth magnetic insertion layer (11b) is preferably greater than 0 nm and equal to or less than 1.6 nm, more preferably 0.1 nm or more and 1.2 nm or less, and even more preferably 0.2 nm or more and 1.0 nm or less.

It follows from FIG. 30 that when the magnetic insertion are Co or Fe, less than 0.6 nm, at which the two magnetic layers have a perpendicular magnetic anisotropy, is more preferable. When the first magnetic insertion layer (4a), the second magnetic insertion layer (4b), the fourth magnetic insertion layer (11a), and the fifth magnetic insertion layer (11b) are FeB or CoFeB, 1.0 nm or less is more preferable, and 0.9 nm or less is even more preferable. When the first magnetic insertion layer (4a), the second magnetic insertion layer (4b), the fourth magnetic insertion layer (11a), and the fifth magnetic insertion layer (11b) are CoB, 1.0 nm or less is more preferable, and 0.8 nm or less is even more preferable. Further, it follows from FIG. 27 that since the magnetic coupling force $J_{ex}$ between the two magnetic layers only needs to be larger than zero, the lower limit value of the film thickness only needs to be larger than zero, but it is more preferable that the film thickness be adjusted to obtain the magnetic coupling force $J_{ex}=0.5$ mJ/m² at which the two magnetic layers are magnetic one body and undergo magnetization reversal and the thermal stability factor Δ is saturated. From this viewpoint, when the magnetic insertion layers are Co, 0.4 nm or more is more preferable, and when the magnetic insertion layers are CoFeB, 0.6 nm or more is more preferable. Further, it follows from FIGS. 30 and 27 that when the magnetic insertion layers are CoW, a perpendicular magnetic anisotropy is obtained, the magnetic coupling force $J_{ex}$ is greater than zero and the suitable range of the present invention is satisfied in the range of film thickness (0 nm to 2 nm) of the evaluation range of perpendicular magnetic anisotropy and in the range of film thickness (0 nm to 0.8 nm) of the evaluation range of magnetic coupling force $J_{ex}$. However, as shown in the magnetization curve of FIG. 26(b), in the case of CoW, the two magnetic layers are not magnetic one body to be reversed, and as follows from FIG. 27, the magnetic coupling force $J_{ex}$ is small and the effect of increasing the thermal stability factor Δ is smaller than that in the case of Co or CoFeB.

The saturation magnetization $M_s$ at the time of stacking the first magnetic insertion layer (4a), the second magnetic insertion layer (4b), the fourth magnetic insertion layer (11a), and the fifth magnetic insertion layer (11b) is preferably 0.4 T or more, and more preferably 1.0 T or more. The bulk saturation magnetization $M_s$ of a material which has not been stacked is preferably 0.7 T or more, and more preferably 0.9 T or more. The decrease in the value of saturation magnetization $M_s$ at the time of stacking with respect to that in the bulk state is due to the influence of adjacent layers. It follows from FIG. 34 and Table 3 that the saturation magnetization $M_s$ of the first magnetic insertion layer (4a) and the second magnetic insertion layer (4b) is one of the factors that increase the magnetic coupling force $J_{ex}$.

In Embodiment 5 shown in FIG. 5, where a reference layer is adjacent to the first non-magnetic layer (1) on the side opposite to the first magnetic layer (2), the first non-magnetic layer (1) becomes the barrier layer of the basic structure of the magnetoresistance effect element, and where another reference layer is adjacent to the second non-magnetic layer (7) on the side opposite to the fourth magnetic layer (13), the second non-magnetic layer (7) becomes the barrier layer. The first magnetic layer (2)/first coupling layer (J1)/second magnetic layer (6)/second coupling layer (J2)/third magnetic layer (9)/third coupling layer (J3)/fourth magnetic layer (13) constitute the recording layer.

Embodiment 6

Figure 6:
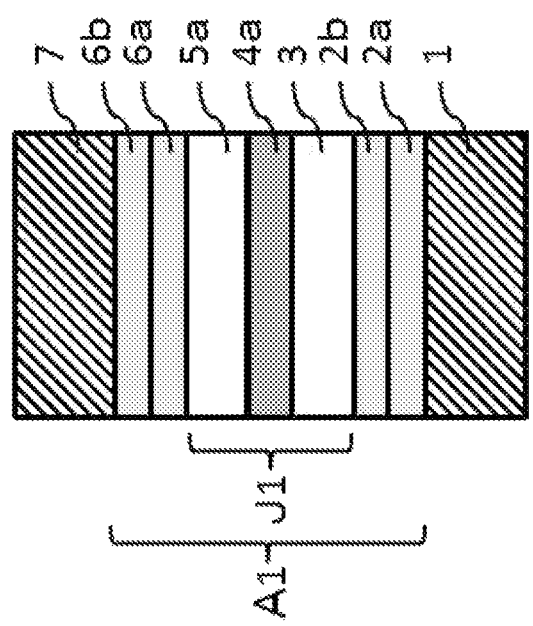
FIG. 6 is a longitudinal sectional view showing another example of the configuration of the magnetoresistance effect element of the present invention.

FIG. 6 shows an example of a magnetoresistance effect element of the present invention in which the recording layer has two magnetic layers adjacent to the interfaces of non-magnetic layers, a coupling layer constituted of the non-magnetic coupling layer/magnetic insertion layer/non-magnetic coupling layer is provided between the two magnetic layers, and each magnetic layer is divided into an outer layer and an inner layer.

In Embodiment 6, the first non-magnetic layer (1)/first magnetic outer layer (2a)/first magnetic inner layer (2b)/first non-magnetic coupling layer (3)/first magnetic insertion layer (4a)/second non-magnetic coupling layer (5a)/second magnetic inner layer (6a)/second magnetic outer layer (6b)/second non-magnetic layer (7) are stacked adjacent to each other in this order. By inserting the first magnetic insertion layer (4a), the magnetic layers are magnetically coupled while providing perpendicular magnetic anisotropy at the interface of the first non-magnetic layer (1)/first magnetic outer layer (2a) and the interface of the second magnetic outer layer (6b)/second non-magnetic layer (7). That is, the magnetic coupling force $J_{ex}$ acts between the two magnetic layers.

The first magnetic outer layer (2a), the first magnetic inner layer (2b), the second magnetic inner layer (6a), and the second magnetic outer layer (6b) include at least either Co or Fe. For example, Co, CoFe, CoB, Fe, FeB, CoFeB and the like, and CoFeB including B is preferable. The composition is exemplified by FeB, $(Co_{25}Fe_{75})_{75}B_{25}$, and the like, but is not limited thereto, provided that the first magnetic outer layer (2a) and the first magnetic inner layer (2b), and the second magnetic inner layer (6a) and the second magnetic outer layer (6b) are magnetically coupled by the magnetic coupling force $J_{ex}$.

The first magnetic outer layer (2a), the first magnetic inner layer (2b), the second magnetic inner layer (6a), and the second magnetic outer layer (6b) may further include a 3d ferromagnetic transition metal such as Ni in addition to Co and Fe as magnetic elements.

The first magnetic outer layer (2a), the first magnetic inner layer (2b), the second magnetic inner layer (6a), and the second magnetic outer layer (6b) may further include a non-magnetic element such as W, Ta, Hf, Zr, Nb, Mo, Ti, V, Cr, Si, Al, B, Pd, Pt, and the like. Among these, B and V are preferable from the viewpoint of ease of handling. These non-magnetic elements can lower the saturation magnetization $(M_s)$ of the magnetic layer.

The ratio of the composition of the non-magnetic element such as W, Ta, Hf, Zr, Nb, Mo, Ti, V, Cr, Si, Al, B, Pd, Pt, and the like of the first magnetic outer layer (2a) to the composition of the non-magnetic element such as W, Ta, Hf, Zr, Nb, Mo, Ti, V, Cr, Si, Al, B, Pd, Pt, and the like of the first magnetic inner layer (2b) is preferably less than 1.

This is so because as a result of adjusting the ratio of the non-magnetic element, such as W, Ta, Hf, Zr, Nb, Mo, Ti, V, Cr, Si, Al, B, Pd, Pt, and the like of the magnetic layers, which are known to contribute to a decrease in the saturation magnetization ($M_s$), the saturation magnetization ($M_s$) of the first magnetic inner layer (2b) becomes lower than the saturation magnetization ($M_s$) of the first magnetic outer layer (2a), and the saturation magnetization ($M_s$) of the entire magnetic layer can be lowered.

Likewise, the ratio of the composition of the non-magnetic element such as W, Ta, Hf, Zr, Nb, Mo, Ti, V, Cr, Si, Al, B, Pd, Pt, and the like of the second magnetic outer layer (6b) to the composition of the non-magnetic element such as W, Ta, Hf, Zr, Nb, Mo, Ti, V, Cr, Si, Al, B, Pd, Pt, and the like of the second magnetic inner layer (6a) is preferably less than 1.

The sum of the film thicknesses of the first magnetic outer layer (2a) and the first magnetic inner layer (2b) and the sum of the film thicknesses of the second magnetic outer layer (6a) and the second magnetic outer layer (6b) are each in the range of 0.7 to 2.0 nm. This is so because where the thickness is less than 0.7 nm, the magnetization is greatly reduced, and the effective magnetic anisotropy constant $K_{eff}t$ is also reduced, whereas when the thickness is more than 2.0 nm, an in-plane magnetic anisotropy occurs, as follows from Equation 2, when MgO or the like is used for the first non-magnetic layer (1) and the second non-magnetic layer (7). The sum of the film thicknesses of the first magnetic outer layer (2a) and the first magnetic inner layer (2b) is more preferably 1.2 to 1.6 nm, and further preferably 1.4 to 1.6 nm. The sum of the film thicknesses of the second magnetic inner layer (6a) and the second magnetic outer layer (6b) is more preferably in the range of 0.8 to 1.4 nm.

Embodiment 7

Figure 7:
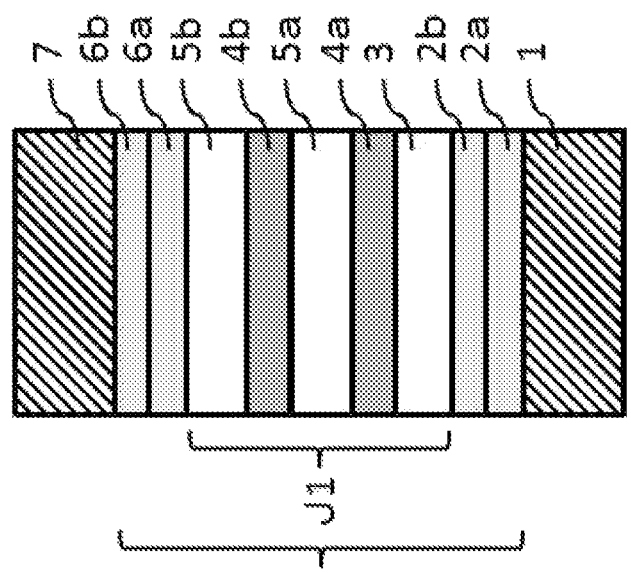
FIG. 7 is a longitudinal sectional view showing another example of the configuration of the magnetoresistance effect element of the present invention.

FIG. 7 shows an example of a magnetoresistance effect element of the present invention in which the recording layer has two magnetic layers adjacent to the interfaces of non-magnetic layers, a coupling layer constituted of non-magnetic coupling layer/magnetic insertion layer/non-magnetic coupling layer/magnetic insertion layer/non-magnetic coupling layer is provided between the two magnetic layers, and each magnetic layer is divided into an outer layer and an inner layer.

In Embodiment 7, the first non-magnetic layer (1)/first magnetic outer layer (2a)/first magnetic inner layer (2b)/first non-magnetic coupling layer (3)/first magnetic insertion layer (4a)/second non-magnetic coupling layer (5a)/second magnetic insertion layer (4b)/third non-magnetic coupling layer (5b)/second magnetic inner layer (6a)/second magnetic outer layer (6b)/second non-magnetic layer (7) are stacked adjacent to each other in this order. By inserting the first magnetic insertion layer (4a) and the second magnetic insertion layer (4b), the magnetic layers are magnetically coupled. That is, the magnetic coupling force $J_{ex}$ acts between the magnetic layers.

Details of Embodiment 7 are the same as those of Embodiment 2 and Embodiment 6.

Embodiment 8

Figure 8:
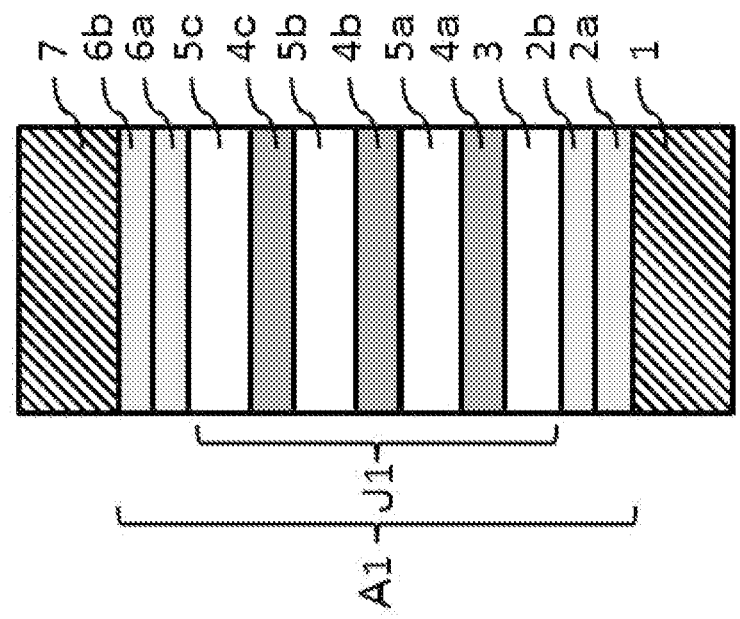
FIG. 8 is a longitudinal sectional view showing another example of the configuration of the magnetoresistance effect element of the present invention.

FIG. 8 shows an example of a magnetoresistance effect element of the present invention in which the recording layer has two magnetic layers adjacent to the interfaces of non-magnetic layers, a coupling layer constituted of the non-magnetic coupling layer/magnetic insertion layer/non-magnetic coupling layer/magnetic insertion layer/non-magnetic coupling layer/magnetic insertion layer/non-magnetic coupling layer is provided between the two magnetic layers, and each magnetic layer is divided into an outer layer and an inner layer.

In Embodiment 8, the first non-magnetic layer (1)/first magnetic outer layer (2a)/first magnetic inner layer (2b)/first non-magnetic coupling layer (3)/first magnetic insertion layer (4a)/second non-magnetic coupling layer (5a)/second magnetic insertion layer (4b)/third non-magnetic coupling layer (5b)/third magnetic insertion layer (4c)/fourth non-magnetic coupling layer (5c)/second magnetic inner layer (6a)/second magnetic outer layer (6b)/second non-magnetic layer (7) are stacked adjacent to each other in this order. By inserting the first magnetic insertion layer (4a), the second magnetic insertion layer (4b), and the third magnetic insertion layer (4c), the magnetic layers are magnetically coupled. That is, the magnetic coupling force $J_{ex}$ acts between the magnetic layers.

Details of Embodiment 8 are the same as those of Embodiment 3 and Embodiment 6.

Embodiment 9

Figure 9:
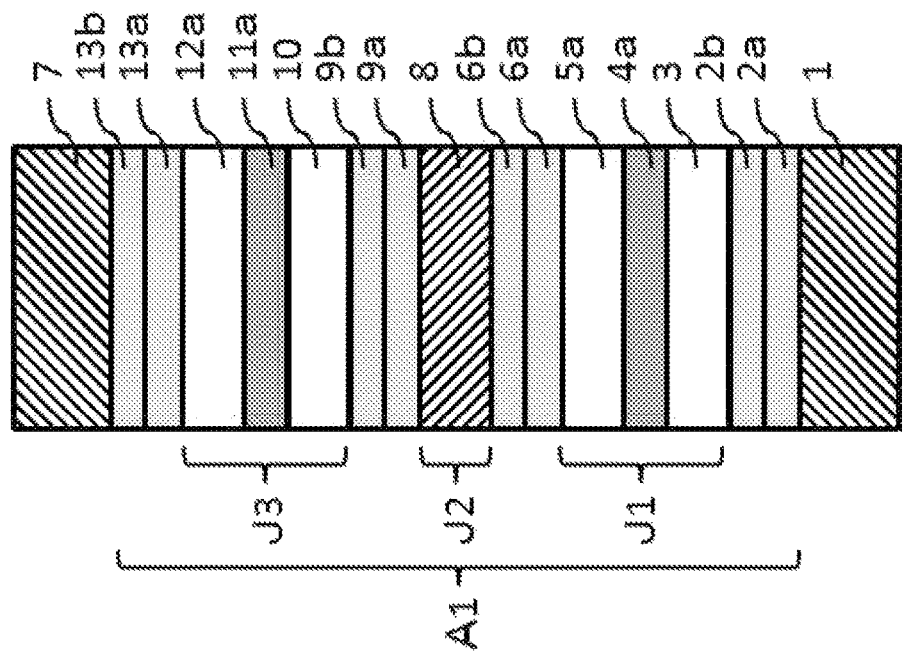
FIG. 9 is a longitudinal sectional view showing another example of the configuration of the magnetoresistance effect element of the present invention.

FIG. 9 shows an example of a magnetoresistance effect element of the present invention in which the recording layer has four magnetic layers, a total of three coupling layers are provided between the respective magnetic layers, and each magnetic layer is divided into an outer layer and an inner layer.

In Embodiment 9, the first non-magnetic layer (1)/first magnetic outer layer (2a)/first magnetic inner layer (2b)/first coupling layer (J1)/second magnetic inner layer (6a)/second magnetic outer layer (6b)/second coupling layer (J2)/third magnetic inner layer (9a)/third magnetic outer layer (9b)/third coupling layer (J3)/fourth magnetic inner layer (13a)/fourth magnetic outer layer (13b)/second non-magnetic layer (7) are stacked adjacent to each other in this order.

The first coupling layer (J1) is configured by stacking the first non-magnetic coupling layer (3)/first magnetic insertion layer (4a)/second non-magnetic coupling layer (5a) adjacent to each other in this order, the second coupling layer (J2) is constituted of the third non-magnetic layer (8), and the third coupling layer (J3) is configured by stacking the fifth non-magnetic coupling layer (10)/fourth magnetic insertion layer (11a)/sixth non-magnetic coupling layer (12a) adjacent to each other in this order. By inserting the first magnetic insertion layer (4a), the fourth magnetic insertion layer (11a), and the third non-magnetic layer (8), the four magnetic layers are magnetically coupled.

Details of Embodiment 9 are the same as those of Embodiment 4 and Embodiment 6.

Embodiment 10

Figure 10:
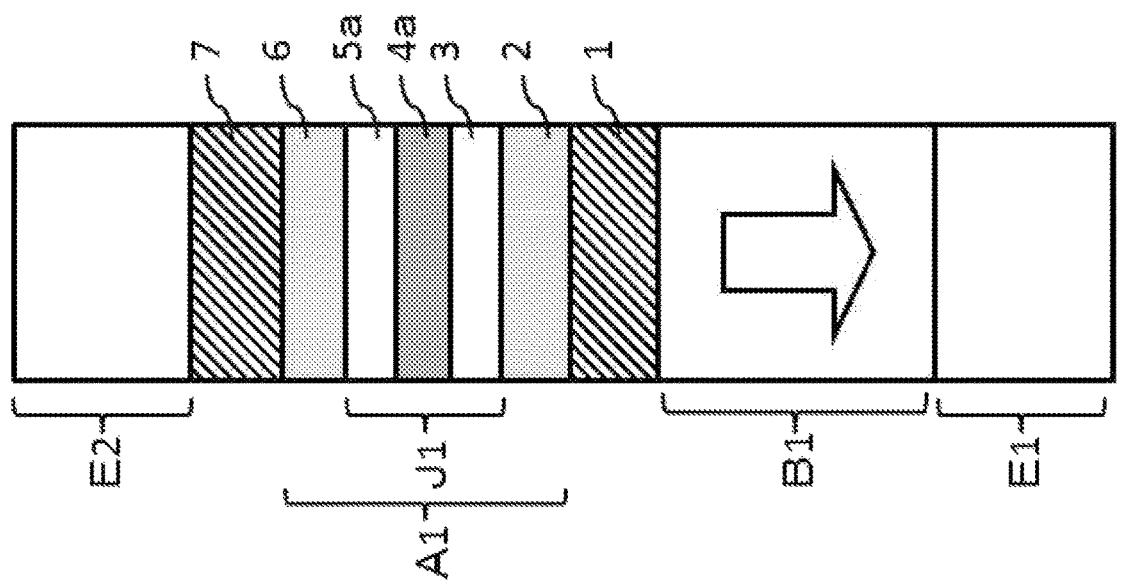
FIG. 10 is a longitudinal sectional view showing another example of the configuration of the magnetoresistance effect element of the present invention.

FIG. 10 shows an example of a magnetoresistance effect element of the present invention having a lower non-magnetic electrode/reference layer/barrier layer/recording layer/upper non-magnetic electrode.

As shown in FIG. 10, the magnetoresistance effect element of Embodiment 10 has a stack structure of a lower non-magnetic electrode (E1), a first reference layer (B1), a first non-magnetic layer (1) which is a barrier layer, a first recording layer (A1), a second non-magnetic layer (7), and an upper non-magnetic electrode (E2), and the first recording layer (A1) includes the first magnetic layer (2)/first non-magnetic coupling layer (3)/first magnetic insertion layer (4a)/second non-magnetic coupling layer (5a)/second magnetic layer (6) of Embodiment 1.

Details of Embodiment 10 are the same as those of Embodiment 1 except for the following description.

The first reference layer (B1) is a magnetic layer in which the magnetization direction is fixed as an entire reference layer. The magnetic layer of the reference layer may be a stack structure of a magnetic layer and a non-magnetic layer.

The lower non-magnetic electrode (E1) is connected to the end surface of the first reference layer (B1) on the side opposite to the first non-magnetic layer (1).

The stack structure of the lower non-magnetic electrode (E1) is exemplified by Ta (5 nm)/Ru (5 nm)/Ta (10 nm)/Pt (5 nm), Ta (5 nm)/TaN (20 nm), and the like.

The first non-magnetic layer (1) is a barrier layer (tunnel junction layer constituted of an insulating layer) of the magnetoresistance effect element and is joined to the end surface of the first magnetic layer (2) on the side opposite to the first non-magnetic coupling layer (3), and to the end surface of the first reference layer (B1) on the side opposite to the lower non-magnetic electrode (E1).

Further, the second non-magnetic layer (7) is joined to the end surface of the second magnetic layer (6) on the side opposite to the second non-magnetic coupling layer (5a), and to the upper non-magnetic electrode (E2).

A compound including oxygen such as MgO, $Al_2O_3$, $SiO_2$, TiO, $Hf_2O$, or the like is used, and MgO is preferably used, as the material of the first non-magnetic layer (1) and the second non-magnetic layer (7) so that a large rate of change in magnetoresistance is exhibited by a combination of the material of the end surface of the first reference layer (B1) on the side opposite to the lower non-magnetic electrode (E1) and the material of the first magnetic layer (2).

The film thickness of the first non-magnetic layer (1) and the second non-magnetic layer (7) is preferably adjusted in the range of 0.2 nm to 2.0 nm.

Further, the film thickness may be different, such that the first non-magnetic layer (1) is 1.2 nm and the second non-magnetic layer (7) is 1.0 nm.

The upper non-magnetic electrode (E2) is connected to the end surface of the second non-magnetic layer (7) on the side opposite to the second magnetic layer (6).

The stack structure of the upper non-magnetic electrode (E2) is exemplified by Ta (50 nm), Ta (5 nm)/Ru (50 nm), Ru (1 nm to 50 nm), Pt (1 nm to 50 nm), CoFeB (0.2 nm to 1.5 nm)/Ru (5)/Ta (50 nm).

Embodiment 11

Figure 11:
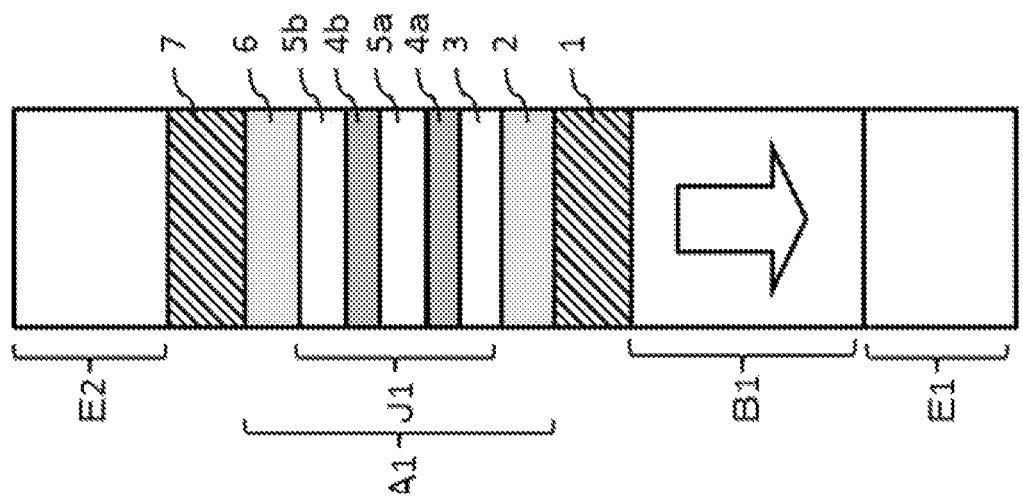
FIG. 11 is a longitudinal sectional view showing another example of the configuration of the magnetoresistance effect element of the present invention.

FIG. 11 shows an example of a magnetoresistance effect element of the present invention which has a lower non-magnetic electrode/reference layer/barrier layer/recording layer/upper non-magnetic electrode, and in which the recording layer is the stack structure of Embodiment 2.

As shown in FIG. 11, the magnetoresistance effect element of Embodiment 11 has a stack structure of a lower non-magnetic electrode (E1), a first reference layer (B1), a first non-magnetic layer (1) which is a barrier layer, a first recording layer (A1), a second non-magnetic layer (7), and an upper non-magnetic electrode (E2), and the first recording layer (A1) includes the first magnetic layer (2)/first non-magnetic coupling layer (3)/first magnetic insertion layer (4a)/second non-magnetic coupling layer (5a)/second magnetic insertion layer (4b)/third non-magnetic coupling layer (5b)/second magnetic layer (6) of Embodiment 2.

Details of Embodiment 11 are the same as those of Embodiment 2 and Embodiment 10.

Embodiment 12

Figure 12:
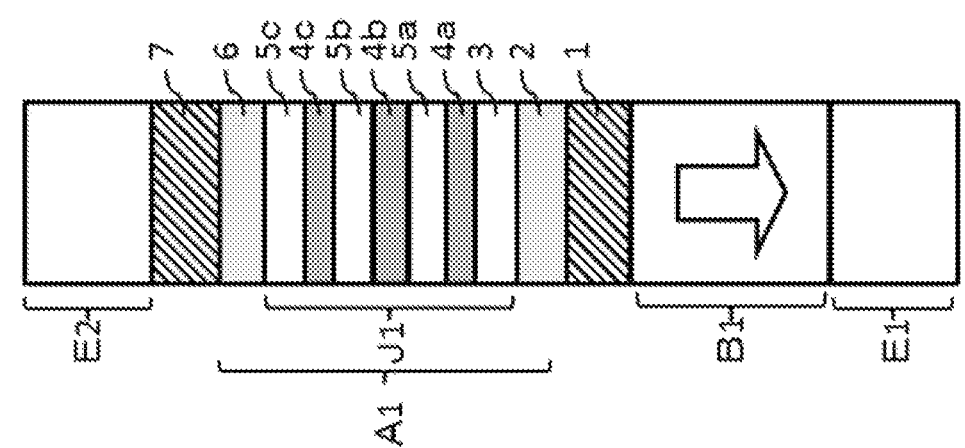
FIG. 12 is a longitudinal sectional view showing another example of the configuration of the magnetoresistance effect element of the present invention.

FIG. 12 shows an example of a magnetoresistance effect element of the present invention which has a lower electrode/reference layer/barrier layer/recording layer/upper electrode, and in which the recording layer is the stack structure of Embodiment 3.

As shown in FIG. 12, the magnetoresistance effect element of Embodiment 12 has a stack structure of a lower non-magnetic electrode (E1), a first reference layer (B1), a first non-magnetic layer (1) which is a barrier layer, a first recording layer (A1), a second non-magnetic layer (7), and an upper non-magnetic electrode (E2), and the first recording layer (A1) includes the first magnetic layer (2)/first non-magnetic coupling layer (3)/first magnetic insertion layer (4a)/second non-magnetic coupling layer (5a)/second magnetic insertion layer (4b)/third non-magnetic coupling layer (5b)/third magnetic insertion layer (4c)/fourth non-magnetic coupling layer (5c)/second magnetic layer (6) of Embodiment 3.

Details of Embodiment 12 are the same as those of Embodiment 3 and Embodiment 10.

Embodiment 13

Figure 13:
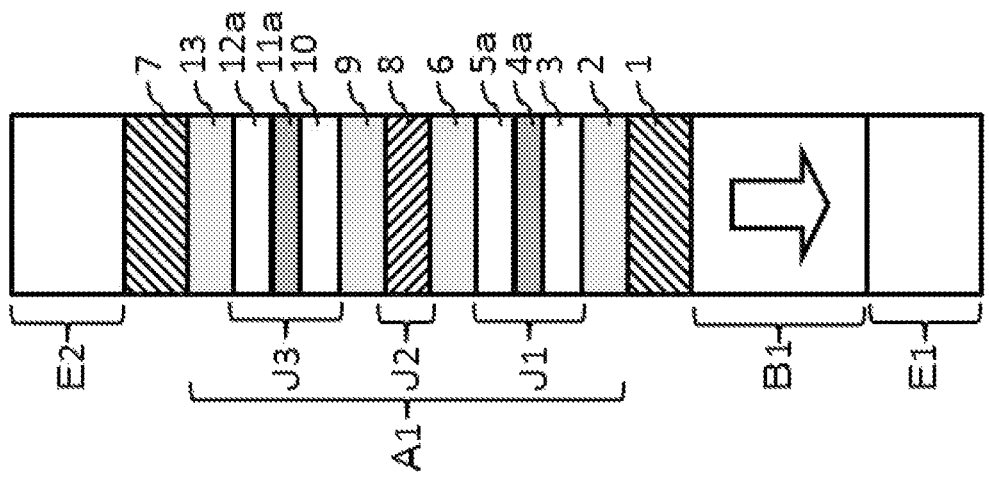
FIG. 13 is a longitudinal sectional view showing another example of the configuration of the magnetoresistance effect element of the present invention.

FIG. 13 shows an example of a magnetoresistance effect element of the present invention which has a lower non-magnetic electrode/reference layer/barrier layer/recording layer/upper non-magnetic electrode, and in which the recording layer is the stack structure of Embodiment 4.

As shown in FIG. 13, the magnetoresistance effect element of Embodiment 13 has a stack structure of a lower non-magnetic electrode (E1), a first reference layer (B1), a first non-magnetic layer (1) which is a barrier layer, a first recording layer (A1), a second non-magnetic layer (7), and an upper non-magnetic electrode (E2), and the first recording layer (A1) includes the first magnetic layer (2)/first coupling layer (J1)/second magnetic layer (6)/second coupling layer (J2)/third magnetic layer (9)/third coupling layer (J3)/fourth magnetic layer (13) of Embodiment 4. The first coupling layer (J1) is configured by stacking the first non-magnetic coupling layer (3)/first magnetic insertion layer (4a)/second non-magnetic coupling layer (5a) adjacent to each other in this order, the second coupling layer (J2) is constituted of the third non-magnetic layer (8), and the third coupling layer (J3) is configured by stacking the fifth non-magnetic coupling layer (10)/fourth magnetic insertion layer (11a)/sixth non-magnetic coupling layer (12a) adjacent to each other in this order.

Details of Embodiment 13 are the same as those of Embodiment 4 and Embodiment 10.

Embodiment 14

Figure 14:
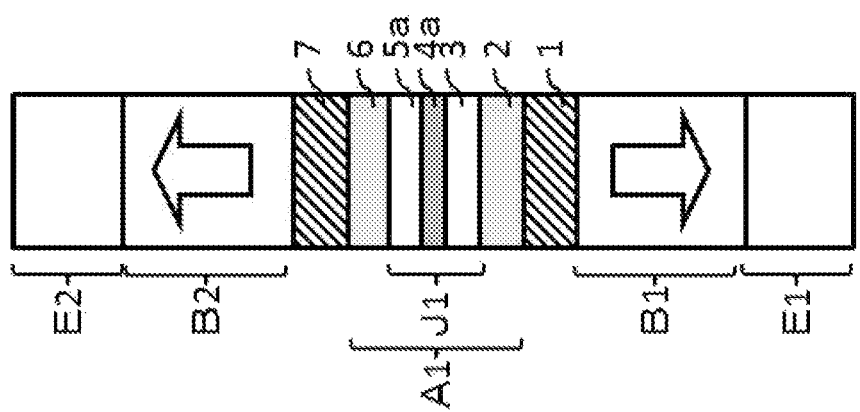
FIG. 14 is a longitudinal sectional view showing another example of the configuration of the magnetoresistance effect element of the present invention.

FIG. 14 shows an example of a magnetoresistance effect element of the present invention which includes one recording layer, two reference layers, and two barrier layers, and in which the recording layer is the stack structure of the recording layer of Embodiment 1.

As shown in FIG. 14, the magnetoresistance effect element of Embodiment 14 has a stack structure of a lower non-magnetic electrode (E1), a first reference layer (B1), a first non-magnetic layer (1), a first recording layer (A1), a second non-magnetic layer (7), a second reference layer (B2), and an upper non-magnetic electrode (E2), and the first recording layer (A1) includes the first magnetic layer (2)/first non-magnetic coupling layer (3)/first magnetic insertion layer (4*a*)/second non-magnetic coupling layer (5*a*)/second magnetic layer (6) of Embodiment 1.

In this embodiment, the first non-magnetic layer (1) and the second non-magnetic layer (7) are barrier layers.

Details of Embodiment 14 are the same as those of Embodiment 1 and Embodiment 10 except for the following description.

The second reference layer (B2) is a magnetic layer in which the magnetization direction is fixed for the entire reference layer.

The magnetic layer of the reference layer may be a stack structure of a magnetic layer and a non-magnetic layer. Further, in the second reference layer (B2), the magnetization arrangement state of each magnetic layer is reversed from that in the first reference layer (B1), and the second reference layer has a property as an anti-parallel coupling reference layer.

Embodiment 15

Figure 15:
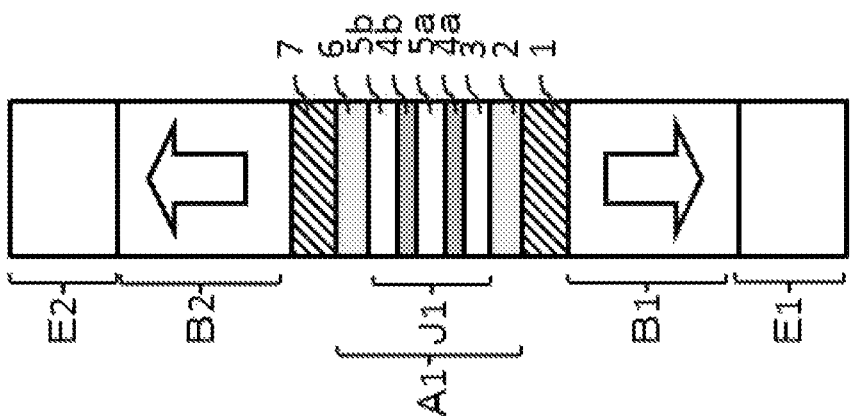
FIG. 15 is a longitudinal sectional view showing another example of the configuration of the magnetoresistance effect element of the present invention.

FIG. 15 shows an example of a magnetoresistance effect element of the present invention having one recording layer, two reference layers, and two barrier layers.

As shown in FIG. 15, the magnetoresistance effect element of Embodiment 15 has a stack structure of a lower non-magnetic electrode (E1), a first reference layer (B1), a first non-magnetic layer (1), a first recording layer (A1), a second non-magnetic layer (7), a second reference layer (B2), and an upper non-magnetic electrode (E2), and the first recording layer (A1) includes the first magnetic layer (2)/first non-magnetic coupling layer (3)/first magnetic insertion layer (4*a*)/second non-magnetic coupling layer (5*a*)/second magnetic insertion layer (4*b*)/third non-magnetic coupling layer (5*b*)/second magnetic layer (6) of Embodiment 2.

In this embodiment, the first non-magnetic layer (1) and the second non-magnetic layer (7) are barrier layers.

Details of Embodiment 15 are the same as those of Embodiment 2, Embodiment 10, and Embodiment 14.

Embodiment 16

Figure 16:
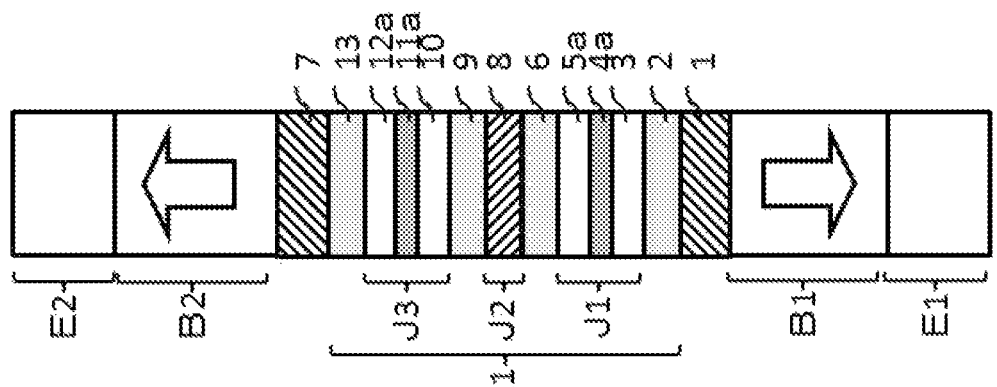
FIG. 16 is a longitudinal sectional view showing another example of the configuration of the magnetoresistance effect element of the present invention.

FIG. 16 shows an example of a magnetoresistance effect element of the present invention having one recording layer, two reference layers, and two barrier layers.

As shown in FIG. 16, the magnetoresistance effect element of Embodiment 16 has a stack structure of a lower non-magnetic electrode (E1), a first reference layer (B1), a first non-magnetic layer (1), a first recording layer (A1), a second non-magnetic layer (7), a second reference layer (B2), and an upper non-magnetic electrode (E2), and the first recording layer (A1) includes the first magnetic layer (2)/first coupling layer (J1)/second magnetic layer (6)/second coupling layer (J2)/third magnetic layer (9)/third coupling layer (J3)/fourth magnetic layer (13) of Embodiment 4. The first coupling layer (J1) is configured by stacking the first non-magnetic coupling layer (3)/first magnetic insertion layer (4*a*)/second non-magnetic coupling layer (5*a*) adjacent to each other in this order, the second coupling layer (J2) is constituted of the third non-magnetic layer (8), and the third coupling layer (J3) is configured by stacking the fifth non-magnetic coupling layer (10)/fourth magnetic insertion layer (11*a*)/sixth non-magnetic coupling layer (12*a*) adjacent to each other in this order.

In this embodiment, the first non-magnetic layer (1) and the second non-magnetic layer (7) are barrier layers.

Details of Embodiment 16 are the same as those of Embodiment 4, Embodiment 10, and Embodiment 14.

Embodiment 17

Figure 17:
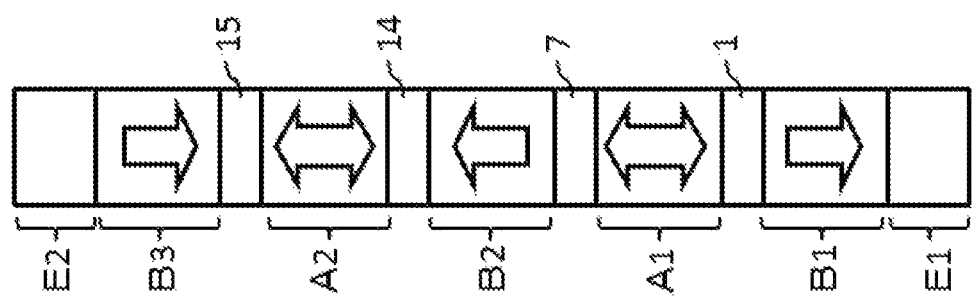
FIG. 17 is a longitudinal sectional view showing another example of the configuration of the magnetoresistance effect element of the present invention.

FIG. 17 shows an example of a magnetoresistance effect element of the present invention having two recording layers, three reference layers, and four barrier layers.

As shown in FIG. 17, the magnetoresistance effect element of Embodiment 17 has a stack structure of a lower non-magnetic electrode (E1), a first reference layer (B1), a first non-magnetic layer (1), a first recording layer (A1), a second non-magnetic layer (7), a second reference layer (B2), a fourth non-magnetic layer (14), a second recording layer (A2), a fifth non-magnetic layer (15), a third reference layer (B3), and an upper non-magnetic electrode (E2).

In this embodiment, the first non-magnetic layer (1), the second non-magnetic layer (7), the fourth non-magnetic layer (14), and the fifth non-magnetic layer (15) are barrier layers.

The first recording layer (A1) and the second recording layer (A2) may have any of the recording layer configurations shown Embodiments 1 to 9.

Details of Embodiment 17 are the same as those of Embodiments 1 to 16 except for the following description.

The fourth non-magnetic layer (14) is a barrier layer of the magnetoresistance effect element and is joined adjacent to the end surface of the second reference layer (B2) on the side opposite to the second non-magnetic layer (7) and to the end surface of the second recording layer (A2) on the side opposite to the fifth non-magnetic layer (15). Further, the fifth non-magnetic layer (15) is a barrier layer of the magnetoresistance effect element and is joined adjacent to the end surface of the second recording layer (A2) on the side opposite to the fourth non-magnetic layer (14) and to the end surface of the third reference layer (B3) on the side opposite to the upper non-magnetic electrode (E2).

A compound including oxygen such as MgO, $Al_2O_3$, $SiO_2$, TiO, $Hf_2O$, or the like is used, and MgO is preferably used, as the material of the fourth non-magnetic layer (14) and the fifth non-magnetic layer (15) so that a large rate of change in magnetoresistance is exhibited by a combination of the materials of the two end surfaces to be joined.

The film thickness of the fourth non-magnetic layer (14) and the fifth non-magnetic layer (15) is preferably adjusted in the range of 0.2 nm to 2.0 nm.

Further, the first non-magnetic layer (1), the second non-magnetic layer (7), the fourth non-magnetic layer (14) and the fifth non-magnetic layer (15) may have different thicknesses.

The third reference layer (B3) is a magnetic layer in which the magnetization direction is fixed for the entire reference layer.

The magnetic layer of the reference layer may be a stack structure of a magnetic layer and a non-magnetic layer. Further, in the third reference layer (B3), the magnetization arrangement state of the second reference layer (B2) and the magnetic layer is reversed, and the third reference layer has a property as an anti-parallel coupling reference layer.

Embodiment 17 illustrates an example of a magnetoresistance effect element is constituted of two recording layers, three reference layers, and four barrier layers, but the magnetoresistance effect element of the present invention can include a larger number of recording layers, reference layers, and barrier layers. By using a plurality of reference layers, a multi-value function can be provided.

Embodiment 18

Figure 18:
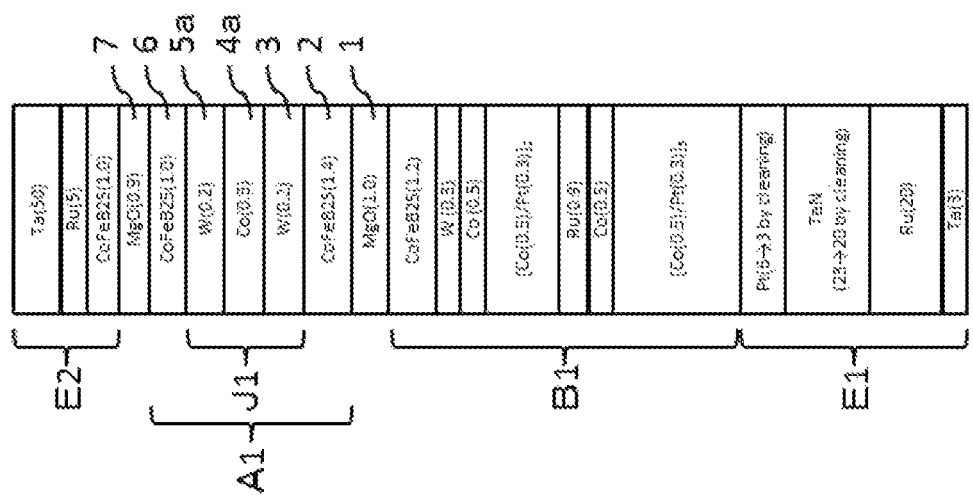
FIG. 18 is a longitudinal sectional view showing another example of the configuration of the magnetoresistance effect element of the present invention.
Figure 19:
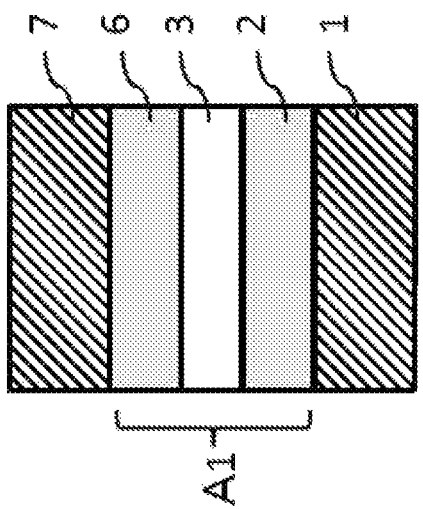
FIG. 19 is a longitudinal sectional view showing an example of the configuration of a conventional magnetoresistance effect element.
Figure 20:
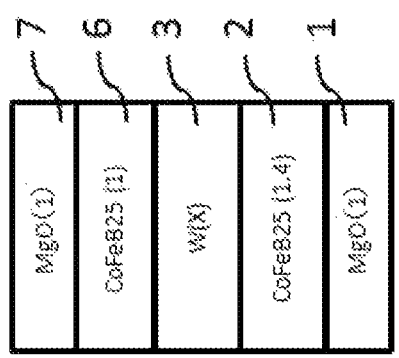
FIG. 20 shows a configuration diagram of a magnetoresistance effect element for evaluation of the magnetic anisotropy with respect to the film thickness of a non-magnetic coupling layer inserted between two magnetic layers in a recording layer of a magnetoresistance effect element having two magnetic layers adjacent to an MgO interface.
Figure 22:
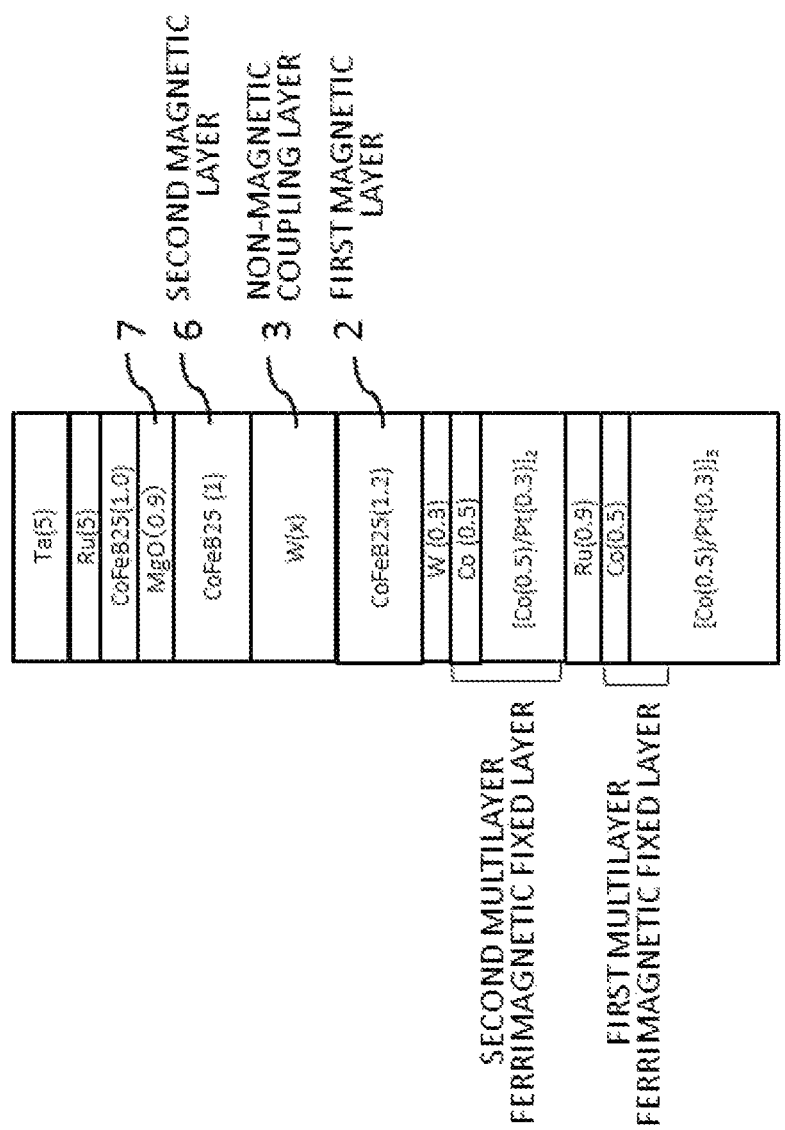
FIG. 22 shows a configuration diagram of a magnetoresistance effect element for evaluation, for each film thickness, of the magnetic coupling force $J_{ex}$ between the two magnetic layers in a recording layer of a magnetoresistance effect element having two magnetic layers adjacent to an MgO interface.
Figure 23A:
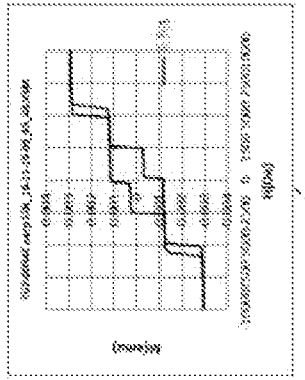
FIG. 23(a) shows a magnetization curve in a recording layer of a magnetoresistance effect element having two magnetic layers adjacent to an MgO interface when the film thickness of a non-magnetic coupling layer W is 0.3 nm.
Figure 23B:
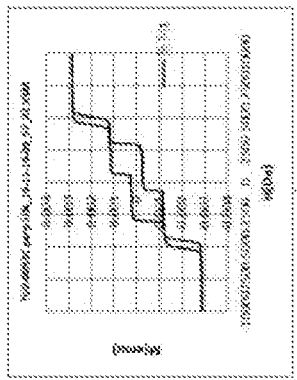
FIG. 23(b) shows a magnetization curve in a recording layer of a magnetoresistance effect element having two magnetic layers adjacent to an MgO interface when the film thickness of a non-magnetic coupling layer W is 0.4 nm.
Figure 23C:
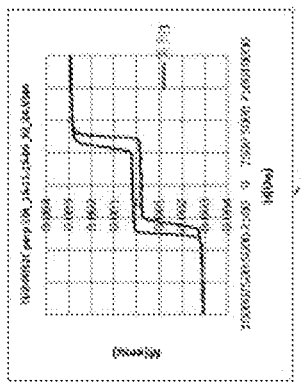
FIG. 23(c) shows a magnetization curve in a recording layer of a magnetoresistance effect element having two magnetic layers adjacent to an MgO interface when the film thickness of a non-magnetic coupling layer W is 0.5 nm.
Figure 23D:
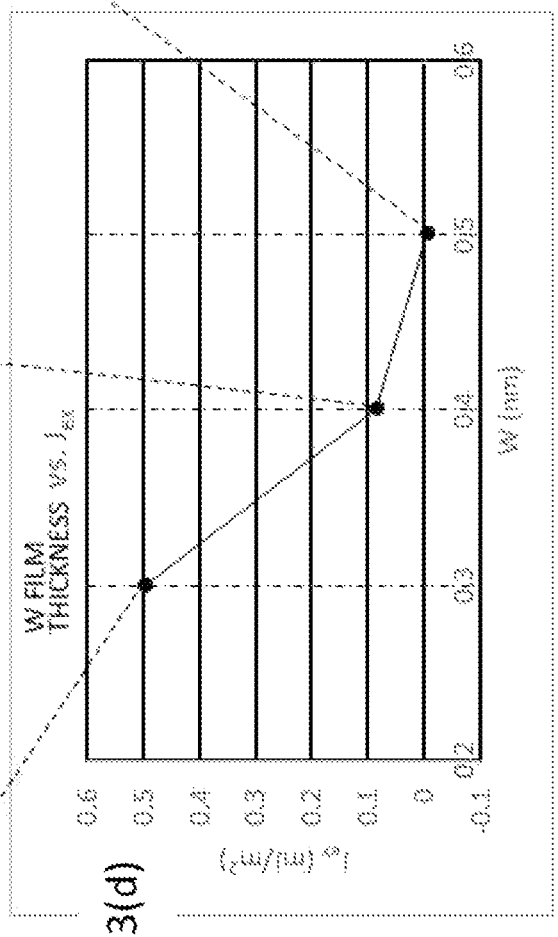
FIG. 23(d) shows the relationship between the magnetic coupling force $J_{ex}$ between the two magnetic layers and the film thickness of the non-magnetic coupling layer.

FIG. 18 shows an example of a magnetoresistance effect element of the present invention including a lower non-magnetic electrode/reference layer/barrier layer/recording layer/upper non-magnetic electrode.

As shown in FIG. 18, the magnetoresistance effect element of Embodiment 18 has a stack structure of a lower non-magnetic electrode (E1), a first reference layer (B1), a first non-magnetic layer (1) which is a barrier layer, a first recording layer (A1), a second non-magnetic layer (7), and an upper non-magnetic electrode (E2).

The lower non-magnetic electrode (E1) is obtained by stacking Ta (3 nm), Ru (20 nm), and TaN (23 nm) in this order, then cleaning the surface of TaN to reach a thickness of 20 nm, further stacking Pt (6 nm), and cleaning the surface of Pt to a thickness of 3 nm.

The first reference layer (B1) is obtained by sequentially stacking [Co (0.5 nm)/Pt (0.3 nm)]$_5$/Co (0.5 nm)/Ru (0.9 nm)/[Co (0.5 nm)/Pt (0.3 nm)]$_2$/Co (0.5 nm)/W (0.3 nm)/CoFeB (1.2 nm) on the lower non-magnetic electrode (E1).

The first non-magnetic layer (1) is MgO (1.0 nm).

The first recording layer (A1) is obtained by sequentially stacking CoFeB$_{25}$ (1.4 nm) of the first magnetic layer/W (0.2 nm) of the first non-magnetic layer/Co (0.3 nm) of the magnetic insertion layer/W (0.2 nm) of the second non-magnetic layer/second magnetic layer (1.0 nm) on the first non-magnetic layer (1).

The second non-magnetic layer (7) is MgO (0.9 nm).

The upper non-magnetic electrode (E2) is obtained by sequentially stacking CoFeB$_{25}$ (1.0 nm)/Ru (5 nm)/Ta (50 nm) on the second non-magnetic layer (7).

Details of Embodiment 18 are the same as those of Embodiment 10.

Comparative Embodiment 1

Figure 50:
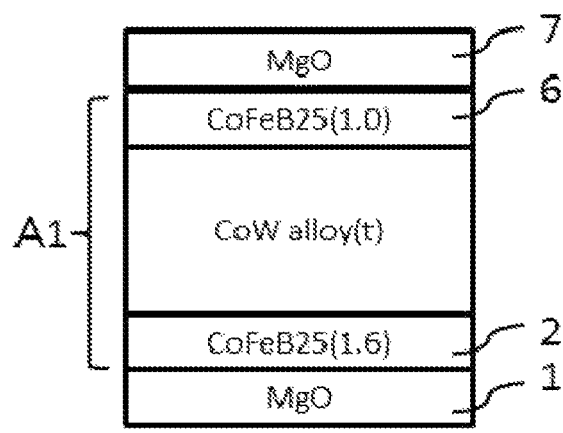
FIG. 50 is a configuration diagram when a coupling layer sandwiched between two magnetic layers is an alloy of a non-magnetic element and a magnetic element.

FIG. 50 shows the configuration of Comparative Embodiment 1.

As shown in FIG. 50, the magnetoresistance effect element of Comparative Embodiment 1 has a stack structure of a first non-magnetic layer (1)/first magnetic layer (2)/alloy film of non-magnetic element and magnetic element/second magnetic layer (6)/second non-magnetic layer (7). That is, unlike the configuration of the present invention as typified by FIG. 1, an alloy film is arranged between two magnetic layers.

Figure 51:
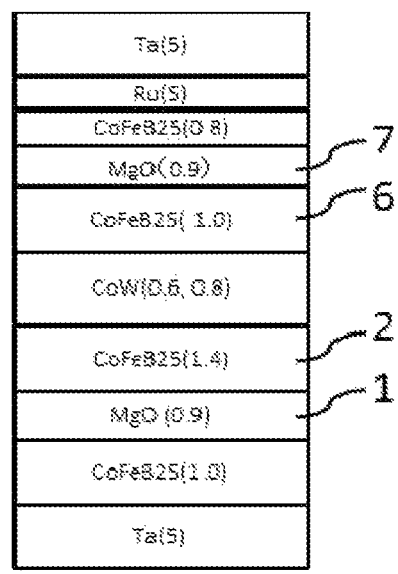
FIG. 51 shows a configuration diagram of a magnetoresistance effect element for evaluation of magnetization characteristic when a coupling layer sandwiched between two magnetic layers is an alloy of a non-magnetic element and a magnetic element.
Figure 52:
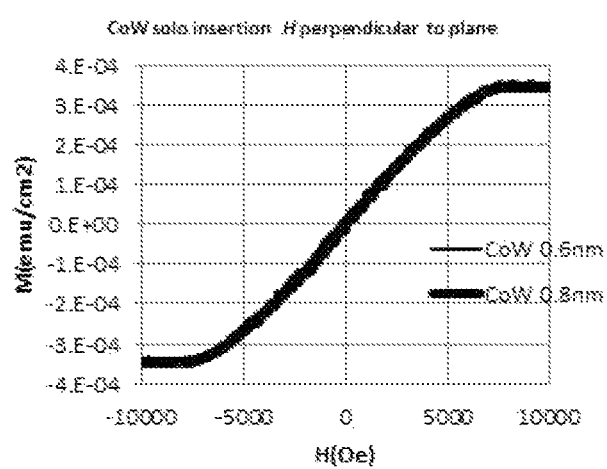
FIG. 52 shows a magnetization curve in the case where the coupling layer sandwiched between two magnetic layers is an alloy of a non-magnetic element and a magnetic element.

A magnetization curve of FIG. 52 was obtained using the magnetoresistance effect element for evaluation of Comparative Embodiment 1 shown in FIG. 51.

In the element of the configuration shown in FIG. 51, a strong magnetic coupling force J$_{ex}$ was generated, but it was found from the magnetization characteristics shown in FIG. 52 that the perpendicular magnetic anisotropy did not occur in the first magnetic layer (2) and the second magnetic layer (6). Although the layer including W is disposed between the magnetic layers in the same manner as in Embodiment 1 of the present invention, the effect of increasing the perpendicular magnetic anisotropy by the CoW alloy film is not demonstrated. This is conceivably because the CoW alloy film is amorphous, has a high filling rate, and has a structure with few gaps inside as in an fcc (face centered cubic lattice), so even B having a relatively small atomic radius is unlikely to be taken in, and B or the like in the adjacent magnetic layers (2, 6) is difficult to be absorbed.

Therefore, it was found that a configuration in which an alloy film of a non-magnetic element and a magnetic element is arranged in the coupling layer (J1) is not suitable as a perpendicular magnetoresistance effect element.

The comparison of the result of Comparative Embodiment 1 and the configuration of Embodiment 1 of the present invention confirms that the two non-magnetic coupling layers (3, 5a) in FIG. 1 have a bcc (body-centered cubic lattice), and that element (material) having a relatively large lattice spacing is preferred. This is because a large lattice spacing such as that of bcc facilitates absorption of B or the like in the two magnetic layers (2, 6).

Embodiment 19

The dependence of the magnetic coupling force J$_{ex}$ on the film thickness was evaluated when the first magnetic insertion layer (4a) was FeB.

Figure 53:
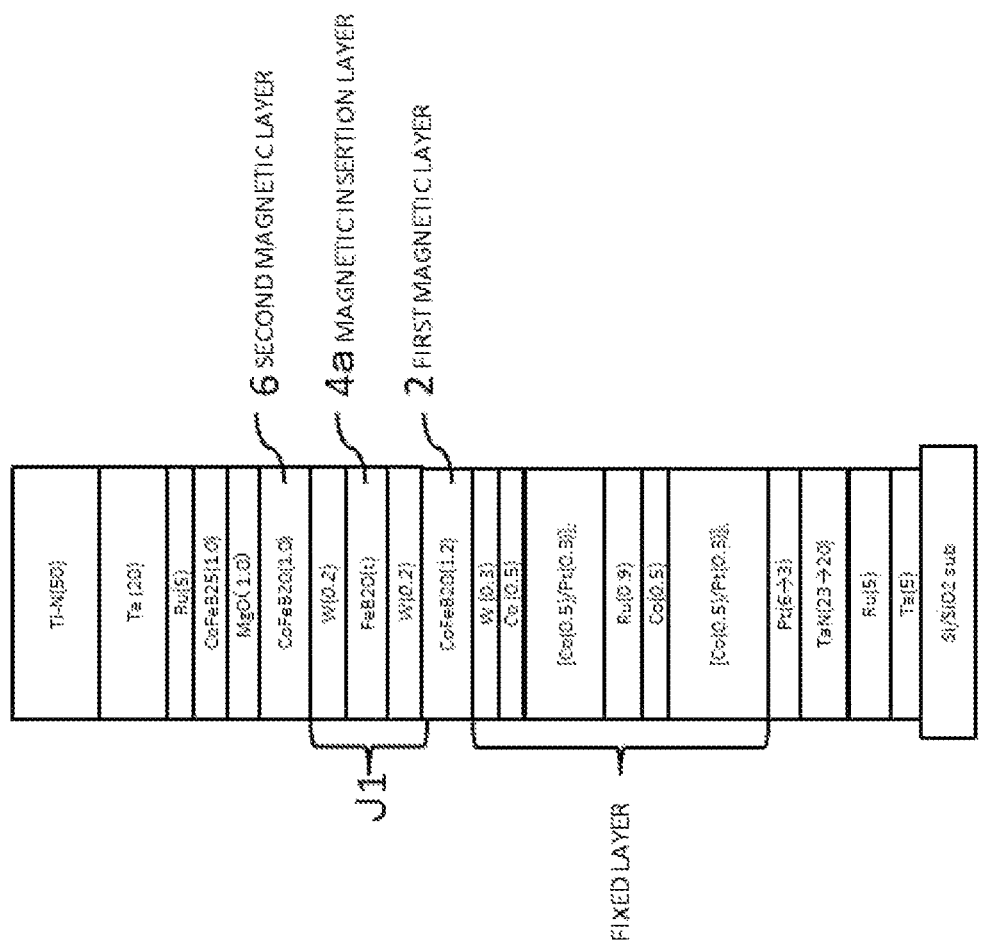
FIG. 53 shows a configuration diagram of a magnetoresistance effect element for evaluation of the magnetic coupling force $J_{ex}$ as a function of the film thickness of the magnetic insertion layer FeB in the coupling layer.

FIG. 53 shows a block diagram of a magnetoresistance effect element for evaluation. In order to fix the magnetization for the purpose of evaluating the magnetization reversal of the first magnetic layer (2) and the second magnetic layer (6), the first magnetic layer (2) is in contact with the first non-magnetic coupling layer (3) and the W layer.

Specifically, the magnetoresistance effect element for evaluation had the following configuration: [Si/SiO$_2$ substrate]/Ta (5 nm)/Ru (5 nm)/TaN (thickness was reduced from 23 nm to 20 nm by cleaning)/Pt (thickness was reduced from 6 nm to 3 nm by cleaning)/[Co (0.5 nm)/Pt (0.3 nm)]$_5$/Co (0.5 nm)/Ru (0.9 nm)/[Co (0.5 nm)/Pt (0.3 nm)]$_2$/Co (0.5 nm)/W (0.3 nm)/CoFeB$_{20}$ (1.2 nm)/W (0.2 nm)/magnetic insertion layer (0, 0.4 nm, 0.6 nm)/W (0.2 nm)/CoFeB$_{20}$ (1.0 nm)/MgO (1.0 nm)/CoFeB$_{25}$ (1.0 nm)/Ru (5 nm)/Ta (20 nm)/Ti—N (50 nm), and was subjected to annealing treatment at 400° C. for 1 h.

Figure 54:
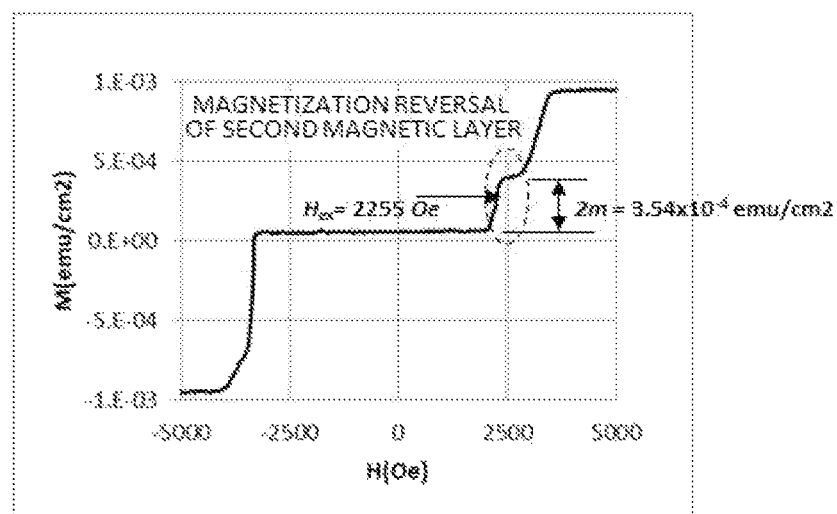
FIG. 54 shows a magnetization curve when the film thickness of the magnetic insertion layer FeB in the coupling layer is 0.4 nm.

FIG. 54 shows a magnetization curve when the magnetic insertion layer (4a) is FeB (0.4 nm). It was confirmed that the magnetic field H was shifted and magnetically coupled in the encircled magnetic reversal portion of the second magnetic layer (6). The magnetic coupling force J$_{ex}$ between the two magnetic layers can be determined as follows from the saturation magnetization m per unit area and the shift magnetic field shift magnetic field H$_{ex}$.

$$\begin{aligned} J_{ex} &= mH_{ex} \quad & \text{[Equation 10]} \\ &= 2255 Oe \times 1.77 \times 10^{-4} \text{ emu/cm}^2 \\ &= 0.40 \text{ erg/cm}^2 \\ &= 0.40 \text{ mJ/cm}^2 \end{aligned}$$

Likewise, it was confirmed that the magnetic field H was shifted and the two magnetic layers were magnetically coupled also when the film thickness of the magnetic insertion layer (4a) FeB was 0.6 nm.

Meanwhile, when the magnetic insertion layer (4a) was not inserted, the magnetic field H was not shifted, and the magnetic coupling force J$_{ex}$ was zero.

Figure 55:
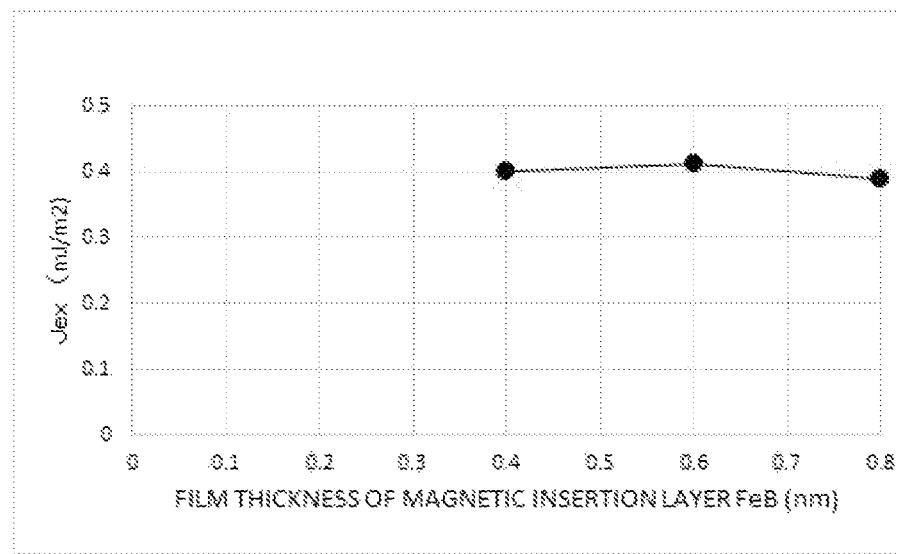
FIG. 55 shows the relationship between the film thickness of the magnetic insertion layer FeB in the coupling layer and the magnetic coupling force $J_{ex}$.

The above results are shown in FIG. 55.

It was found from FIG. 55 that when FeB was used for the magnetic insertion layer (4a), the magnetic coupling force J$_{ex}$ between the two magnetic layers was 0.4 mJ/m$^2$ or more and was close to 0.5 mJ/m$^2$ which is a standard for the reversal magnetic coupling force $J_{ex}$ at which the first magnetic layer and the second magnetic layer are magnetic one body and reversed.

Examples 1 to 3, Comparative Example 1

The materials of the magnetic insertion layer (4a), the first magnetic layer (2), and the second magnetic layer (6) constituting the recording layer (A1) were investigated.

Figure 56:
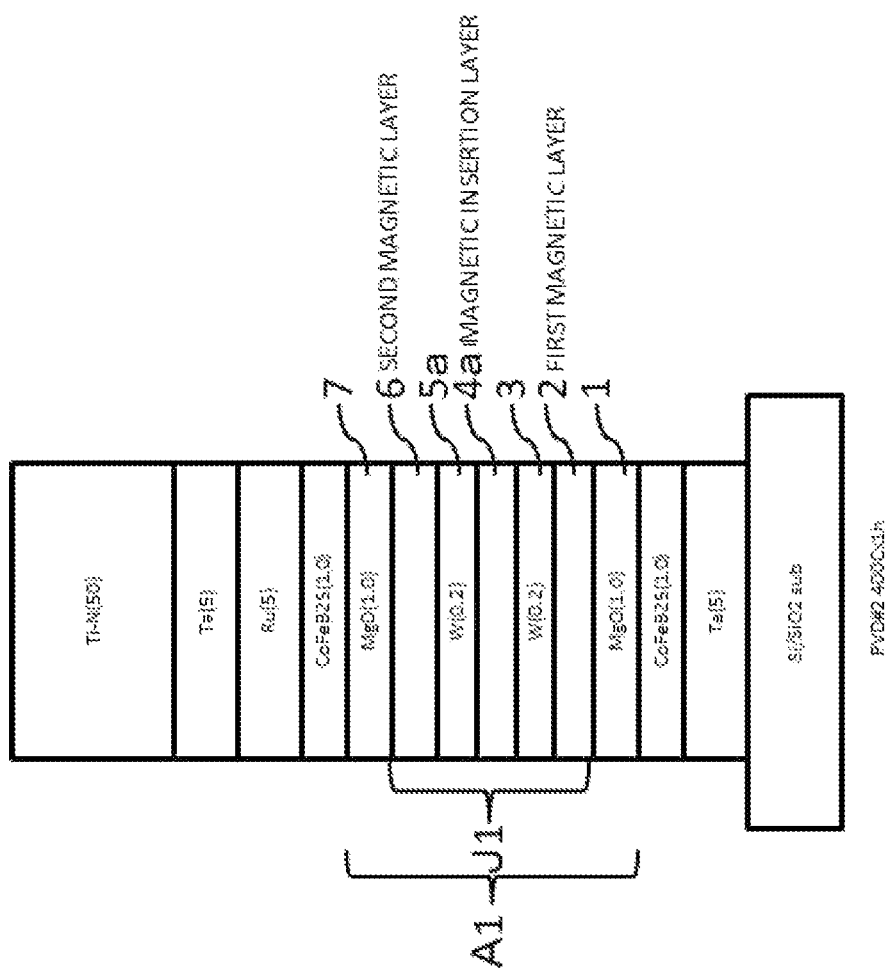
FIG. 56 shows the configuration of a magnetoresistance effect element for evaluation of a recording layer.

FIG. 56 shows an example of a magnetoresistance effect element for evaluating the recording layer of the present invention.

As shown in FIG. 56, the magnetoresistance effect elements of Examples 1 to 3 and Comparative Example 1 had a stack structure of a $Si/SiO_2$ substrate, Ta (5 nm), CoFeB (1.0 nm), first non-magnetic layer (1) (MgO, 1.0 nm), first magnetic layer (2), first non-magnetic coupling layer (3) (W, 0.2 nm), first magnetic insertion layer (4a), second non-magnetic coupling layer (5a) (W, 0.2 nm), second magnetic layer (6), second non-magnetic layer (7) (MgO, 1.0 nm), CoFeB (1.0 nm), Ru (5 nm), Ta (5 nm), Ti—N (50 nm), and was subjected to annealing treatment at 400° C. for 1 h.

The materials and film thickness (nm) of the magnetic insertion layer (4a), the first magnetic layer (2), and the second magnetic layer (6) of the magnetoresistive effect elements of Examples 1 to 3 and Comparative Example 1 are shown in Table 6.

Figure 57:
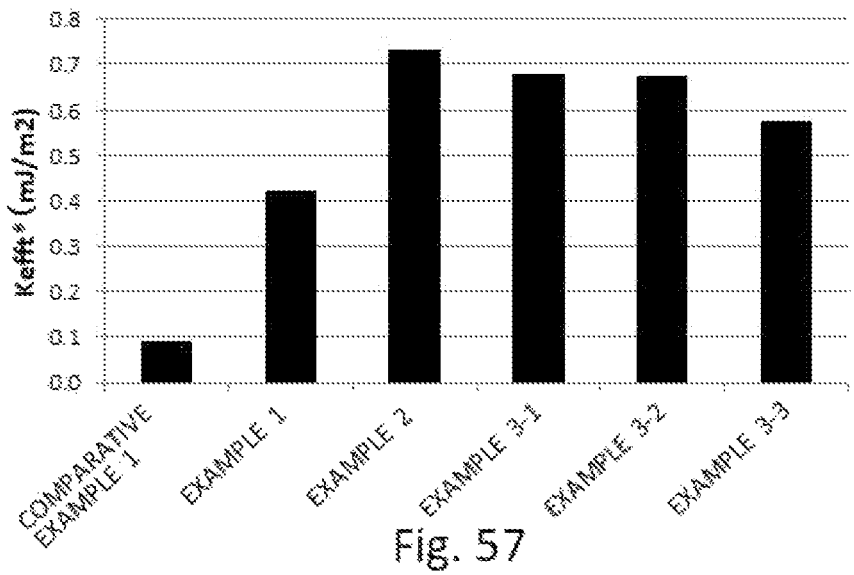
FIG. 57 shows measurement results of the effective magnetic anisotropy constant $K_{eff}$t*(mJ/m$^2$) of the recording layers of magnetoresistance effect elements of Examples 1 to 3 and Comparative Example 1.

The effective magnetic anisotropy constant $K_{eff}t^*$ (mJ/m²) of the recording layer sandwiched between the upper and lower MgO of the magnetoresistance effect elements of Examples 1 to 3 and Comparative Example 1 was measured, and the results are shown in Table 6 and FIG. 57.

The effective magnetic anisotropy constant $K_{eff}t^*$ (mJ/m²) will be described hereinbelow in detail. In the present invention, since there are two MgO layers that give perpendicular magnetic anisotropy above and below the recording layer, in the Equation 2, $K_i$ is expressed by an Equation 11. $K_i1$ is an interfacial magnetic anisotropy energy density received from the first non-magnetic layer (MgO layer), and $K_i2$ is an interfacial magnetic anisotropy energy density received from the second non-magnetic layer (MgO layer).

$$K_i = K_i1 + K_i2 \quad \text{[Equation 11]}$$

In addition, since the recording layer is constituted of the first magnetic layer, the magnetic insertion layer, and the second magnetic layer, in the Equation 2, the magnetic layer film thickness t is expressed by an Equation 12. Here, $t_{FL1}$ is the film thickness of the first magnetic layer, $t_{FL2}$ is the film thickness of the second magnetic layer, and $t_{M1}$ is the film thickness of the first magnetic insertion layer.

$$t = t_{FL1} + t_{M1} + t_{FL2} \quad \text{[Equation 12]}$$

Therefore, $K_{eff}t^*$ is expressed by an Equation 13.

$$K_{eff}t^* = K_i1 + K_i2 - \left[(N_z - N_x)\frac{M_s^2}{2\mu_0} - K_b\right](t_{FL1} + t_{M1} + t_{FL2}) \quad \text{[Equation 13]}$$

$N_z$ and $N_x$ are antimagnetic field coefficients when the three magnetic layers are integrated, and $M_s$ is the average saturation magnetization of the three magnetic layers.

Therefore, the effective magnetic anisotropy constant $K_{eff}t^*$ is expressed by energy (mJ/m²) per unit area of the first non-magnetic layer interface or the second non-magnetic layer interface (here, the interface areas are assumed to be equal), and as the value thereof increases, the thermal stability factor Δ can be increased (see the Equation 1 and the like).

It was found that where the first magnetic layer (2) and the second magnetic layer (6) of Example 1 and Comparative Example 1 were from Fe and had the same film thickness, but the magnetic insertion layer (4a) was changed from Fe of Comparative Example 1 to FeB of Example 1, the $K_{eff}t^*$ was greatly improved by a factor of about 4.7.

Further, it was found that by changing the magnetic layers (2, 6) from Fe of Example 1 to FeB of Example 2, the $K_{eff}t^*$ of Example 2 could be greatly improved by a factor of about 8.2 with respect to that of Comparative Example 1.

Examples 3-1 to 3-3 are magnetoresistance effect elements in which the magnetic layer of Example 2 is constituted of two types of films.

TABLE 6

| Sample name | First magnetic layer | Magnetic insertion layer | Second magnetic layer | Magnetic insertion layer (film thickness, nm) | Kefft* (mJ/m²) |
|---|---|---|---|---|---|
| Comparative Example 1 | Fe(1.0) | Fe(0.6) | Fe(0.9) | 0.6 | 0.08941 |
| Example 1 | Fe(1.0) | FeB(0.6) | Fe(0.9) | 0.6 | 0.42159 |
| Example 2 | FeB(1.0) | FeB(0.6) | FeB(0.9) | 0.6 | 0.73005 |
| Example 3-1 | CoFeB(0.4) FeB(0.6) | FeB(0.6) | FeB(0.6) CoFeB(0.2) | 0.6 | 0.67809 |
| Example 3-2 | FeB(0.6) CoFeB(0.4) | FeB(0.6) | CoFeB(0.4) FeB(0.6) | 0.6 | 0.67298 |
| Example 3-3 | CoFeB(0.4) Fe(0.6) | FeB(0.6) | Fe(0.6) CoFeB(0.2) | 0.6 | 0.57368 |

Example 3-1 has a configuration including a first magnetic outer layer (2a): FeB (0.6 nm), a first magnetic inner layer (2b): CoFeB (0.4 nm), a second magnetic inner layer (6a): CoFeB (0.2 nm), and a second magnetic outer layer (6b): FeB (0.6 nm) (see FIG. 6, Embodiment 6).

Example 3-2 has a configuration in which the magnetic outer layer and the magnetic inner layer of Example 3-1 are reversed.

In Example 3-3, FeB of the first magnetic outer layer (2a) and the second magnetic outer layer (6b) of Example 3-1 was replaced with Fe.

It was found that, under the conditions of Examples 3-1, 3-2, and 3-3, a value an effective magnetic anisotropy constant $K_{eff}t^*$ comparable to that of Example 2 was shown in all examples.

Examples 4 to 6

Subsequently, using the magnetoresistance effect elements of Examples 4 to 6 shown in Table 7, the effective magnetic anisotropy constant $K_{eff}t^*(mJ/m^2)$ of the recording layer sandwiched between the upper and lower MgO was measured.

Figure 58:
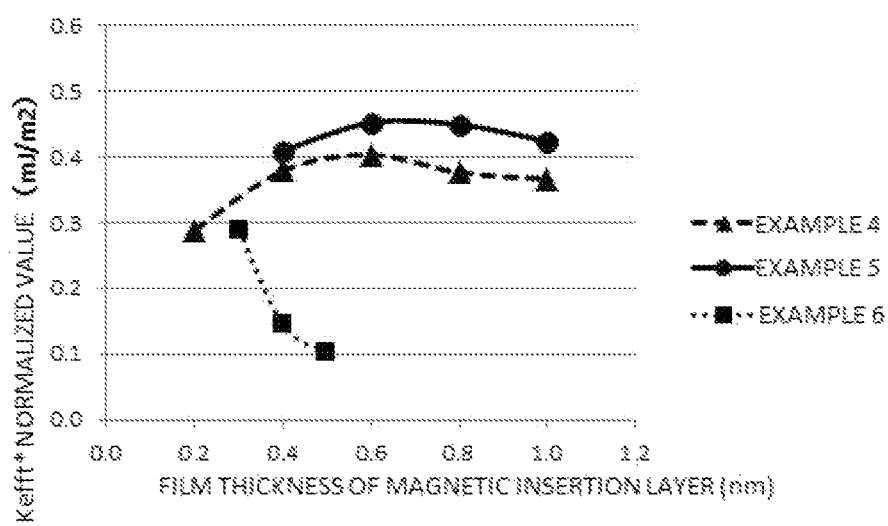
FIG. 58 shows measurement results of the effective magnetic anisotropy constant $K_{eff}$t*(mJ/m$^2$) of the recording layer of magnetoresistance effect elements of Examples 4 to 6.

The element configuration is shown in FIG. 56, and the results are shown in Table 7 and FIG. 58.

TABLE 7

| Sample name | First magnetic layer | Magnetic insertion layer | Second magnetic layer | Magnetic insertion layer (film thickness, nm) | Kefft* (mJ/m²) |
|---|---|---|---|---|---|
| Example 4-1 | CoFeB(1.0) | Fe(0.2) | CoFeB(0.8) | 0.2 | 0.28942 |
| Example 4-2 | CoFeB(1.0) | Fe(0.4) | CoFeB(0.8) | 0.4 | 0.37960 |
| Example 4-3 | CoFeB(1.0) | Fe(0.6) | CoFeB(0.8) | 0.6 | 0.40358 |
| Example 4-4 | CoFeB(1.0) | Fe(0.8) | CoFeB(0.8) | 0.8 | 0.37671 |
| Example 4-5 | CoFeB(1.0) | Fe(1.0) | CoFeB(0.8) | 1.0 | 0.36679 |
| Example 5-1 | CoFeB(1.0) | FeB(0.4) | CoFeB(0.8) | 0.4 | 0.40999 |
| Example 5-2 | CoFeB(1.0) | FeB(0.6) | CoFeB(0.8) | 0.6 | 0.45275 |
| Example 5-3 | CoFeB(1.0) | FeB(0.8) | CoFeB(0.8) | 0.8 | 0.44969 |
| Example 5-4 | CoFeB(1.0) | FeB(1.0) | CoFeB(0.8) | 1.0 | 0.42462 |
| Example 6-1 | CoFeB(1.4) | Co(0.3) | CoFeB(1.0) | 0.3 | 0.28991 |
| Example 6-2 | CoFeB(1.4) | Co(0.4) | CoFeB(1.0) | 0.4 | 0.14436 |
| Example 6-3 | CoFeB(1.4) | Co(0.5) | CoFeB(1.0) | 0.5 | 0.10264 |

It was found that where the first magnetic layer (2) and the second magnetic layer (6) of Example 4 and Example 5 were from CoFeB and had the same film thickness, but the magnetic insertion layer (4a) was changed from Fe of Example 4 to FeB of Example 5, the $K_{eff}t^*$ was improved by a factor of about 1.14.

It was also found that where the first magnetic layer (2) and the second magnetic layer (6) of Example 6 and Example 5 were from CoFeB and had different film thicknesses, but the magnetic insertion layer (4a) was changed from Co of Example 6 to FeB of Example 5, the $K_{eff}t^*$ was increased by a factor of about 2.8 times in a magnetic insertion layer of 0.4 nm.

The junction size of the magnetoresistance effect element of the present invention may not be constant for the entire element.

The magnetoresistance effect element of the present invention is incorporated in the magnetic memory of an MRAM that is being developed as a magnetic memory. Either the lower non-magnetic electrode (E1) or the upper non-magnetic electrode (E2) of the magnetoresistance effect element is electrically connected to the drain electrode of a selection transistor, and the other electrode is electrically connected to a bit line.

REFERENCE SIGNS LIST

1 First non-magnetic layer
2 First magnetic layer
2a First magnetic outer layer
2b First magnetic inner layer
3 First non-magnetic coupling layer
4a First magnetic insertion layer
4b Second magnetic insertion layer
4c Third magnetic insertion layer
5a Second non-magnetic coupling layer
5b Third non-magnetic coupling layer
5c Fourth non-magnetic coupling layer
6 Second magnetic layer
6a Second magnetic inner layer
6b Second magnetic outer layer
7 Second non-magnetic layer
8 Third non-magnetic layer
9 Third magnetic layer
9a Third magnetic outer layer
9b Third magnetic inner layer
10 Fifth non-magnetic coupling layer
11a Fourth magnetic insertion layer
11b Fifth magnetic insertion layer
12a Sixth non-magnetic coupling layer
12b Seventh non-magnetic coupling layer
13 Fourth magnetic layer
13a Fourth magnetic inner layer
13b Fourth magnetic outer layer
14 Fourth non-magnetic layer
15 Fifth non-magnetic layer
A1 First recording layer
A2 Second recording layer
B1 First reference layer
B2 Second reference layer
B3 Third reference layer
E1 Lower non-magnetic electrode
E2 Upper non-magnetic electrode
J1 First coupling layer
J2 Second coupling layer
J3 Third coupling layer

The invention claimed is:

1. A magnetoresistance effect element comprising:
a first non-magnetic layer;
a first magnetic layer provided adjacent to the first non-magnetic layer and having a magnetization direction which is perpendicular to a film surface;
a first non-magnetic coupling layer provided adjacent to the first magnetic layer on a side of the first magnetic layer opposite to the first non-magnetic layer;
a first magnetic insertion layer provided adjacent to the first non-magnetic coupling layer on a side of the first non-magnetic coupling layer opposite to the first magnetic layer;
a second non-magnetic coupling layer provided adjacent to the first magnetic insertion layer on a side of the first magnetic insertion layer opposite to the first non-magnetic coupling layer;
a second magnetic layer provided adjacent to the second non-magnetic coupling layer on a side of the second non-magnetic coupling layer opposite to the first magnetic insertion layer and having a magnetization direction which is perpendicular to the film surface; and a second non-magnetic layer provided adjacent to the second magnetic layer on a side of the second magnetic layer opposite to the second non-magnetic coupling layer, wherein the first non-magnetic layer and the second non-magnetic layer are constituted of a layer including O (oxygen);

the first magnetic layer and the second magnetic layer include at least either Co or Fe;

the first non-magnetic coupling layer and the second non-magnetic coupling layer include a non-magnetic element consisting of at least one of W, Ta, Hf, Zr, Nb, Mo, V, B;

the first non-magnetic coupling layer and the second non-magnetic coupling layer has a film thickness of 0.2 nm or more and 1.3 nm or less;

the first magnetic insertion layer includes at least Fe and B;

the first magnetic insertion layer has a film thickness of 0.4 nm or more and 1.0 nm or less;

the first magnetic layer and the second magnetic layer are magnetically coupled by a first coupling layer constituted of the first non-magnetic coupling layer, the first magnetic insertion layer and the second non-magnetic coupling layer; and the first magnetic layer, the first coupling layer, and the second magnetic layer constitute a first recording layer.

2. The magnetoresistance effect element according to claim 1, wherein the first coupling layer further comprises a second magnetic insertion layer provided adjacent to the second non-magnetic coupling layer on the side of the second non-magnetic coupling layer opposite to the first magnetic insertion layer, and a third non-magnetic coupling layer provided adjacent to the second magnetic insertion layer on a side of the second magnetic insertion layer opposite to the second non-magnetic coupling layer, and adjacent to the second magnetic layer on a side of the second magnetic layer opposite to the second non-magnetic layer wherein the first non-magnetic coupling layer, the second non-magnetic coupling layer, and the third non-magnetic coupling layer include a non-magnetic element consisting of at least one of W, Ta, Hf, Zr, Nb, Mo, V, B;

the first magnetic insertion layer and the second magnetic insertion layer include at least Fe and B; and the first magnetic layer and the second magnetic layer are magnetically coupled by the first coupling layer constituted of the first non-magnetic coupling layer, the first magnetic insertion layer, the second non-magnetic coupling layer, the second magnetic insertion layer, and the third non-magnetic coupling layer.

3. The magnetoresistance effect element according to claim 1, wherein the first magnetic insertion layer further includes a non-magnetic element consisting of at least one of W, Ta, Hf, Zr, Nb, Mo, Ti, V, Cr, Si, Al, B, Pd, Pt.

4. The magnetoresistance effect element according to claim 2, wherein the first magnetic insertion layer or the second magnetic insertion layer further includes a non-magnetic element consisting of at least one of W, Ta, Hf, Zr, Nb, Mo, Ti, V, Cr, Si, Al, B, Pd, Pt.

5. The magnetoresistance effect element according to claim 1, wherein a magnetic coupling force $J_{ex}$ per unit area between the first magnetic layer and the second magnetic layer is 0.1 mJ/m$^2$ or more.

6. The magnetoresistance effect element according to claim 1, comprising a saturation magnetization $M_s$ of 0.4 T or more at a time of stacking the first magnetic insertion layer adjacent to the first non-magnetic coupling layer.

7. The magnetoresistance effect element according to claim 2, comprising a saturation magnetization $M_s$ of 0.4 T or more at a time of stacking the first magnetic insertion layer adjacent to the first non-magnetic coupling layer and at a time of stacking the second magnetic insertion layer adjacent to the second non-magnetic coupling layer.

8. The magnetoresistance effect element according to claim 1, wherein the first magnetic layer is constituted of a first magnetic outer layer adjacent to the first non-magnetic layer, and a first magnetic inner layer provided adjacent to the first magnetic outer layer on a side of the first magnetic outer layer opposite to the first non-magnetic layer; and a ratio of a composition of a non-magnetic element consisting of at least one of W, Ta, Hf, Zr, Nb, Mo, Ti, V, Cr, Si, Al, B, Pd, Pt, of the first magnetic outer layer to a composition of a non-magnetic element consisting of at least one of W, Ta, Hf, Zr, Nb, Mo, Ti, V, Cr, Si, Al, B, Pd, Pt, of the first magnetic inner layer is less than 1.

9. The magnetoresistance effect element according to claim 1, wherein the second magnetic layer is constituted of a second magnetic outer layer adjacent to the second non-magnetic layer, and a second magnetic inner layer provided adjacent to the second magnetic outer layer on a side of the second magnetic outer layer opposite to the second non-magnetic layer; and a ratio of a composition of a non-magnetic element consisting of at least one of W, Ta, Hf, Zr, Nb, Mo, Ti, V, Cr, Si, Al, B, Pd, Pt, of the second magnetic outer layer to a composition of a non-magnetic element consisting of at least one of W, Ta, Hf, Zr, Nb, Mo, Ti, V, Cr, Si, Al, B, Pd, Pt, of the second magnetic inner layer is less than 1.

10. The magnetoresistance effect element according to claim 1, wherein the first coupling layer further comprises a second magnetic insertion layer provided adjacent to the second non-magnetic coupling layer on the side of the second non-magnetic coupling layer opposite to the first magnetic insertion layer;

a third non-magnetic coupling layer provided adjacent to the second magnetic insertion layer on a side of the second magnetic insertion layer opposite to the second non-magnetic coupling layer;

a third magnetic insertion layer provided adjacent to the third non-magnetic coupling layer on a side of the third non-magnetic coupling layer opposite to the second magnetic insertion layer; and a fourth non-magnetic coupling layer provided adjacent to and between the third magnetic insertion layer and the second magnetic layer, wherein the first non-magnetic coupling layer, the second non-magnetic coupling layer, the third non-magnetic coupling layer, and the fourth non-magnetic coupling layer include a non-magnetic element consisting of at least one of W, Ta, Hf, Zr, Nb, Mo, V, B;

the first magnetic insertion layer, the second magnetic insertion layer, and the third magnetic insertion layer include at least Fe and B; and the first magnetic layer and the second magnetic layer are magnetically coupled by the first coupling layer constituted of the first non-magnetic coupling layer, the first magnetic insertion layer, the second non-magnetic coupling layer, the second magnetic insertion layer, the third non-magnetic coupling layer, the third magnetic insertion layer and the fourth non-magnetic coupling layer.

11. A magnetoresistance effect element comprising:
a first non-magnetic layer;
a first magnetic layer provided adjacent to the first non-magnetic layer and having a magnetization direction which is perpendicular to a film surface;
a first non-magnetic coupling layer provided adjacent to the first magnetic layer on a side of the first magnetic layer opposite to the first non-magnetic layer;
a first magnetic insertion layer provided adjacent to the first non-magnetic coupling layer on a side of the first non-magnetic coupling layer opposite to the first magnetic layer;
a second non-magnetic coupling layer provided adjacent to the first magnetic insertion layer on a side of the first magnetic insertion layer opposite to the first non-magnetic coupling layer;
a second magnetic layer provided adjacent to the second non-magnetic coupling layer on a side of the second non-magnetic coupling layer opposite to the first magnetic insertion layer and having a magnetization direction which is perpendicular to the film surface;
a third non-magnetic layer provided adjacent to the second magnetic layer on a side of the second magnetic layer opposite to the second non-magnetic coupling layer;
a third magnetic layer provided adjacent to the third non-magnetic layer on a side of the third non-magnetic layer opposite to the second magnetic layer and having a magnetization direction which is perpendicular to the film surface;
a fifth non-magnetic coupling layer provided adjacent to the third magnetic layer on a side of the third magnetic layer opposite to the third non-magnetic layer;
a fourth magnetic insertion layer provided adjacent to the fifth non-magnetic coupling layer on a side of the fifth non-magnetic coupling layer opposite to the third magnetic layer;
a sixth non-magnetic coupling layer provided adjacent to the fourth magnetic insertion layer on a side of the fourth magnetic insertion layer opposite to the fifth non-magnetic coupling layer;
a fourth magnetic layer provided adjacent to the sixth non-magnetic coupling layer on a side of the sixth non-magnetic coupling layer opposite to the fourth magnetic insertion layer and having a magnetization direction which is perpendicular to the film surface; and
a second non-magnetic layer provided adjacent to the fourth magnetic layer on a side of the fourth magnetic layer opposite to the sixth non-magnetic coupling layer, wherein
the first non-magnetic layer and the second non-magnetic layer are constituted of a layer including O (oxygen);
the first magnetic layer, the second magnetic layer, the third magnetic layer, and the fourth magnetic layer include at least either Co or Fe;
the first non-magnetic coupling layer, the second non-magnetic coupling layer, the fifth non-magnetic coupling layer, and the sixth non-magnetic coupling layer include a non-magnetic element consisting of at least one of W, Ta, Hf, Zr, Nb, Mo, V, B;

the first non-magnetic coupling layer and the second non-magnetic coupling layer has a film thickness of 0.2 nm or more and 1.3 nm or less;
the first magnetic insertion layer and the fourth magnetic insertion layer include at least Fe and B;
the first magnetic insertion layer has a film thickness of 0.4 nm or more and 1.0 nm or less;
the third non-magnetic layer includes an oxide of a non-magnetic element;
the first magnetic layer and the second magnetic layer are magnetically coupled by a first coupling layer constituted of the first non-magnetic coupling layer, the first magnetic insertion layer and the second non-magnetic coupling layer;
the second magnetic layer and the third magnetic layer are magnetically coupled by a second coupling layer constituted of the third non-magnetic layer;
the third magnetic layer and the fourth magnetic layer are magnetically coupled by a third coupling layer constituted of the fifth non-magnetic coupling layer, the fourth magnetic insertion layer and the sixth non-magnetic coupling layer;
the first magnetic layer and the fourth magnetic layer are magnetically coupled by the first coupling layer, the second coupling layer, and the third coupling layer;
the first magnetic layer, the first coupling layer, the second magnetic layer, the second coupling layer, the third magnetic layer, the third coupling layer, and the fourth magnetic layer constitute a first recording layer.

12. The magnetoresistance effect element according to claim 11, wherein the first magnetic insertion layer or the fourth magnetic insertion layer further includes a non-magnetic element consisting of at least one of W, Ta, Hf, Zr, Nb, Mo, Ti, V, Cr, Si, Al, B, Pd, Pt.

13. The magnetoresistance effect element according to claim 11, wherein a sum of a film thickness of the first magnetic insertion layer and a film thickness of the fourth magnetic insertion layer is greater than 0.4 nm and 1.6 nm or less.

14. The magnetoresistance effect element according to claim 11, wherein a magnetic coupling force $J_{ex}$ per unit area between the first magnetic layer and the second magnetic layer is 0.1 mJ/m$^2$ or more, a magnetic coupling force $J_{ex}$ per unit area between the second magnetic layer and the third magnetic layer is 0.1 mJ/m$^2$ or more, and a magnetic coupling force $J_{ex}$ per unit area between the third magnetic layer and the fourth magnetic layer is 0.1 mJ/m$^2$ or more.

15. The magnetoresistance effect element according to claim 11, wherein
the first magnetic layer is constituted of a first magnetic outer layer adjacent to the first non-magnetic layer, and a first magnetic inner layer adjacent to and sandwiched between the first magnetic outer layer and the first non-magnetic coupling layer; and
a ratio of a composition of a non-magnetic element consisting of at least one of W, Ta, Hf, Zr, Nb, Mo, Ti, V, Cr, Si, Al, B, Pd, Pt, of the first magnetic outer layer to a composition of a non-magnetic element consisting of at least one of W, Ta, Hf, Zr, Nb, Mo, Ti, V, Cr, Si, Al, B, Pd, Pt, of the first magnetic inner layer is less than 1.

16. The magnetoresistance effect element according to claim 11, wherein
the second magnetic layer includes a second magnetic outer layer adjacent to the third non-magnetic layer, and a second magnetic inner layer adjacent to and sandwiched between the second magnetic outer layer and the second non-magnetic coupling layer; and a ratio of a composition of a non-magnetic element consisting of at least one of W, Ta, Hf, Zr, Nb, Mo, Ti, V, Cr, Si, Al, B, Pd, Pt, of the second magnetic outer layer to a composition of a non-magnetic element consisting of at least one of W, Ta, Hf, Zr, Nb, Mo, Ti, V, Cr, Si, Al, B, Pd, Pt, of the second magnetic inner layer is less than 1.

17. The magnetoresistance effect element according to claim 11, wherein the third magnetic layer includes a third magnetic outer layer adjacent to the third non-magnetic layer, and a third magnetic inner layer adjacent to and sandwiched between the third magnetic outer layer and the fifth non-magnetic coupling layer; and a ratio of a composition of a non-magnetic element consisting of at least one of W, Ta, Hf, Zr, Nb, Mo, Ti, V, Cr, Si, Al, B, Pd, Pt, of the third magnetic outer layer to a composition of a non-magnetic element consisting of at least one of W, Ta, Hf, Zr, Nb, Mo, Ti, V, Cr, Si, Al, B, Pd, Pt, of the third magnetic inner layer is less than 1.

18. The magnetoresistance effect element according to claim 11, wherein the fourth magnetic layer includes a fourth magnetic outer layer adjacent to the second non-magnetic layer, and a fourth magnetic inner layer adjacent to and sandwiched between the fourth magnetic outer layer and the sixth non-magnetic coupling layer; and a ratio of a composition of a non-magnetic element consisting of at least one of W, Ta, Hf, Zr, Nb, Mo, Ti, V, Cr, Si, Al, B, Pd, Pt, of the fourth magnetic outer layer to a composition of a non-magnetic element consisting of at least one of W, Ta, Hf, Zr, Nb, Mo, Ti, V, Cr, Si, Al, B, Pd, Pt, of the fourth magnetic inner layer is less than 1.

19. A magnetic memory including the magnetoresistance effect element according to claim 1 as a magnetic memory cell.

20. The magnetoresistance effect element according to claim 1, wherein the first magnetic layer and the second magnetic layer include at least Fe and B.

21. The magnetoresistance effect element according to claim 1, wherein the first magnetic insertion layer comprises FeB.

* * * * *